United States Patent
Jeon et al.

(10) Patent No.: US 8,809,930 B2
(45) Date of Patent: Aug. 19, 2014

(54) SEMICONDUCTOR MEMORY DEVICES

(71) Applicants: Namho Jeon, Hwaseong-si (KR); Jun-Su Kim, Anyang-si (KR); Satoru Yamada, Seoul (KR); Jaehoon Lee, Daejeon (KR); Seunguk Han, Suwon-si (KR); Jiyoung Kim, Yongin-si (KR); Jin-Seong Lee, Gyeonggi-do (KR)

(72) Inventors: Namho Jeon, Hwaseong-si (KR); Jun-Su Kim, Anyang-si (KR); Satoru Yamada, Seoul (KR); Jaehoon Lee, Daejeon (KR); Seunguk Han, Suwon-si (KR); Jiyoung Kim, Yongin-si (KR); Jin-Seong Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/742,940

(22) Filed: Jan. 16, 2013

(65) Prior Publication Data
US 2013/0256774 A1    Oct. 3, 2013

(30) Foreign Application Priority Data
Mar. 28, 2012    (KR) .................. 10-2012-0031870

(51) Int. Cl.
*H01L 29/76*    (2006.01)

(52) U.S. Cl.
USPC ........... 257/314; 257/311; 257/315; 257/316; 365/185.05; 365/72

(58) Field of Classification Search
USPC ........ 257/314, 311, 315, 316; 365/185.05, 72
See application file for complete search history.

(56) References Cited

U.S. PATENT DOCUMENTS

| | | | |
|---|---|---|---|
| 5,977,589 | A | 11/1999 | Schloesser et al. |
| 6,075,265 | A | 6/2000 | Goebel et al. |
| 2003/0231521 | A1 | 12/2003 | Ohsawa |
| 2004/0132232 | A1 | 7/2004 | Noble |
| 2005/0157533 | A1 | 7/2005 | Kaal |
| 2007/0063287 | A1 | 3/2007 | Sano et al. |
| 2007/0158722 | A1 | 7/2007 | Forbes |
| 2008/0261363 | A1 | 10/2008 | Furukawa et al. |
| 2008/0285325 | A1 | 11/2008 | Kameshiro et al. |

FOREIGN PATENT DOCUMENTS

| | | |
|---|---|---|
| JP | 2002-198499 A | 7/2002 |
| JP | 2005-527931 A | 9/2005 |
| WO | WO 03/100788 A2 | 12/2003 |

OTHER PUBLICATIONS

Lee, et al.; Junctionless multigate field-effect transistor; Applied Physics Letters; Feb. 6, 2009; 94, 5; pp. 053511-1-053511-2; American Institute of Physics; USA.

Colinge, et al.; Nanowire transistors without junctions; Nature Nanotechnology; Feb. 21, 2010; pp. 1-5; Macmillian Publishers Limited; USA.

*Primary Examiner* — Tan N Tran
(74) *Attorney, Agent, or Firm* — Lee & Morse, P.C.

(57) ABSTRACT

Semiconductor memory devices may include a write transistor including a first write gate controlling a first source/drain terminal and a second write gate controlling a channel region, and a read transistor including a memory node gate connected to the first source/drain terminal of the write transistor. The first write gate may have a first work function and the second write gate may have a second work function different from the first work function. The first source/drain terminal of the write transistor may not have a PN junction.

22 Claims, 52 Drawing Sheets

SEMICONDUCTOR MEMORY DEVICES

CROSS-REFERENCE TO RELATED APPLICATIONS

The present application claims priority under 35 U.S.C. §119 to Korean Patent Application No. 10-2012-0031870, filed on Mar. 28, 2012, in the Korean Intellectual Property Office, and entitled: "Semiconductor Memory Devices," which is incorporated by reference herein in its entirety.

BACKGROUND

1. Field

The inventive concept relates to semiconductor devices and, more particularly, to semiconductor memory devices.

2. Description of the Related Art

Semiconductor devices are very attractive in an electronic industry because of small size, multi-function, and/or low fabrication cost thereof. Semiconductor memory devices of the semiconductor devices may store logic data. Recently, semiconductor memory devices having excellent performance and/or excellent reliability have been demanded with improvement of performance of electronic devices. Thus, various researches have been conducted for new semiconductor memory devices for satisfying the above demands.

SUMMARY

Embodiments of the inventive concept may provide semiconductor memory devices having excellent performance.

Embodiments of the inventive concept may also provide semiconductor memory devices having excellent reliability.

Embodiments of the inventive concept may also provide semiconductor memory devices capable of being highly integrated.

In one aspect, a semiconductor memory device may include: a write transistor including a first write gate controlling a first source/drain terminal and a second write gate controlling a channel region; and a read transistor including a memory node gate connected to the first source/drain terminal of the write transistor. The first write gate may have a first work function and the second write gate may have a second work function different from the first work function. The first source/drain terminal of the write transistor may not have a PN junction.

In some embodiments, a doped state of the first source/drain terminal of the write transistor may be the same as a doped state of the channel region of the write transistor. A potential barrier may be generated in the channel region of the write transistor and a potential well may be generated in the first source/drain terminal of the write transistor by engineering of the first and second work functions of the first and second write gates.

In other embodiments, the first write gate may be connected to a first word line and the second write gate may be connected to a second word line.

In still other embodiments, the first word line may cross the second word line.

In even other embodiments, the first write gate may further perform a function of a control gate of the read transistor.

In yet other embodiments, the write transistor may further include a third write gate controlling a second source/drain terminal. The third write gate may have a third work function. The second write gate may be disposed between the first write gate and the third write gate. In this case, the third work function may be the same as the first work function. Alternatively, the third work function may be the same as the second work function.

In yet still other embodiments, the first write gate may be connected to a first word line; the third write gate may be connected to a second word line; and the second write gate may be connected to one of the first and second word lines.

In yet still other embodiments, the first source/drain terminal, the channel region, and the second source/drain terminal of the write transistor may have the same doped state as each other.

In another aspect, a semiconductor memory device may include: a first active portion including a body part; a first gate electrode controlling a first portion of the body part and having a first work function; a second gate electrode controlling a second portion of the body part and having a second work function different from the first work function; and a second active portion spaced apart from the first active portion and including a read-channel region adjacent to the first portion of the body part. The first and second portions of the body part may have the same doped state. The first and second gate electrodes may engineer energy bands of the first and second portions of the body part to generate a potential well and a potential barrier in the first portion and the second portion of the body part, respectively.

In some embodiments, the first gate electrode may correspond to a first write gate of a write transistor and a control gate of a read transistor; the second gate electrode may correspond to a second write gate of the write transistor; the potential well of the first portion of the body part may correspond to a memory node; and the memory node may correspond to a first source/drain terminal of the write transistor and a memory node gate of the read transistor.

In other embodiments, the first and second portions of the body part may be in an intrinsic state.

In still other embodiments, the first and second portions of the body part may be lightly doped with dopants of a first conductivity type.

In even other embodiments, the semiconductor memory device may further include: a third gate electrode disposed at a side of the second gate electrode, the third gate electrode having a third work function. The third gate electrode may control a third portion of the body part. The third portion of the body part may have the same doped state as the first and second portions of the body part. The second gate electrode may be disposed between the first and third gate electrodes.

In yet other embodiments, the first and second active portions may be laterally arranged on the substrate and the first to third gate electrodes may cross over the body part of the first active portion. In this case, the semiconductor memory device may further include a write-doped region formed in the first active portion at a side of the third gate electrode; and a first read-doped region and a second read-doped region formed in the second active portion and spaced apart from each other.

In yet still other embodiments, the third gate electrode, the second gate electrode, and the first gate electrode may be sequentially stacked on the substrate, and the first active portion may successively penetrate the first to third gate electrodes. Here, the first active portion may be insulated from the first to third gate electrodes. The read-channel region of the second active portion may be disposed over a top surface of the first active portion.

In yet still other embodiments, the second active portion may be defined in the substrate. In this case, the first gate electrode, the second gate electrode, and the third gate electrode may be sequentially stacked on the substrate, and the first active portion may successively penetrate the third to first gate electrodes. The first active portion may be insulated from the third to first gate electrodes and the read-channel region of the second active portion. The first active portion may be disposed over the read-channel region.

In still another aspect, a semiconductor memory device may include: a substrate; and a plurality of unit cells sequentially stacked on the substrate. Each of the unit cells may include: a write transistor including a first write gate controlling a first source/drain terminal and a second write gate controlling a channel region; and a read transistor including a memory node gate connected to the first source/drain terminal of the write transistor. The first write gate may have a first work function and the second write gate may have a second work function different from the first work function. The first source/drain terminal of the write transistor may not have a PN junction. The read transistors of the stacked unit cells may be connected in series to each other.

In even another aspect, a semiconductor memory device may include: a plurality of write transistors sequentially stacked, each of the write transistors including an active portion including a body part and first and second gate electrodes crossing over the body part in parallel to each other, and the body part including a first portion and a second portion controlled by the first gate electrode and the second gate electrode, respectively; and a vertical active portion adjacent to a side of the first portions of the body parts of the stacked write transistors, the vertical active portion insulated from the first portions. The first and second portions of the body part may have the same doped state; and the first and second gate electrodes may engineer energy bands of the first and second portions of the body part to generate a potential well and a potential barrier in the first portion and the second portion of the body part, respectively.

In yet another aspect, a semiconductor memory device may include: a write transistor including a first gate and a second gate; a first word line electrically connected to the first gate of the write transistor; a second word line electrically connected to the second gate of the write transistor, the second word line crossing the first word line; and a read transistor including a memory node gate connected to a first source/drain terminal of the write transistor.

In yet another aspect, a semiconductor memory device may include: a first active portion including a body part having first and second portions; a first gate electrode controlling the first portion of the body part, the first gate electrode having a first work function; a second gate electrode controlling the second portion of the body part, the second gate having a second work function different from the first work function; and a second active portion spaced apart from the first active portion and including a read-channel region, wherein the first and second portions of the body part have a same doped state; wherein the first and second gate electrodes engineer energy bands of the first and second portions of the body part to generate a potential well and a potential barrier in the first portion and the second portion of the body part, respectively; the potential well corresponds to a memory node; and the memory node and the read-channel region overlap in at least one direction.

BRIEF DESCRIPTION OF THE DRAWINGS

Features will become apparent to those of ordinary skill in the art by describing in detail exemplary embodiments with reference to the attached drawings in which:

FIGS. 23A to 26A illustrate cross-sectional views taken along a line VI-VI' of FIG. 21A to explain stages in a method of manufacturing a semiconductor memory device illustrated in FIGS. 21A to 21C;

FIGS. 23B to 26B illustrate cross-sectional views taken along a line VII-VII' of FIG. 21A to explain stages in a method of manufacturing a semiconductor memory device illustrated in FIGS. 21A to 21C;

FIGS. 27A to 29A illustrate cross-sectional views taken along a line VIII-VIII' of FIG. 22A to explain stages in a method of manufacturing a semiconductor memory device illustrated in FIGS. 22A to 22C;

FIGS. 27B to 29B illustrate cross-sectional views taken along a line IX-IX' of FIG. 22A to explain stages in a method of manufacturing a semiconductor memory device illustrated in FIGS. 22A to 22C;

DETAILED DESCRIPTION

Figure 1:
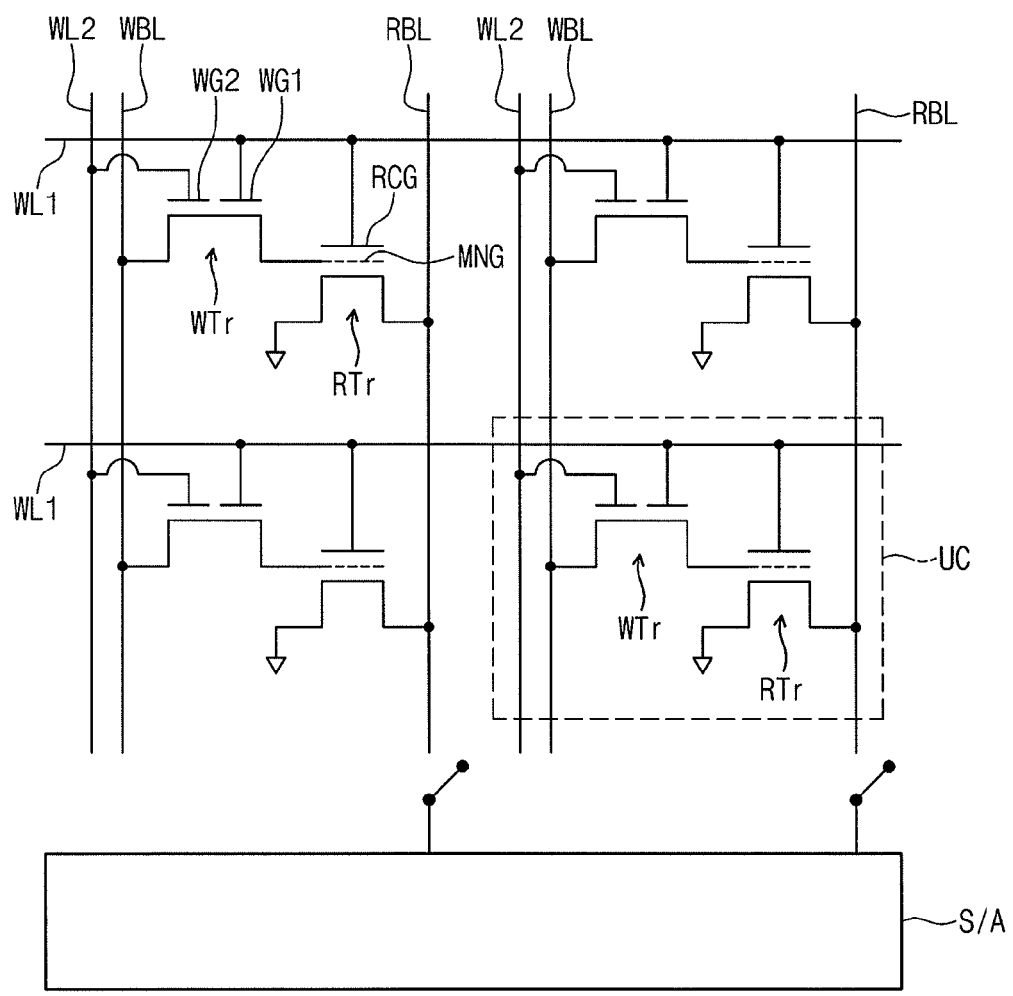
FIG. 1 illustrates an equivalent circuit diagram of a semiconductor memory device according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the

First Embodiment

FIG. 1 illustrates an equivalent circuit diagram of a semiconductor memory device according to some embodiments of the inventive concept. Referring to FIG. 1, a semiconductor memory device according to some embodiments may include a plurality of unit cells UC arranged along rows and columns.

Each of the unit cells UC may include a write transistor WTr and a read transistor RTr. The write transistor WTr may include a first write gate WG1 and a second write gate WG2. Additionally, the write transistor WTr may further include a first source/drain terminal and a second source/drain terminal. The read transistor RTr may include a memory node gate MN, a first source/drain terminal, and a second source/drain terminal. The memory node gate MNG of the read transistor RTr may be connected to the first source/drain terminal of the write transistor WTr. The memory node gate MNG may be floated in a read mode and/or a standby mode. The read transistor RTr may further include a control gate RCG. The memory node gate MNG may be disposed between the control gate RCG and a channel region of the read transistor RTr. The control gate RCG and the memory node gate MNG may be insulated from each other. The control gate RCG may be coupled to the memory node gate MNG, so that the control gate RCG may control the channel region of the read transistor RTr.

The first write gate WG1 may control a first channel region of the write transistor WTr, and the second write gate WG2 may control a second channel region of the write transistor WTr. The first and second channel regions may be controlled independently from each other. In some embodiments, the first channel region may be connected in series to the second channel region as illustrated in FIG. 1. In the present embodiment, the first write gate WG1 may be connected to a first word line WL1 extending in one direction, and the second write gate WG2 may be connected to a second word line WL2 crossing the first word line WL1. The first and second word lines WL1 and WL2 may be controlled independently from each other. When all of the first and second channel regions are turned-on, the write transistor WTr may be turned-on.

The second source/drain terminal of the write transistor WTr may be connected to a write bit line WBL. The write bit line WBL may cross the first word line WL1. In other words, the write bit line WBL may be parallel to the second word line WL2. In some embodiments, the first and second source/drain terminals of the write transistor WTr may be regions doped with dopants. However, the inventive concept is not limited thereto.

The control gate RCG of the read transistor RTr may be connected to the first word line WL1. In other words, the control gate RCG of the read transistor RTr and the first write gate WG1 of the write transistor WTr may be connected in common to the first word line WL1. In this case, one gate electrode may perform the function of the first write gate WG1 of the write transistor WTr and the function of the control gate RCG of the read transistor RTr in unit cell UC. In other words, when the first write gate WG1 and the control gate RCG are connected in common to the first word line WL1, the control gate RCG may be omitted, and the first write gate WG1 may perform the function of the control gate RCG.

The first source/drain terminal of the read transistor RTr may be connected to a read bit line RBL. The read bit line RBL may cross the first word line WL1. In other words, the read bit line RBL may be parallel to the second word line WL2 and the write bit line WBL. The second source/drain terminal of the read transistor RTr may be connected to a common source region to which a reference voltage (e.g., a ground voltage) is applied. The first and second source/drain regions of the read transistor may be regions doped with dopants. However, the inventive concept is not limited thereto.

A plurality of the read bit lines RBL may share one sense amplifier S/A. The sense amplifier S/A may be a current-sense amplifier. When the semiconductor memory device is operated, the sense amplifier S/A may be electrically connected to one selected from the plurality of the read bit lines RBL.

A program operation of the unit cell UC illustrated above will be described. A first turn-on voltage and a second turn-on voltage may be applied to a selected first word line WL1 and a selected second word line WL1 connected to a selected unit cell, respectively. Thus, the write transistor WTr of the selected unit cell is turned-on. A program voltage (or a program current) may be applied to the write bit line WBL connected to the selected unit cell so as to store a logic data in the memory node gate MNG of the read transistor RTr of the selected unit cell. At this time, non-selected first word lines WL1, non-selected second word lines WL2, non-selected write bit lines WBL, and the read bit lines RBL may be applied with the reference voltage (e.g., a ground voltage) or may be floated.

The first channel regions and/or the second channel regions of the write transistors WTr in non-selected unit cells are turned-off, so that the write transistors WTr of the non-selected unit cells are turned-off. In other words, the first channel regions of the write transistors WTr of the non-selected unit cells connected to the selected write bit line WBL are turned-off, so that the write transistors WTr of the non-selected unit cells connected to the selected write bit line WBL are turned-off. Thus, the non-selected unit cells connected to the selected write bit line WBL are not influenced by the program voltage (or the program current). As a result, the unit cells of the semiconductor memory device can be randomly accessed. In other words, since the write transistors WTr of the non-selected unit cells connected to the selected write bit line WBL are turned-off, loss of data stored in the non-selected unit cells connected to the selected write bit line WBL can be prevented. Thus, a peripheral circuit (e.g., a voltage sense amplifier or a current sense amplifier) for self-refreshing may be omitted in the semiconductor memory device. As a result, an area of a peripheral circuit region may be reduced to realize a high integrated semiconductor memory device. Additionally, the semiconductor memory device may have excellent data storing characteristic.

Next, a read operation of the semiconductor memory device will be described. A sensing voltage may be applied to the first word line WL1 connected to a selected unit cell. If the memory node gate MNG does not store charges, the read transistor RTr has a first threshold voltage. If the memory node gate MNG stores charges, the read transistor RTr has a second threshold voltage. An absolute value of the sensing voltage may be a value between an absolute value of the first threshold voltage and an absolute value of the second threshold voltage. Thus, the read transistor RTr of the selected unit cell may be turned-on or turned-off according to the amount of the charges stored in the memory node gate MNG in the read operation. As a result, it is possible to sense the logic data stored in the read transistor RTr of the selected unit cell.

The second word line WL2 connected to the selected unit cell may be applied with a turn-off voltage or be floated during the read operation. Thus, the write transistor WTr of the selected unit cell is turned-off. As a result, it is possible to prevent loss of the data stored in the selected unit cell. Other second word lines WL2 may also be applied with the turn-off voltage or be floated during the read operation. Additionally, non-selected first word lines WL1, non-selected read bit lines RBL, and the write bit lines WBL may be applied with the reference voltage or be floated during the read operation.

According to the semiconductor memory device described above, the selected unit cell may be randomly accessed during the program operation and/or the read operation. Thus, loss of the data stored in the unit cells can be prevented or minimized. As a result, the semiconductor memory device having excellent performance and/or excellent reliability may be realized. Additionally, since a specific peripheral circuit (e.g., a circuit for self-refreshing such as a voltage sense amplifier and/or a current sense amplifier) may be omitted, a highly integrated semiconductor memory device may be realized.

Next, various modified examples of the semiconductor memory device according to the present embodiment will be described with reference to the drawings. Hereinafter, for the purpose of ease and convenience in explanation, the descriptions to the same elements as described in the above embodiment will be omitted or mentioned briefly.

Figure 2:
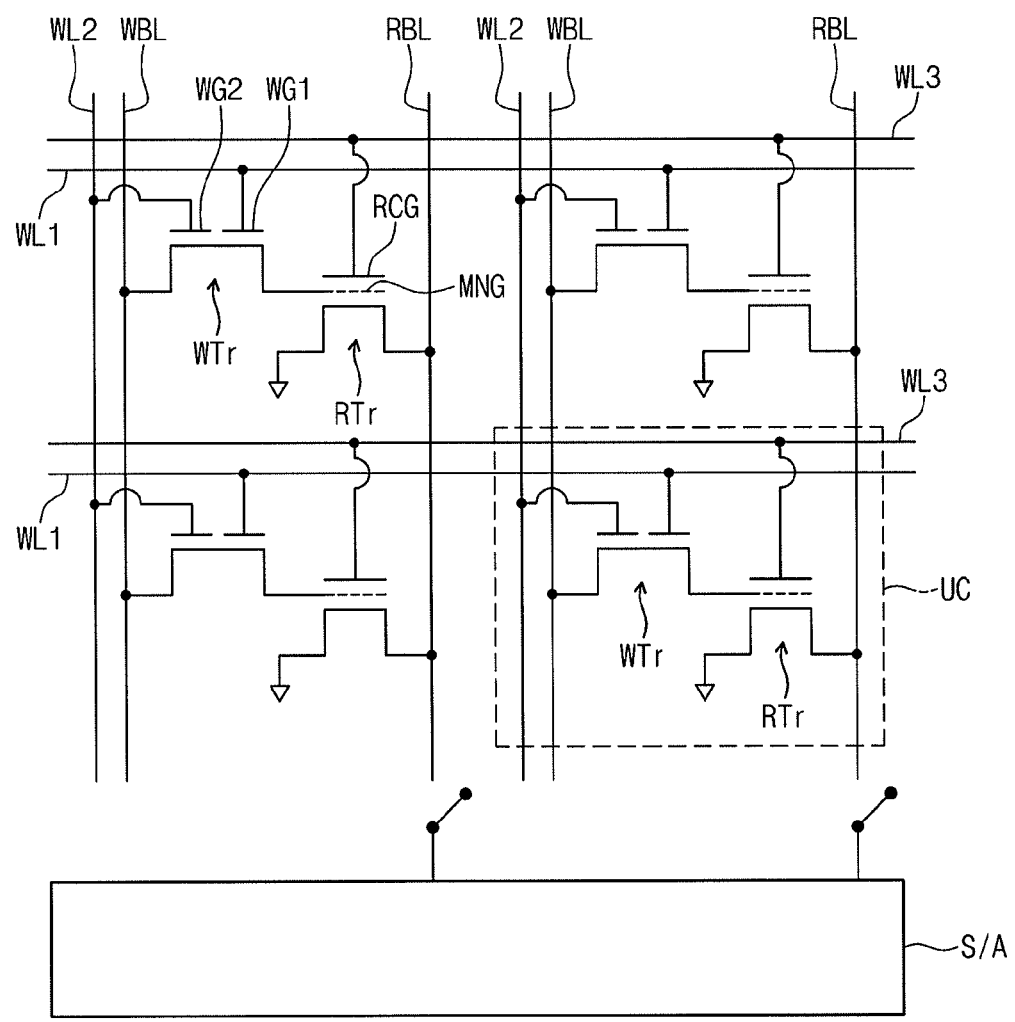
FIG. 2 illustrates an equivalent circuit diagram of a modified example of a semiconductor memory device according to some embodiments of the inventive concept.

FIG. 2 illustrates an equivalent circuit diagram of a modified example of a semiconductor memory device according to some embodiments of the inventive concept.

Referring to FIG. 2, in a semiconductor memory device according to the present modified example, the control gate RCG of the read transistor RTr may be connected to a third word line WL3. The third word line WL3 may be controlled independently from the first and second word lines WL1 and WL3. The third word line WL3 may cross the read bit line RBL. In some embodiments, the third word line WL3 may be parallel to the first word line WL1 and cross the second word line WL2.

A program operation of the semiconductor memory device according to the present modified example may be substantially the same as the program operation described with reference to FIG. 1. During a read operation of the semiconductor memory device according to the present modified example, a sensing gate voltage and a sensing bit line voltage may be respectively applied to the third word line WL3 and the read bit line RBL connected to a selected unit cell. In other words, the data of the selected unit cell may be sensed using the third word line WL3 and the read bit line RBL during the read operation.

Figure 3:
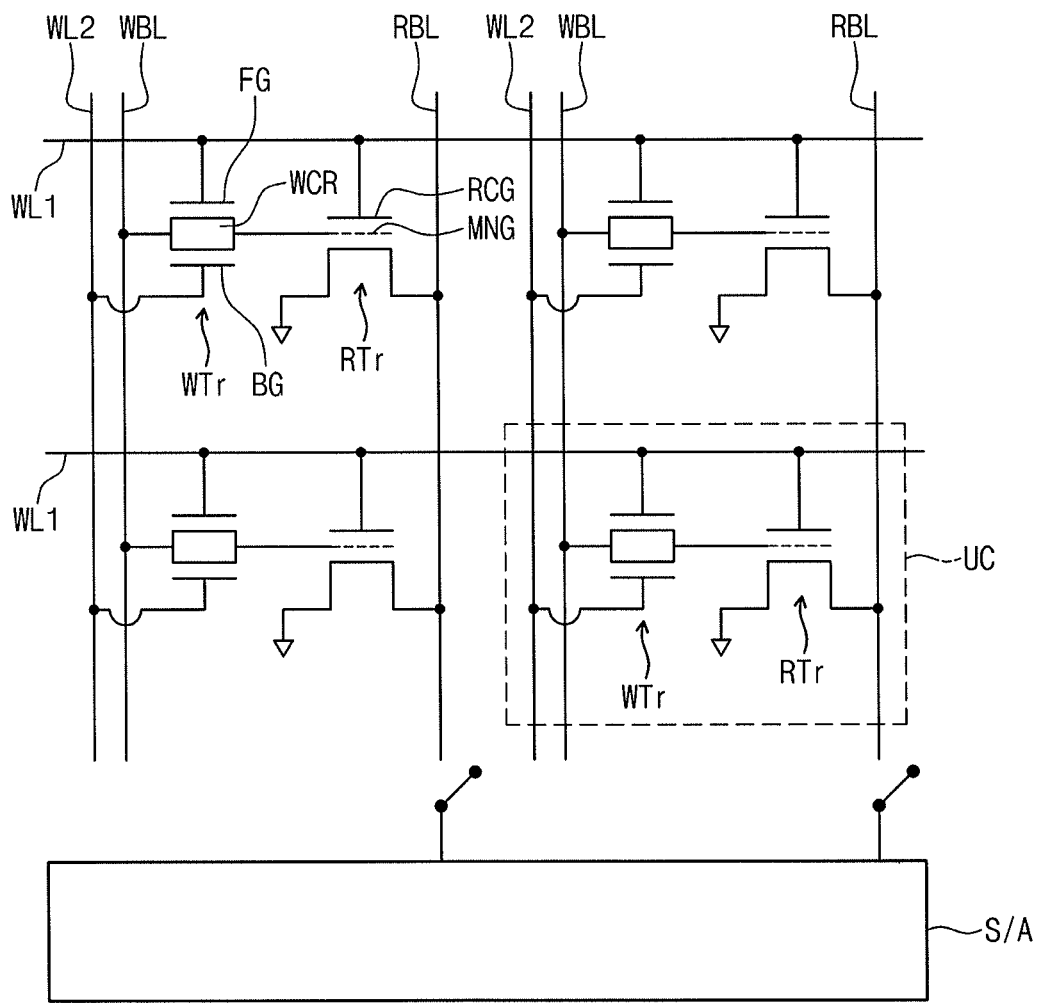
FIG. 3 illustrates an equivalent circuit diagram of another modified example of a semiconductor memory device according to some embodiments of the inventive concept.

FIG. 3 is an equivalent circuit diagram illustrating another modified example of a semiconductor memory device according to some embodiments of the inventive concept.

Referring to FIG. 3, a unit cell of a semiconductor memory device according to the present modified example may include a write transistor WTr and a read transistor RTr. Here, the write transistor WTr may include a write channel region WCR, a front gate FG controlling a front side of the write channel region WCR, and a back gate BG controlling a back side of the write channel region WCR. The front gate FG may be connected to a first word line WL1 and the back gate BG may be connected to a second word line WL2 crossing the first word line WL1. If turn-on voltages are applied to the front gate FG and the back gate BG, respectively, the write channel region WCR is turned-on. Since the front gate FG and the back gate BG are connected to the first word line WL1 and the second word line WL2 crossing each other, respectively, the unit cells UC of the semiconductor memory device according to the present modified example may be randomly accessed.

Figure 4:
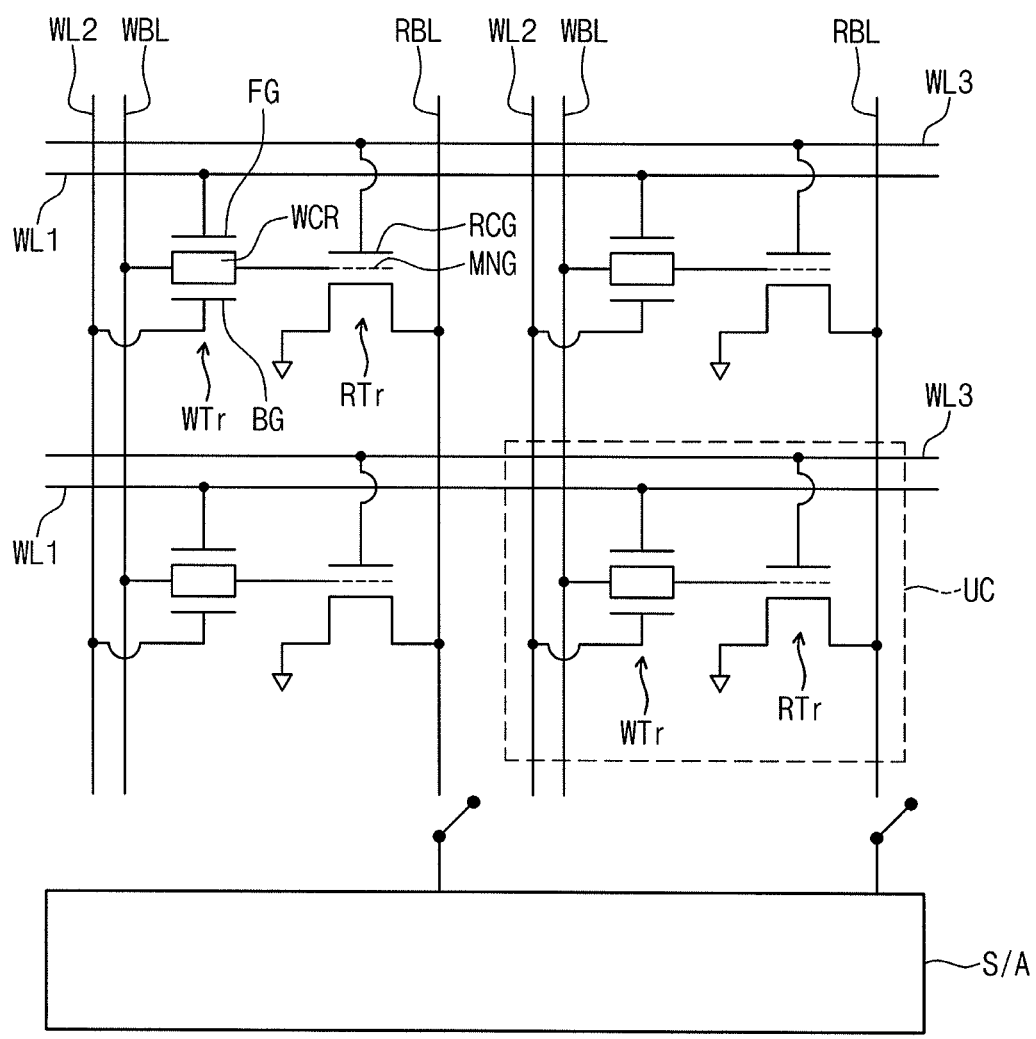
FIG. 4 illustrates an equivalent circuit diagram of still another modified example of a semiconductor memory device according to some embodiments of the inventive concept.

FIG. 4 illustrates an equivalent circuit diagram of still another modified example of a semiconductor memory device according to some embodiments of the inventive concept.

Referring to FIG. 4, a unit cell UC of a semiconductor memory device according to the present modified example may include the write transistor WTr illustrated in FIG. 3 and the read transistor RTr illustrated in FIG. 2. In other words, the front gate FG of the write transistor WTr may be connected to the first word line WL1, the back gate BG of the write transistor WTr may be connected to the second word line WL2, and the control gate RCG of the read transistor RTr may be connected to the third word line WL3.

Second Embodiment

Figure 5:
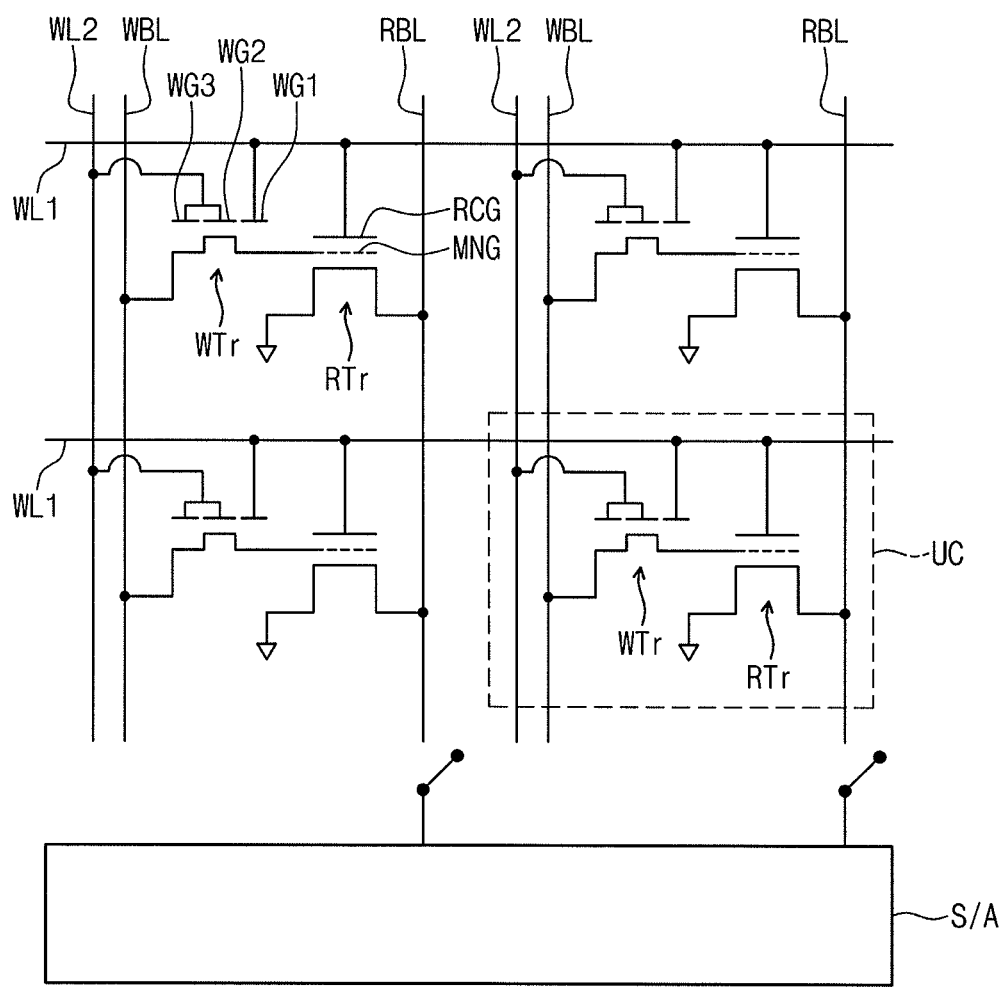
FIG. 5 illustrates an equivalent circuit diagram of a semiconductor memory device according to other embodiments of the inventive concept.

FIG. 5 is an equivalent circuit diagram illustrating a semiconductor memory device according to other embodiments of the inventive concept.

Referring to FIG. 5, a unit cell UC of the semiconductor memory device according to the present embodiment may include a write transistor WTr and a read transistor RTr. The write transistor WTr may include a first write gate WG1, a second write gate WG2, and a third write gate WG3. The first write gate WG1 may control a first source/drain terminal of the write transistor WTr, the second write gate WG2 may control a channel region of the write transistor WTr, and the third write gate WG3 may control a second source/drain terminal of the write transistor WTr. In some embodiments, the first write gate WG1 may be connected to a first word line WL1 extending in one direction, and the second and third write gates WG2 and WG3 may be connected to a second word line WL2 crossing the first word line WL1. The first and second word lines WL1 and WL2 may be controlled independently from each other.

The read transistor RTr may include a memory node gate MNG connected to the first source/drain terminal of the write transistor WTr, a first source/drain terminal, and a second source/drain terminal. Additionally, the read transistor RTr may further include a control gate RCG. The control gate RCG may be insulated from the memory node gate MNG, and the memory node gate MNG may be disposed between the control gate RCG and a channel region of the read transistor RTr. The memory node gate MNG may be floated. The control gate RCG may be coupled to the memory node gate MNG so as to control the channel region of the read transistor RTr. In some embodiments, the control gate RCG may be connected to the first word line WL1. In some embodiments, when the first write gate WG1 and the control gate RCG are connected to the first word line WL1, the control gate RCG may be omitted and the first write gate WG1 may further perform the function of the control gate RCG. In other words, during a read operation, the first write gate WG1 may be coupled to the memory node gate MNG so as to control the channel region of the read transistor RTr.

The second source/drain terminal of the write transistor WTr may be connected to a write bit line WBL, and the first source/drain terminal of the read transistor RTr may be connected to a read bit line RBL. The write bit line WBL may cross the first word line WL1. The read bit line RBL may also cross the first word line WL1. The second source/drain terminal of the read transistor RTr may be connected to a common source region to which a reference voltage (e.g., a ground voltage) is applied. In some embodiments, a plurality of the read bit lines RBL may share one sense amplifier S/A in a cell array. The sense amplifier S/A may be a current-sense amplifier.

According to embodiments of the inventive concept, the write transistor WTr and the read transistor RTr may be NMOS transistors. However, the inventive concept is not limited thereto, e.g., the write transistor WTr and the read transistor RTr may be PMOS transistors. For the purposes of ease and convenience in the explanation, the write and read transistors WTr and RTr being the NMOS transistors will be described as an example hereinafter.

The first source/drain terminal, the channel region, and the second source/drain terminal of the write transistor WTr are defined in a body part formed of a semiconductor material. Here, the first and second source/drain terminals of the write transistor WTr have the same doped state as that of the channel region of the write transistor WTr. The first write gate WG1 may have a work function capable of engineering an energy band of the first source/drain terminal of the write transistor WTr. The second write gate WG2 may have a work function capable of engineering an energy band of the channel region of the write transistor WTr. The third write gate WG3 may have a work function capable of engineering an energy band of the second source/drain terminal of the write transistor WTr. Hereinafter, the unit cell UC will be described in more detail with reference to FIGS. 6A to 6E.

Figure 6A:
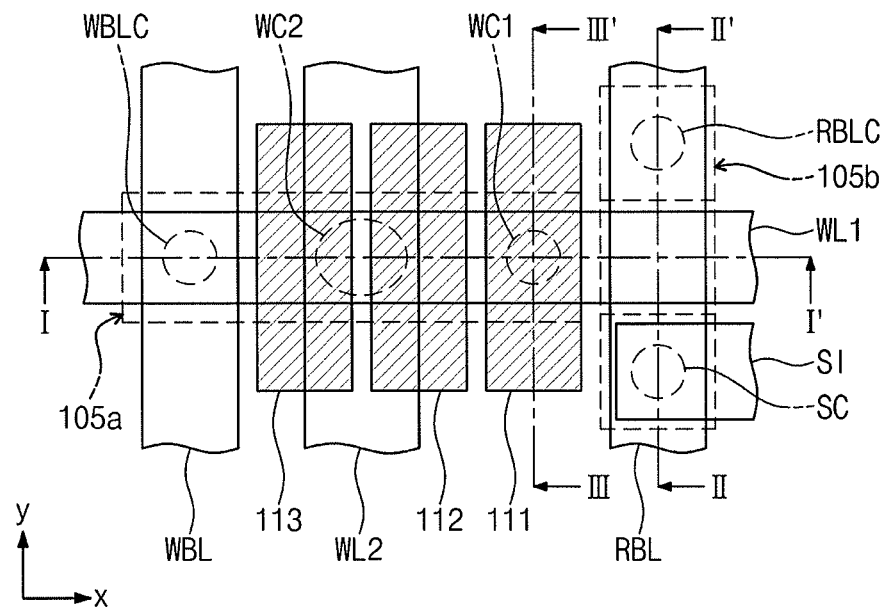
FIG. 6A illustrates a plan view of an example of a semiconductor memory device of FIG. 5.
Figure 6B:
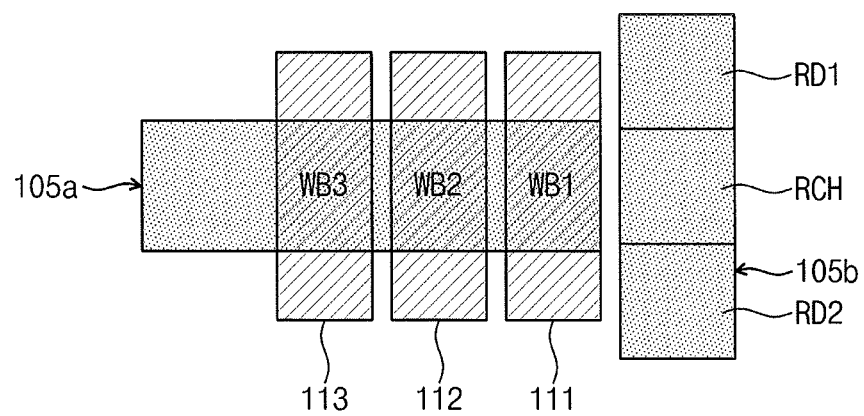
FIG. 6B illustrates a plan view of active portions and gate electrodes of FIG. 6A.
Figure 6C:
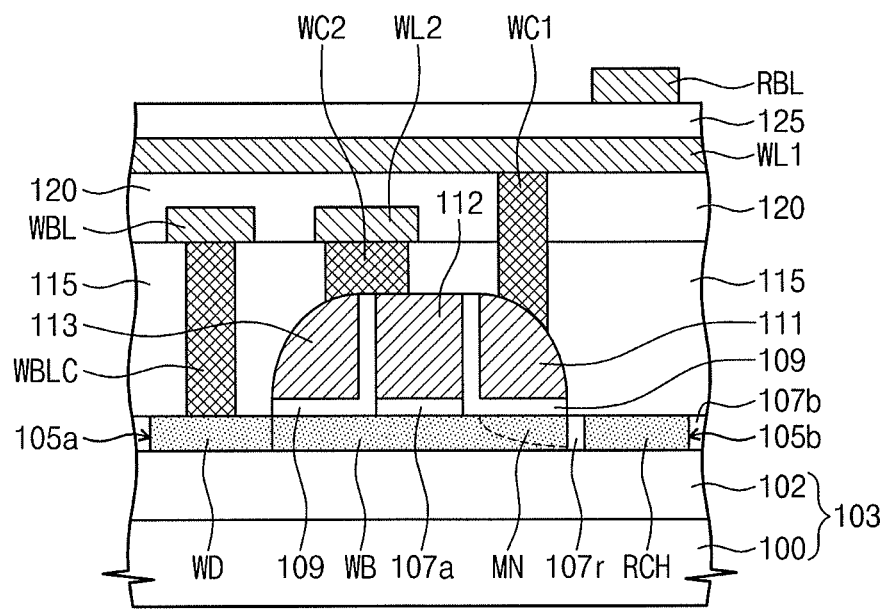
FIG. 6C illustrates a cross-sectional view taken along a line I-I' of FIG. 6A.
Figure 6D:
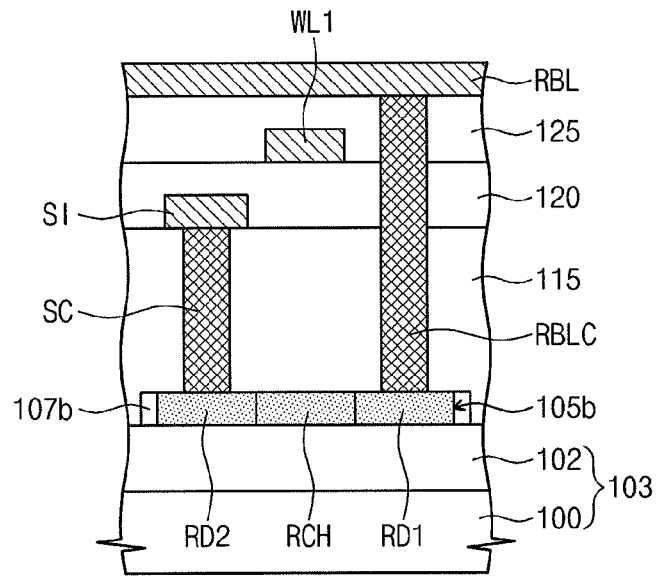
FIG. 6D illustrates a cross-sectional view taken along a line II-II' of FIG. 6A.
Figure 6E:
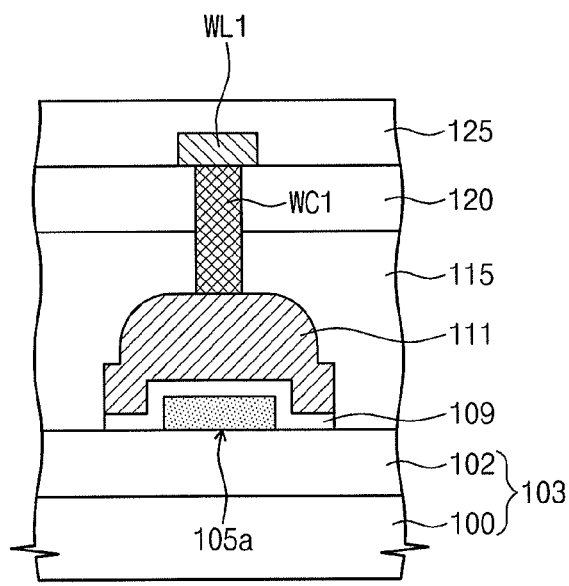
FIG. 6E illustrates a cross-sectional view taken along a line III-III' of FIG. 6A.

FIG. 6A is a plan view illustrating an example of a semiconductor memory device of FIG. 5. FIG. 6B is a plan view illustrating active portions and gate electrodes of FIG. 6A. In FIG. 6A, lines in FIG. 6A are omitted for showing active portions and gate electrodes of FIG. 6A in more detail. FIG. 6C is a cross-sectional view taken along a line I-I' of FIG. 6A. FIG. 6D is a cross-sectional view taken along a line II-II' of FIG. 6A. FIG. 6E is a cross-sectional view taken along a line of FIG. 6A.

Referring to FIGS. 6A to 6E, a first active portion 105a and a second active portion 105b may be disposed on a substrate 103. The second active portion 105b may be laterally spaced apart from the first active portion 105a. In some embodiments, a distance between the first and second active portions 105a and 105b may correspond to a gate dielectric layer between the memory node gate and the channel region of the read transistor RTr of FIG. 5. The first and second active portions 105a and 105b are formed of a semiconductor material. For example, the first and second active portions 105a and 105b may be formed of silicon. As illustrated in FIGS. 6A and 6B, the first active portion 105a may have a rectangular shape extending in a first direction and the second active portion 105b may have a rectangular shape extending in a second direction different from the first direction when viewed from a plan view. The first direction and the second direction may correspond to an x-axis direction and a y-axis direction of FIG. 6A, respectively.

Referring to FIG. 6C, the substrate 103 may include a semiconductor substrate 100 and a buried oxide layer 102 which are sequentially stacked. The first and second active portions 105a and 105b may be disposed on the buried oxide layer 102. In other words, the substrate 103 may be a silicon-on-insulator (SOI) substrate. In the SOI substrate, a silicon layer on the buried oxide layer 102 may be patterned to form the first and second active portions 105a and 105b. However, the inventive concept is not limited thereto. In other embodiments, the substrate 103 may be a bulk semiconductor substrate, and the first and second active portions 105a and 105b may respectively correspond to portions of the bulk semiconductor substrate which are defined by a device isolation pattern (not shown).

Referring again to FIGS. 6A and 6B, a first gate electrode 111, a second gate electrode 112, and a third gate electrode 113 may cross over the first active portion 105a in parallel to each other. The second gate electrode 112 may be disposed between the first and third gate electrodes 111 and 113, and the first gate electrode 111 may be adjacent to the second active portion 105b.

As illustrated in FIG. 6C, the first to third gate electrodes 111, 112, and 113 are insulated from the first active portion 105a. A first gate dielectric layer 107a may be disposed between the second gate electrode 112 and the first active portion 105a. A second gate dielectric layer 109 may be disposed between the first active portion 105a and each of the first and third gate electrodes 111 and 113. The second gate dielectric layer 109 between the first gate electrode 111 and the first active portion 105a may extend between a sidewall of the first gate electrode 111 and a sidewall of the second gate electrode 112. The second gate dielectric layer 109 between the third gate electrode 113 and the first active portion 105a may extend between a sidewall of the third gate electrode 113 and another sidewall of the second gate electrode 112. The first gate dielectric layer 107a may include an oxide, a nitride, and/or a high-k dielectric material (e.g., an insulating metal oxide such as a hafnium oxide). The second gate dielectric layer 109 may include an oxide, a nitride, and/or a high-k dielectric material (e.g., an insulating metal oxide such as a hafnium oxide). The second gate dielectric layer 109 may be formed of the same material as or a different material from the first gate dielectric layer 109.

A read-gate dielectric layer 107r may be disposed between the first active portion 105a and the second active portion 105b. The read-gate dielectric layer 107r corresponds to the gate dielectric layer disposed between the memory node gate MNG and the channel region of the read transistor RTr of FIG. 5. The read-gate dielectric layer 107r may be formed of the same material as the first gate dielectric layer 107a. A residual dielectric layer 107b may be disposed on sidewalls of the first and second active portions 105a and 105b. The residual dielectric layer 107b may be formed of the same material as the first gate dielectric layer 107a.

As illustrated in FIGS. 6B and 6C, the first active portion 105a disposed under the first to third gate electrodes 111, 112, and 113 may be defined as a body part WB. The body part WB may include a first portion WB1 under the first gate electrode 111, a second portion WB2 under the second gate electrode 112, and a third portion WB3 under the third gate electrode 113. The first portion, the second portion, and the third portion of the body part WB may be included in the first source/drain terminal, the channel region, and the second source/drain terminal of the write transistor WTr in FIG. 5, respectively. A doped state of the first and third portions WB1, WB3 of the body part WB may be substantially the same as a doped state of the second portion WB2 of the body part WB. For example, the first, second, and third portions of the body part WB may be in an undoped state. In other words, the first, second, and third portions of the body part WB may be in an intrinsic state. Alternatively, the first, second, and third portions of the body part WB may be lightly doped with dopants of a first conductivity type. Dopant concentrations of the first, second, and third portions of the body part WB may be substantially the same. For example, the first, second, and third portions of the body part WB may have the first conductivity type dopant concentration of about $1 \times 10^{15}$ cm$^3$ or less.

The first gate electrode 111 is formed of a conductive material having a first work function capable of engineering an energy band of the first portion WB1 of the body part WB. The second gate electrode 112 is formed of a conductive material having a second work function capable of engineering an energy band of the second portion WB2 of the body part WB. The second work function is different from the first work function. Here, the energy band of the first portion WB1 of the body part WB is engineered to generate a potential well due to the first work function of the first gate electrode 111 and the energy band of the second portion WB2 of the body part WB is engineered to generate a potential barrier due to the second work function of the second gate electrode 112. As illustrated in FIG. 6C, the potential well of the first portion of the body part WB is defined as a memory node MN. As described above, even though the doped state of the memory node MN is the same as the second portion of the body part WB, the memory node MN being the potential well is generated due to the engineering of the first and second work functions of the first and second gate electrodes 111 and 112.

For example, if the write and read transistors are NMOS transistors, the first work function may be smaller than the second work function. In this case, the first work function of the first gate electrode 111 may approach an energy level of a conduction band edge of the semiconductor material of the first active portion 105a and the second work function of the second gate electrode 112 may approach an energy level of a valance band edge of the semiconductor material of the first active portion 105a. The first gate electrode 111 may include at least one of a doped semiconductor (e.g., an N-type semiconductor), a metal, and a metal nitride which have the first work function. The second gate electrode 112 may include at least one of a doped semiconductor (e.g., a P-type semiconductor), a metal, and a metal nitride which have the second work function.

The third gate electrode 113 may be formed of a conductive material having a third work function capable of engineering an energy band of the third portion WB3 of the body part WB. In some embodiments, the third work function may be the same as the first work function. Thus, the engineered energy band of the third portion WB3 of the body part WB may be substantially the same as the energy band of the memory node MN. In some embodiments, the third gate electrode 113 may be formed of the same material as the first gate electrode 111.

A write-doped region WD may be disposed in the first active portion 105a at a side of the third gate electrode 113. The write-doped region WD may be doped with dopants of a second conductivity type. The write-doped region WD may be doped with a high concentration. The write-doped region WD may be in contact with the third portion of the body part WB. In other words, the third portion of the body part WB which is controlled by the third gate electrode 113 may be disposed between the write-doped region WD and the second portion of the body part WB.

A first read-doped region RD1 and a second read-doped region RD2 may be disposed in the second active portion 105b (see FIGS. 6B and 6D). The first read-doped region RD1 is spaced apart from the second read-doped region RD2. Thus, a read-channel region RCH is defined in the second active portion 105b between the first and second read-doped regions RD1 and RD2. The read-channel region RCH may overlap the memory node MN in the first direction (i.e., the x-axis direction). In other words, the read-gate dielectric layer 107r may be disposed between the memory node MN and the read-channel region RCH. The read-channel region RCH may be doped with dopants of the first conductivity type, and the first and second read-doped regions RD1 and RD2 may be doped with dopants of the second conductivity type. One of the first conductivity type dopant and the second conductivity type dopant may be an N-type dopant, and the other of the first conductivity type dopant and the second conductivity type dopant may be a P-type dopant. In some embodiments, the first conductivity type dopant may be the P-type dopant, and the second conductivity type dopant may be the N-type dopant.

Referring to FIGS. 5 and 6A to 6E, the first gate electrode 111 may correspond to the first write gate WG1 of the write transistor WTr. Additionally, the first gate electrode 111 may also correspond to the control gate RCG of the read transistor RTr. In other words, the first write gate WG1 and the control gate RCG may share the first gate electrode 111. The second gate electrode 112 may correspond to the second write gate WG2 of the write transistor WTr. The third gate electrode 113 may correspond to the third write gate WG3 of the write transistor WTr.

The memory node MN may correspond to the first source/drain terminal of the write transistor WTr. Additionally, the memory node MN may also correspond to the memory node gate MNG of the read transistor RTr. In other words, the first source/drain terminal of the write transistor WTr and the memory node gate MNG may share the memory node MN. The third portion of the body part WB which is in contact with the write-doped region WD may correspond to the second source/drain terminal of the write transistor WTr.

The first read-doped region RD1 may correspond to the first source/drain terminal of the read transistor RTr, and the second read-doped region RD2 may correspond to the second source/drain terminal of the read transistor RTr.

As a result, the write transistor WTr may include the first to third gate electrodes 111, 112, and 113 and the body part WB including the memory node MN. And the read transistor RTr may include the first gate electrode 111, the memory node MN, the first read-doped region RD1, the read-channel region RCH, and the second read-doped region RD2.

As described above, the first, second, and third portions of the body part WB have the same doped state as each other and the energy bands of the first, second, and third portions of the body parts WB are engineered by the first, second, and third work functions of the first, second, and third gate electrodes 111, 112, and 113. Thus, the memory node MN is generated. The memory node MN may correspond to the first source/drain terminal of the write transistor WTr. That is, the doped state of the memory node MN is the same as that of the second portion WB2 of the body part WB corresponding to the channel region of the write transistor WTr. Thus, a PN junction does not exist between the memory node MN and a remainder of the body part WB. As a result, it is possible to prevent a junction leakage and/or recombination caused by the PN junction. If the PN junction exists in the body part WB, stored charges may leak through the PN junction or be recombined in a depletion region around the PN junction. Thus, stored data may be lost. However, according to embodiments of the inventive concept, the PN junction does not exist at the memory node MN. Thus, the above problems may be resolved. As a result, it is possible to realize the semiconductor memory device having improved data retention property. Additionally, it is possible to realize the semiconductor memory device having excellent reliability.

Referring to FIGS. 6A to 6E, the first word line WL1 may be electrically connected to the first gate electrode 111 and the second word line WL2 may be electrically connected to the second and third gate electrodes 112 and 113. As illustrated in FIG. 6A, the second word line WL2 may cross the first word line WL1.

The write bit line WBL may be electrically connected to the write-doped region WD. Thus, the write bit line WBL may be electrically connected to the third portion of the body part WB through the write-doped region WD. The write bit line WBL may cross the first word line WL1. A read bit line RBL may be electrically connected to the first read-doped region RD1. The read bit line RBL may cross the first word line WL1 and be parallel to the write bit line WBL. A source interconnection SI may be electrically connected to the second read-doped region RD2.

In more detail, a first interlayer insulating layer 115 may be disposed on the substrate 103 including the gate electrodes 111, 112, and 113 and the active portions 105a and 105b. The write bit line WBL, the second word line WL2, and the source interconnection SI may be disposed on the first interlayer insulating layer 115. A second interlayer insulating layer 120 may be disposed on the write bit line WBL, the second word line WL2, the source interconnection SI, and the first interlayer insulating layer 115. The first word line WL1 may be disposed on the second interlayer insulating layer 120. A third interlayer insulating layer 125 may be disposed on the first word line WL1 and the second interlayer insulating layer 120. The read bit line RBL may be disposed on the third interlayer insulating layer 125.

A first word line-contact plug WC1 may successively penetrate the second and first interlayer insulating layers 120 and 115 so as to be connected to the first gate electrode 111. The first word line WL1 may be electrically connected to the first gate electrode 111 through the first word line-contact plug WC1. A second word line-contact plug WC2 may penetrate the first interlayer insulating layer 115 so as to be connected to the second and third gate electrodes 112 and 113 simultaneously. The second word line WL2 may be connected to the second and third gate electrodes 112 and 113 through the second word line-contact plug WC2. A write bit line-contact plug WBLC may penetrate the first interlayer insulating layer 115 so as to be connected to the write-doped region WD. The write bit line WBL may be electrically connected to the write-doped region WD through the write bit line-contact plug WBLC. The source interconnection SI may be electrically connected to the second read-doped region RD2 through a source-contact plug SC penetrating the first interlayer insulating layer 115. The read bit line RBL may be electrically connected to the first read-doped region RD1 through a read bit line-contact plug RBLC successively penetrating the third, second, and first interlayer insulating layers 125, 120, and 115.

The inventive concept is not limited to the above arrangement type of the lines WL1, WL2, WBL, and RBL and the source interconnection SI. The lines WL1, WL2, WBL, and RBL and the source interconnection SI may be arranged in various types.

The energy bond of the first active portion 105a of the semiconductor memory device aforementioned above will be described in more detail with reference to the drawings.

Figure 7A:
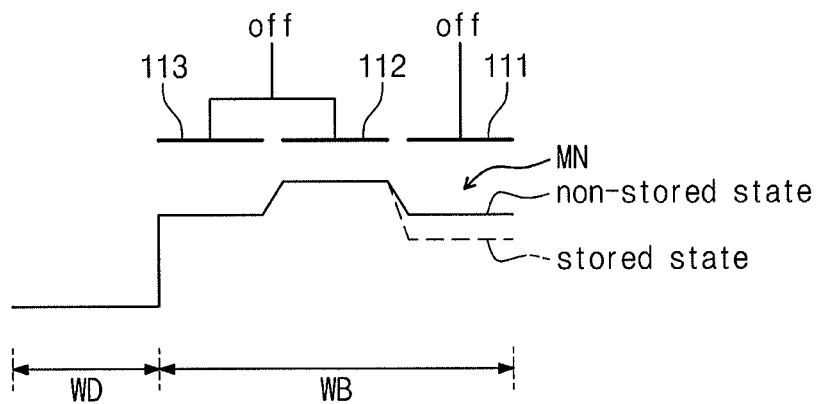
FIG. 7A illustrates an energy band diagram of a first active portion of FIGS. 6A and 6B in an equilibrium state.

FIG. 7A is an energy band diagram of a first active portion of FIGS. 6A and 6B in an equilibrium state.

Referring to FIG. 7A, the first to third gate electrodes 111, 112, and 113 may be in a turn-off state in an equilibrium state. The first portion, the second portion, and the third portion of the body part WB are disposed under the first gate electrode 111, the second gate electrode 112, and the third gate electrode 113, respectively. Due to the energy band engineering of the first and second gate electrodes 111 and 112 respectively having the first and second work functions, the energy level of the first portion of the body part WB is formed into the potential well, and the energy level of the second portion of the body part WB is formed in the potential barrier. Thus, the memory node MN is generated in the first portion of the body part WB. The engineered energy levels of the first and second portions may correspond to conduction band edges of the first and second portions of the body part WB, respectively.

As described above, the third work function of the third gate electrode 113 may be the same as the first work function. Thus, the engineered energy level of the third portion of the body part WB may be substantially the same as the energy level of the first portion of the body part WB as illustrated in FIG. 7A.

Since the write-doped region WD is doped with the high concentration, the energy level of the write-doped region WD may be lower than the engineered energy level of the third portion of the body part WB.

In the first portion of the body part WB illustrated in FIG. 7A, a full line represents a non-stored state not storing charges (e.g., electrons), and a dot line represents a stored state storing charges.

Figure 7B:
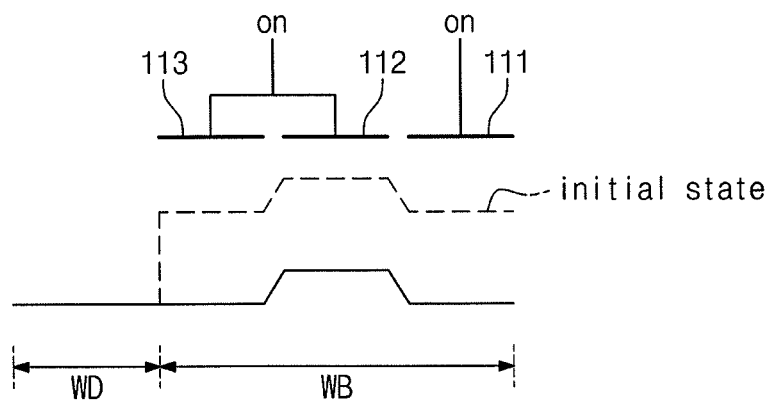
FIG. 7B illustrates an energy band diagram of a first active portion of FIGS. 6A and 6B in the state that turn-on voltages are applied to first and second word lines.

FIG. 7B is an energy band diagram of a first active portion of FIGS. 6A and 6B in the state that turn-on voltages are applied to first and second word lines.

Referring to FIG. 7B, when turn-on voltages are applied to the first and second word lines WL1 and WL2 of FIG. 6, respectively, the energy levels of the first to third portions of the body part WB may descend from an initial state in the equilibrium state downward. Thus, the write transistor may be turned-on. At this time, the potential well and the potential barrier of the first and second portions of the body part WB may be maintained. In other words, the energy level shape for the memory node may be maintained. When the write transistor is turned-on, a program voltage may be applied to the write bit line WBL to supply charges to the memory node. Thereafter, the write transistor is turned-off, so that the charges may be stored in the memory node.

Figure 7C:
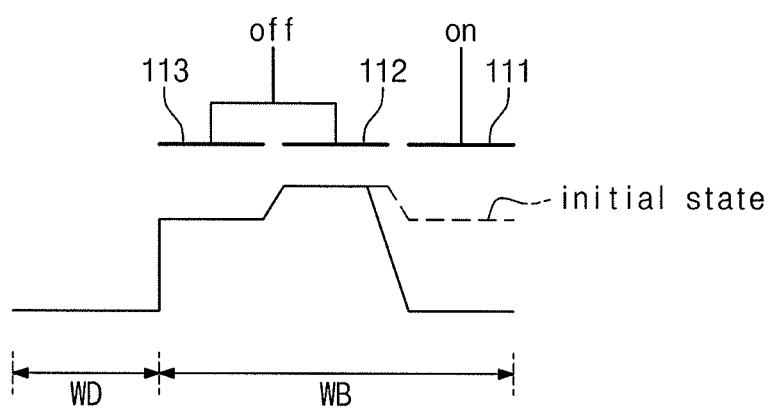
FIG. 7C illustrates an energy band diagram of a first active portion of FIGS. 6A and 6B in the state that a turn-on voltage is applied to a first word line.

FIG. 7C is an energy band diagram of a first active portion of FIGS. 6A and 6B in the state that a turn-on voltage is applied to a first word line. Referring to FIG. 7C, when a turn-on voltage is applied to the first word line and a turn-off voltage is applied to the second word line (or the second word line is floated), the energy level of the first portion of the body part WB may descend, while the energy levels of the second and third portions of the body part WB may maintain the initial state. Thus, the write transistor may be maintained in the turn-off state.

A program operation and a read operation of the semiconductor memory device illustrated in FIGS. 5 and 6A to 6E may be the same as the program operation and the read operation of the semiconductor memory device described with reference to FIG. 1, respectively.

In a standby mode of the semiconductor memory device of FIGS. 5 and 6A to 6E, the first and second word lines WL1 and WL2 may be floated. Alternatively, a predetermined holding voltage may be applied to the first word line WL1 in the standby mode. In this case, the energy level of the first portion of the body part WB may descend lower than the initial state as illustrated in FIG. 7C, the charges may be more stably stored.

Meanwhile, the third work function of the third gate electrode 113 may be the same as the first work function of the first gate electrode 111 as described above. Alternatively, the third work function of the third gate electrode 113 may be substantially the same as the second work function of the second gate electrode 112. This will be described with reference to FIG. 7D in more detail.

Figure 7D:
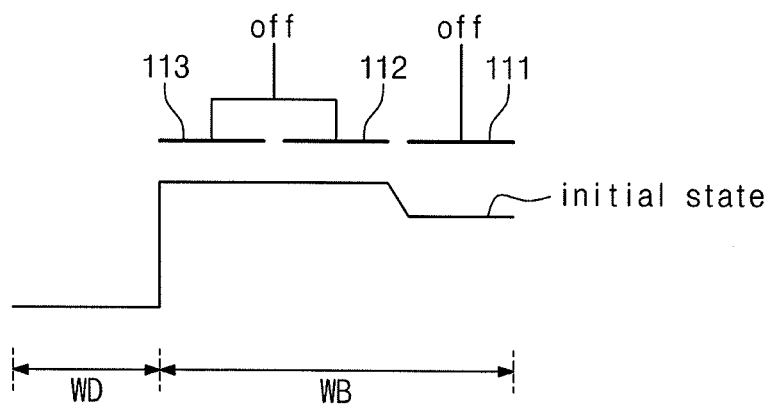
FIG. 7D illustrates an energy band diagram for explaining a modified example of a semiconductor memory device of FIGS. 6A to 6E.

FIG. 7D is an energy band diagram for explaining a modified example of a semiconductor memory device of FIGS. 6A to 6E. Referring to FIG. 7D, the third work function of the third gate electrode 113 may be substantially the same as the second work function of the second gate electrode 112. Thus, the engineered energy level of the third portion of the body part WB under the third gate electrode 113 may be substantially the same as the engineered energy level of the second portion of the body part WB under the second gate electrode 112. As a result, when the turn-on voltage is applied to the first word line WL1 and the turn-off voltage is applied to the second word line WL2 (or the second word line WL2 is floated), the turn-off property of the write transistor may be improved.

The write transistor illustrated in FIGS. 6A to 6E may be a planar type transistor. Alternatively, the write transistor may be a vertical type transistor. This will be described with reference to the drawings below.

Figure 8A:
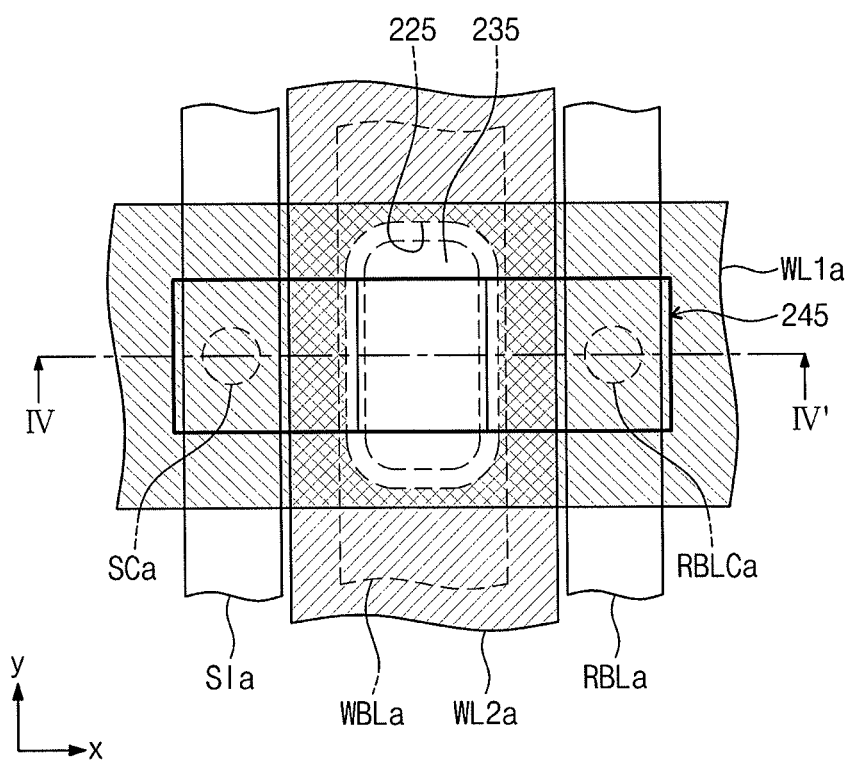
FIG. 8A illustrates a plan view illustrating another example of a semiconductor memory device of FIG. 5.
Figure 8B:
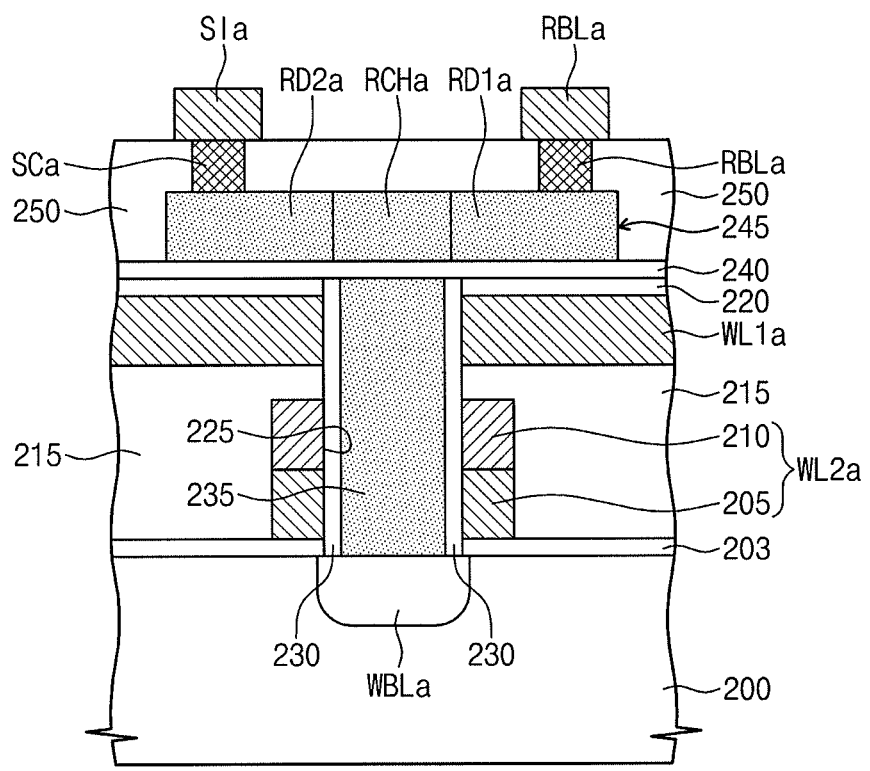
FIG. 8B illustrates a cross-sectional view taken along a line IV-IV' of FIG. 8A.

FIG. 8A illustrates a plan view of another example of a semiconductor memory device of FIG. 5. FIG. 8B illustrates a cross-sectional view taken along a line IV-IV' of FIG. 8A.

Referring to FIGS. 8A and 8B, a write bit line WBLa may be disposed in a substrate 200. The substrate 200 may be a semiconductor substrate (e.g., a silicon substrate). The write bit line WBLa may be a region doped with dopants. A first word line WL1a may be disposed on the substrate 200. The first word line WL1a may extend in one direction. A second word line WL2a may be disposed under the first word line WL1a and on the substrate 200. The second word line WL2a may cross the first word line WL1a. The second word line WL2a may be disposed on the write bit line WBLa. The write bit line WBLa may cross the first word line WL1a. The write bit line WBLa may be parallel to the second word line WL2a.

The second word line WL2a may include a lower gate electrode 205 and an upper gate electrode 210 sequentially stacked on the substrate 200. The upper gate electrode 210 may be in contact with the lower gate electrode 205. The first word line WL1a may be formed of a conductive material having the first work function described with reference to FIGS. 6A to 6E, the upper gate electrode 210 of the second word line WL2a may be formed of a conductive material having the second work function described with reference to FIGS. 6A to 6E. The lower gate electrode 205 of the second word line WL2a may be formed of a conductive material having the third work function described with reference to FIGS. 6A to 6E. Alternatively, the lower gate electrode 205 may be formed of a conductive material having the third work function described with reference to FIG. 7D.

A first insulating layer 203 may be disposed between the second word line WL2a and the substrate 200. The first insulating layer 203 may extend to cover the substrate 200 around the second word line WL2a. A second insulating layer 215 may be disposed between the first word line WL1a and the second word line WL2a. The second insulating layer 215 may cover the substrate 200 and the first insulating layer 203 around the second word line WL2a. A third insulating layer 220 may be disposed on the first word line WL1a. The third insulating layer 220 may be disposed on a top surface of the first word line WL1a and have sidewalls aligned with sidewalls of the first word line WL1a. Each of the first to third insulating layers 203, 215, and 220 may include an oxide, a nitride, and/or an oxynitride.

A vertical active portion 235 may be disposed in a vertical hole 225 successively penetrating the third insulating layer 220, the first word line WL1a, the second insulating layer 215, the second word line WL2a, and the first insulating layer 203 in a crossing region of the first and second word lines WL1a and WL2a. In other words, a sidewall of the vertical active portion 235 may be surrounded by the first and second word lines WL1a and WL2a. The vertical active portion 235 may be formed of a semiconductor material (e.g., silicon). The vertical active portion 235 may be in an intrinsic state. Alternatively, the vertical active portion 235 may be lightly and uniformly doped with dopants of a first conductivity type. For example, the vertical active portion 235 may have a the first conductivity type dopant concentration of about $1 \times 10^{15}$ $cm^3$ or less.

The vertical active portion 235 may be connected to the write bit line WBLa. The write bit line WBLa may be doped with dopants of a second conductivity type. A first gate dielectric layer 230 may be disposed between the vertical active portion 235 and an inner sidewall of the vertical hole 225. Thus, the vertical active portion 235 is insulated from the write line WL2. Further, the insulating layer 215 insulates the vertical active portion 235 from the first word line WL1a, as well as the first word line WL1a from the second word line WL2a. The first gate dielectric layer 235 may include an oxide, a nitride, an oxynitride, and/or a high-k dielectric material.

A horizontal active portion 245 may be disposed on the vertical active portion 235. In some embodiments, the horizontal active portion 245 may have a rectangular shape extending in parallel to the first word line WL1a. As illustrated in FIG. 8A, a top surface of the vertical active portion 235 may have a width greater than a short axis of the horizontal active portion 245. Thus, the top surface of the vertical active portion 235 may be disposed under the horizontal active portion 245 and cross the horizontal active portion 245. The horizontal active portion 245 may be formed of a semiconductor material (e.g., silicon). In some embodiments, the horizontal active portion 245 may be in a poly-crystalline state. A first read-doped region RD1a and a second read-doped region RD2a may be formed in the horizontal active portion 245. The first and second read-doped regions RD1a and RD2a are laterally spaced apart from each other. Thus, a read-channel region RCHa is defined in the horizontal active portion 245 between the first and second read-doped regions RD1a and RD2a. The read-channel region RCHa may be doped with dopants of the first conductivity type, and the first and second read-doped regions RD1a and RD2a may be doped with dopants of the second conductivity type. The read-channel region RCHa may be disposed on the vertical active portion 235. A second gate dielectric layer 24s0 may be disposed between the horizontal active portion 245 and the top surface of the vertical active portion 235. The second gate dielectric layer 240 may include an oxide, a nitride, an oxynitride, and/or a high-k dielectric material.

A fourth insulating layer 250 may disposed on the substrate 200 including the horizontal active portion 245. The fourth insulating layer 250 may include an oxide, a nitride, and/or an oxynitride. A read bit line RBLa may be disposed on the fourth insulating layer 250. The read bit line RBLa may be electrically connected to the first read-doped region RD1a through a read bit line-contact plug RBLCa penetrating the fourth insulating layer 250. The read bit line RBLa may cross the first word line WL1a. A source interconnection SIa may be disposed on the fourth insulating layer 250. The source interconnection SIa may be electrically connected to the second read-doped region RD2a through a source-contact plug SCa penetrating the fourth insulating layer 250.

Referring to FIGS. 5, 8A, and 8B, the vertical active portion 235 surrounded by the first and second word lines WL1a and WL2a may correspond to a vertical body part. The vertical body part may include a first portion surrounded by the first word line WL1a, a second portion surrounded by the upper gate electrode 210 of the second word line WL2a, and a third portion surrounded by the lower gate electrode 205 of the second word line WL2a. The first, second, and third portions of the vertical body part have the same doped state as each other. A portion of the first word line WL1a surrounding the first portion of the vertical body part may correspond to the first write gate WG1 and the control gate RCG of the read transistor WTr in FIG. 5. A portion of the upper gate electrode 210 surrounding the second portion of the vertical body part may correspond to the second write gate WG2 in FIG. 5. A portion of the lower gate electrode 205 surrounding the third portion of the vertical body part may correspond to the third write gate WG3 in FIG. 5. In other words, the portion of the first word line WL1a may correspond to the first gate electrode 111 of FIGS. 6A to 6E, the portion of the upper gate electrode 210 of the second word line WL2a may correspond to the second gate electrode 112 of FIGS. 6A to 6E, and the portion of the lower gate electrode 205 of the second word line WL2a may correspond to the third gate electrode 113 of FIGS. 6A to 6E.

The first and second word lines WL1a and the WL2a having the first, second, and third work functions may engineer energy bands of the first, second, and third portions of the vertical body part. Due to the first word line WL1a having the first work function and the upper gate electrode 210 having the second work function, a potential well is generated in the first portion of the vertical body part, and a potential barrier is generated in the second portion of the vertical body part. Thus, a memory node is generated in the first portion of the vertical body part. The memory node may correspond to the first source/drain terminal of the write transistor WTr of FIG. 5. Additionally, the memory node may also correspond to the memory node gate MNG of the read transistor RTr of FIG. 5.

As described in the first embodiment, the third work function may be the same as the first work function. In this case, the engineered energy level of the third portion of the vertical body part may be substantially the same as the engineered energy level of the first portion of the vertical body part. Alternatively, the third work function may be the same as the second work function. In this case, the engineered energy level of the third portion of the vertical body part may be substantially the same as the engineered energy level of the second portion of the vertical body part. The third portion of the vertical body part may correspond to the second source/drain terminal of the write transistor WTr of FIG. 5.

The first read-doped region RD1a and the second read-doped region RD2a may correspond to the first source/drain terminal and the second source/drain terminal of the read transistor RTr of FIG. 5, respectively.

The write transistor WTr may include the portion of the first word lines WL1a, the portions of the upper and lower gate electrodes 210 and 205, and the vertical active portion 235. The read transistor RTr may include the memory node of the vertical body part, the first read-doped region RD1a, the second read-doped region RD2a, and the read-channel region RCHa.

According to the semiconductor memory device described above, the memory node does not have a PN junction. Thus, it is possible to prevent the problems caused by the PN junction as described in the first embodiment. As a result, the semiconductor memory device having excellent reliability. Additionally, since the vertical active portion 235 penetrates the crossing region of the first and second word lines WL1a and WL2a, the write transistor WTr may be realized as a vertical type transistor. Moreover, the horizontal active portion 245 for the read transistor RTr is stacked on the vertical active portion 235. Thus, it is possible to reduce a planar area of the unit cell including the write and read transistors WTr and RTr. As a result, a highly integrated semiconductor memory device may be realized.

According to the semiconductor memory device described with reference to FIGS. 8A and 8B, the read transistor may be disposed on the write transistor. Alternatively, the write transistor may be disposed on the read transistor. This will be described with the drawings.

Figure 9A:
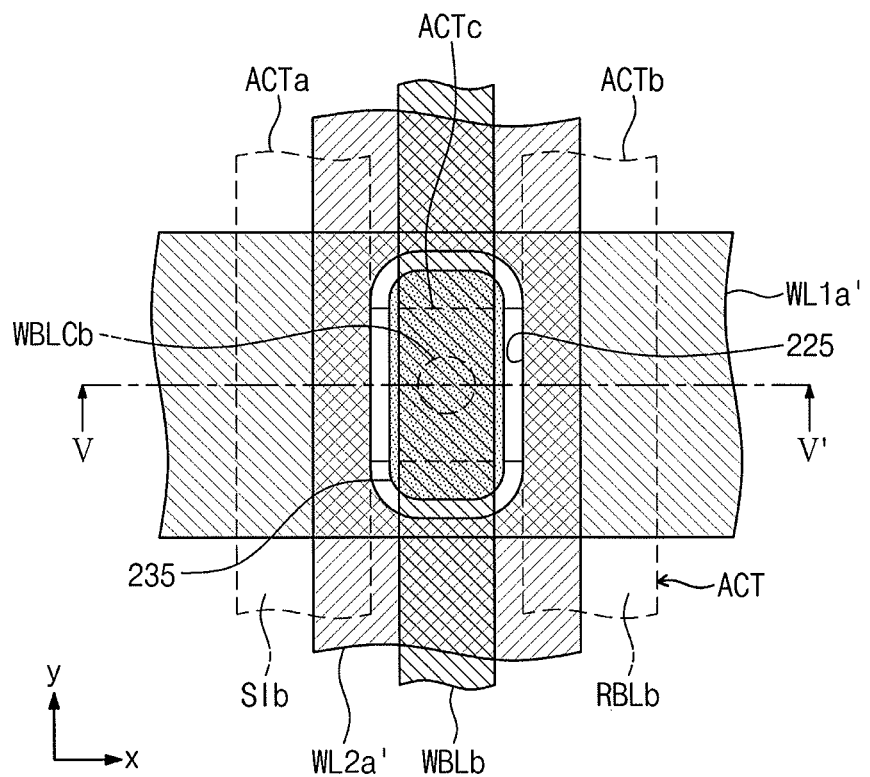
FIG. 9A illustrates a plan view of still another example of a semiconductor memory device of FIG. 5.
Figure 9B:
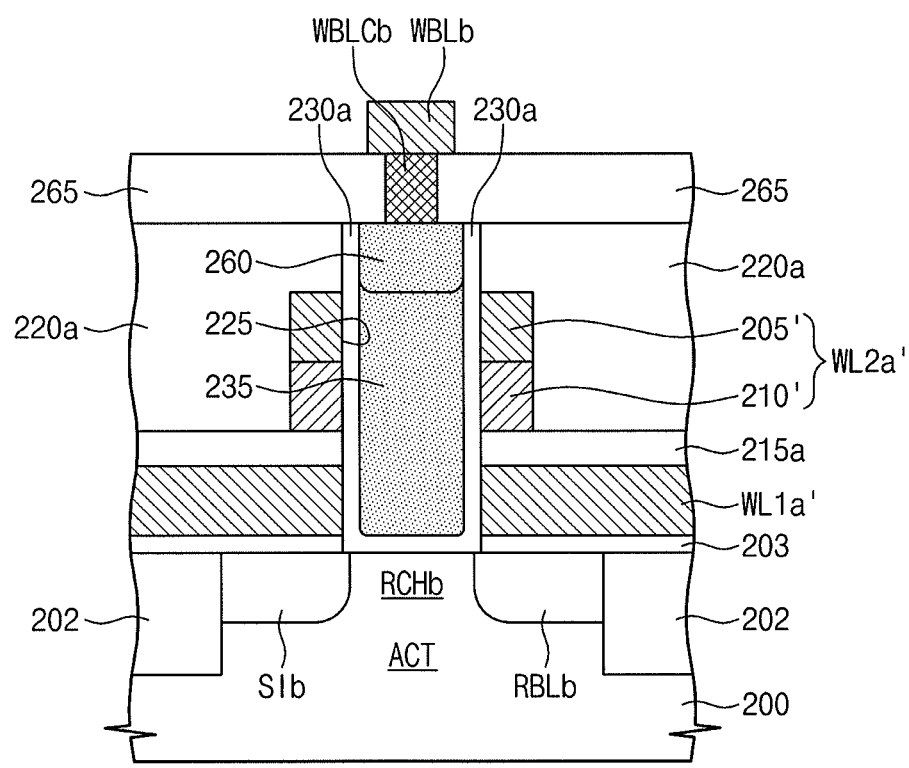
FIG. 9B illustrates a cross-sectional view taken along a line V-V' of FIG. 9A.

FIG. 9A illustrates a plan view of still another example of a semiconductor memory device of FIG. 5. FIG. 9B illustrates a cross-sectional view taken along a line V-V' of FIG. 9A.

Referring to FIGS. 9A and 9B, a device isolation pattern 202 may be disposed in a substrate 200 to define a horizontal active portion ACT. The horizontal active portion ACT may be a portion of the substrate 200 surrounded by the device isolation pattern 202. As illustrated in FIG. 9A, the horizontal active portion ACT may include a pair of linear portions ACTa, ACTb extending in parallel to each other in one direction and a connecting portion ACTc disposed between the pair of linear portions in a plan view. The connecting portion ACTc is connected to the pair of linear portions ACTa, ACTb. In other words, the horizontal active portion ACT may have an H-shape in a plan view. A source interconnection SIb and a read bit line RBLb may be disposed in resperive one of the linear portions ACTa, ACTb. The source interconnection SIb and the read bit line RBLb may extend in parallel to each other in the one direction. The source interconnection SIb and the read bit line RBLb are laterally spaced apart from each other. Thus, a read-channel region RCHb may be defined in the horizontal active portion ACT between the source interconnection SIb and the read bit line RBLb. Here, the read-channel region RCHb may be defined in the connecting portion ACTc of the horizontal active portion ACT. The read-channel region RCHb is doped with dopants of a first conductivity type, and the source interconnection SIb and the read bit line RBLb are doped with dopants of a second conductivity type.

A first word line WL1a' may be disposed on the substrate 200. A first insulating layer 203 may be disposed between the first word line WL1a' and the substrate 200. The first word line WL1a' may cross the source interconnection SIb and the read bit line RBLb, and may cover the read-channel region RCHb. The first word line WL1a' is formed of the same material as the first word line WL1a of FIGS. 8A and 8B. In other words, the first word line WL1a' has the first work function.

A second insulating layer 215a may be disposed on the first word line WL1a' and the substrate 200. A second word line WL2a' may be disposed on the second insulating layer 215a. The second word line WL2a' may cross the first word line WL1a'. In some embodiments, the second word line WL2a' may be parallel to the source interconnection SIb and the read bit line RBLb. A crossing region of the first and second word lines WL1a' and WL2a' may be disposed on the read-channel region RCHb. The second word line WL2a' may include a lower gate electrode 210' and an upper gate electrode 205' sequentially stacked. The lower and upper gate electrodes 210' and 205' may be in contact with each other. The lower gate electrode 210' of the second word line WL2a' is formed of the same material as the upper gate electrode 210 of FIGS. 8A and 8B, and the upper gate electrode 205' of the second word line WL2a' is formed of the same material as the lower gate electrode 205 of FIGS. 8A and 8B. In other words, the lower gate electrode 210' has the second work function, and the upper gate electrode 205' has the third work function.

A third insulating layer 220a may be disposed on the second word line WL2a' and the second insulating layer 215a. A vertical hole 225 may successively penetrate the third insulating layer 220a, the second word line WL2a', the second insulating layer 215a, the first word line WL1a', and the first insulating layer 203. The vertical hole 225 may be disposed on the read-channel region RCHb. A vertical active portion 235 may be disposed in the vertical hole 225. The vertical active portion 235 may cross over the read-channel region RCHb. A top surface of the vertical active portion 235 may be higher than a top surface of the second word line WL2a'. A gate dielectric layer 230a may be disposed between the vertical active portion 235 and an inner sidewall of the vertical hole 225. Additionally, the gate dielectric layer 230a may extend to be disposed between the vertical active portion 235 and the read-channel region RCHb.

The vertical active portion 235 may be in the intrinsic state. Alternatively, the vertical active portion 235 may be lightly doped with dopants of the first conductivity type. For example, the vertical active portion 235 may have the first conductivity type dopant-concentration of about $1\times10^{15}$ cm$^3$ or less. A write-doped region 260 may be formed in an upper portion of the vertical active portion 235. The write-doped region 260 may be doped with dopants of the second conductivity type. A bottom surface of the write-doped region 260 may be disposed at substantially the same height as or a height higher than the top surface of the second word line WL2a'.

A fourth insulating layer 265 may be disposed on the vertical active portion 235 and the third insulating layer 220a. A write bit line WBLb may be disposed on the fourth insulating layer 265. The write bit line WBLb may cross the first word line WL1a'. The write bit line WBLb may be parallel to the second word line WL2a', the source interconnection SIb, and the read bit line RBLb. The write bit line WBLb may be electrically connected to the write-doped region 260 through a write bit line-contact plug WBLCb penetrating the fourth insulating layer 265.

The vertical active portion 235 includes a vertical body part surrounded by the first and second word lines WL1a' and WL2a'. The vertical body part may be a portion of the vertical active portion 235 which is disposed under the write-doped region 260. The vertical body part includes a first portion surrounded by the first word line WL1a', a second portion surrounded by the lower gate electrode 210' of the second word line WL2a', and a third portion surrounded by the upper gate electrode 205' of the second word line WL2a'. The first, second, and third portions of the vertical body part in the present example may be sequentially stacked. As described above, energy bands of the first and second portions of the vertical body part are engineered by the first and second work functions of the first word line WL1a' and the lower gate electrode 210', so that a memory node is generated in the first portion of the vertical body part. The memory node is adjacent to the read-channel region RCHb, and the gate electrode 230a is disposed between the memory node and the read-channel region RCHb.

A portion of the first word line WL1a' surrounding the first portion of the vertical body part may correspond to the first write gate WG1 of the write transistor WTr and the control gate RCG of the read transistor WTr in FIG. 5. A portion of the lower gate electrode 210' surrounding the second portion of the vertical body part may correspond to the second write gate WG2 in FIG. 5. A portion of the upper gate electrode 205' surrounding the third portion of the vertical body part may correspond to the third write gate WG3 in FIG. 5.

Meanwhile, as illustrated in FIG. 5, when the first write gate WG1 is connected to the first word line WL1 and the second write gate WG2 is connected to the second word line, the third write gate WG3 may be omitted. In this case, a first end of a channel region of the write transistor WTr may be connected to the first source/drain terminal of the write transistor WTr, and a second end of the channel region of the write transistor WTr may be connected to the write bit line WBL. In this case, the second end of the channel region of the write transistor WTr may be connected to the write bit line WBL via the write-doped region WD illustrated in FIG. 6C.

Next, modified examples of the semiconductor memory device according to the present embodiment will be described with reference to the drawings.

Figure 10:
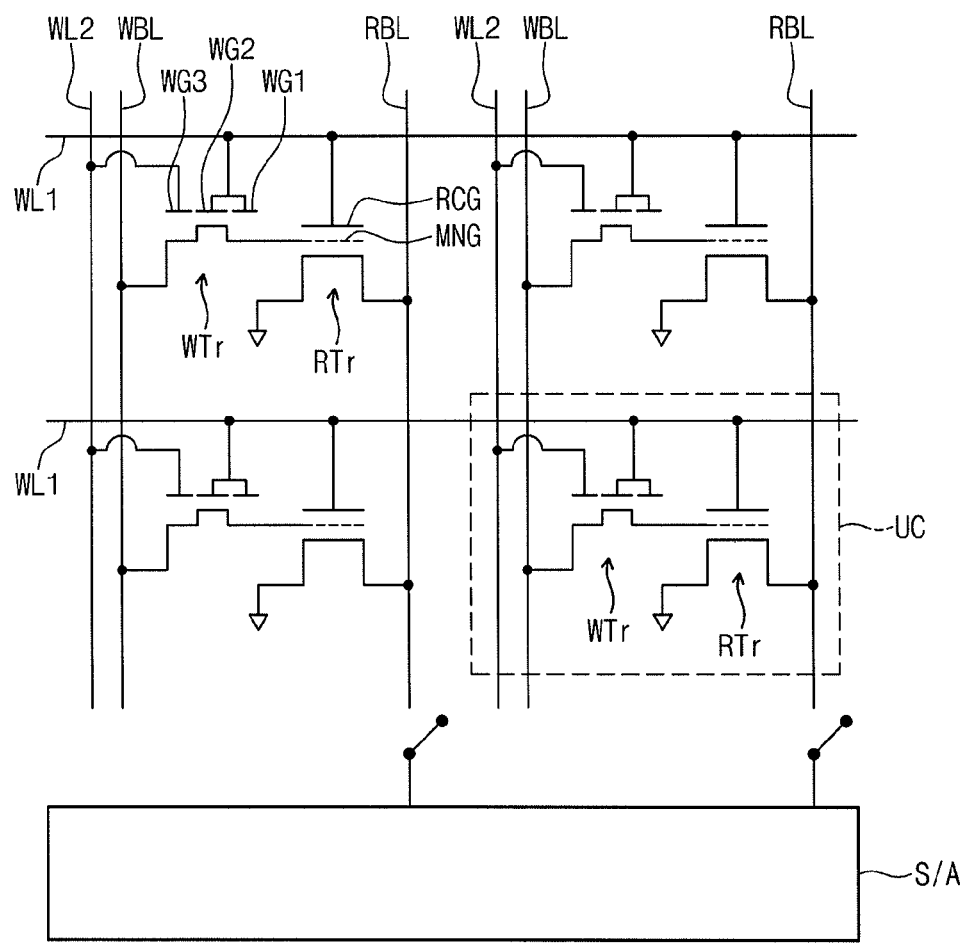
FIG. 10 illustrates an equivalent circuit diagram of a modified example of a semiconductor memory device according to other embodiments of the inventive concept.

FIG. 10 illustrates an equivalent circuit diagram of a modified example of a semiconductor memory device according to other embodiments of the inventive concept.

Referring to FIG. 10, according to the present modified example, first and second write gates WG1 and WG2 of a write transistor WTr may be connected to a first word line WL1, and a third write gate WG3 of the write transistor WTr may be connected to a second word line WL2 crossing the first word line. The first, second, and third write gates WG1, WG2, and WG3 of the write transistor WTr have the first work function, the second work function, and the third work function described with reference to FIGS. 5 and 6A to 6E, respectively. In the present modified example, the write transistor WTr of a selected unit cell may be turned-on when turn-on voltages are applied to the first and second word lines WL1 and WL2 connected to the selected unit cell, respectively. Semiconductor memory devices according to the present modified example will be described in more detail with reference to the drawings.

Figure 11A:
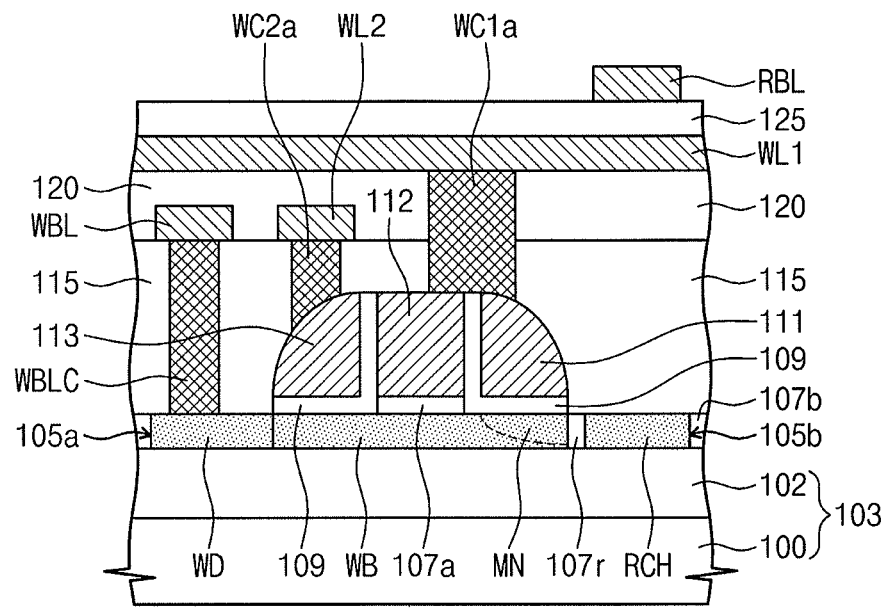
FIG. 11A illustrates a cross-sectional view of an example of a semiconductor memory device of FIG. 10.

FIG. 11A illustrates a cross-sectional view of an example of a semiconductor memory device of FIG. 10.

Referring to FIG. 11A, a bottom surface of a first word line-contact plug WC1a may be connected to the first and second gate electrodes 111 and 112. The first word line WL1 may be electrically connected to the first and second gate electrodes 111 and 112 through the first word line-contact plug WC1a. A second word line-contact plug WC2a may be connected to the third gate electrode 113. The second word line WL2 may be electrically connected to the third gate electrode 113 through the second word line-contact plug WC2a. Other elements of the semiconductor memory device according to the present example may be the same as corresponding elements of FIGS. 6A to 6E.

An energy band diagram of the first active portion 105a of FIG. 11A may be the same as the energy band diagram of FIG. 7A or 7D in an equilibrium state. When the turn-on voltages are applied to the first and second word lines WL1 and WL2, respectively, the energy band diagram of the first active portion 105a of FIG. 11A may be the same as the energy band diagram of FIG. 7B. When the turn-on voltage is applied to the first word line WL1 and the second word-line WL2 is turned-off, the energy band diagram of the first active portion 105a 11A is illustrated in FIG. 11B.

Figure 11B:
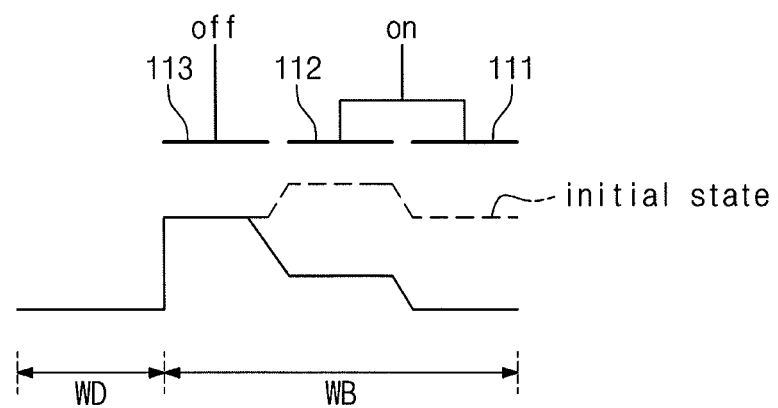
FIG. 11B illustrates an energy band diagram of a first active portion of FIG. 11A in the state that a first word line is turned-on and a second word line is turned-off.

FIG. 11B is an energy band diagram of a first active portion of FIG. 11A in the state that a first word line is turned-on and a second word line is turned-off.

Referring to FIGS. 11A and 11B, energy levels of the first and second portions of the body part WB may descend by the turn-on voltage applied to the first word line WL1. Alternatively, since the second word line WL2 is turned-off, at least a portion of an energy level of the third portion of the body part under the third gate electrode 113 may maintain the initial state. Thus, the write transistor may be turned-off. If the third work function of the third gate electrode 113 is the same as the second work function of the second gate electrode 112, the energy level of the third portion of the body part WB illustrated in FIG. 11B may be replaced with the energy level of the third portion of the body part WB illustrated in FIG. 7B.

Figure 12:
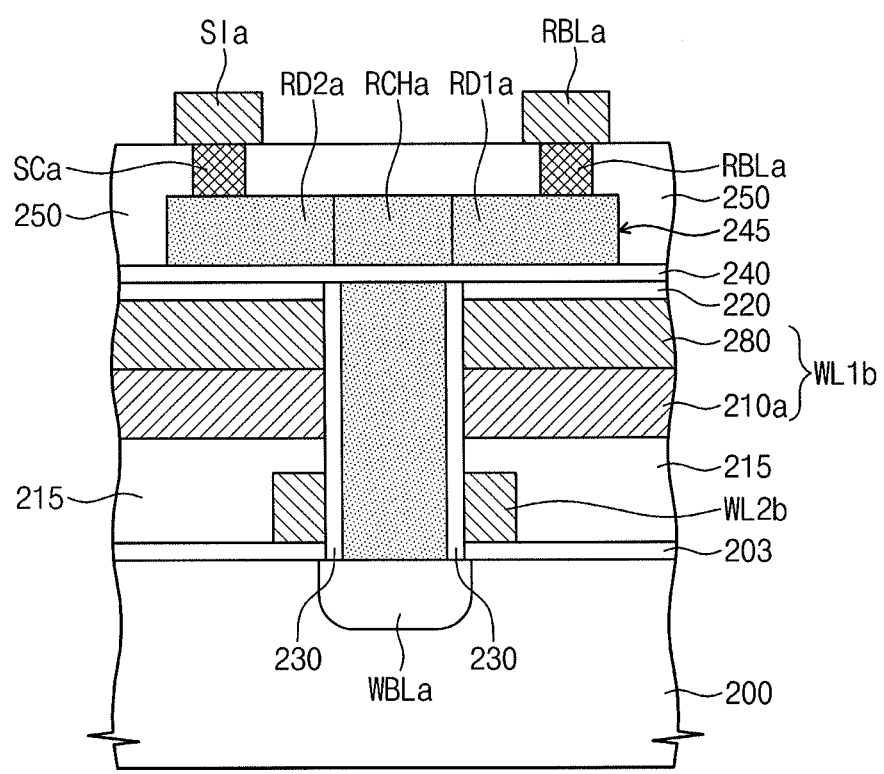
FIG. 12 illustrates a cross-sectional view of another example of a semiconductor memory device of FIG. 10.

FIG. 12 is a cross-sectional view illustrating another example of a semiconductor memory device of FIG. 10.

Referring to FIG. 12, a first word line WL1*b* may include a lower gate electrode 210*a* and an upper gate electrode 280 which are sequentially stacked. The upper gate electrode 280 may be in contact with the lower gate electrode 210*a*. A second word line WL2*b* may be disposed under the first word line WL1*b*. A first insulating layer 203 may be disposed between the second word line WL2*b* and the substrate 200, and a second insulating layer 215 may be disposed between the first word line WL1*b* and the second word line WL2*b*. The upper gate electrode 280 of the first word line WL1*b* may be formed of the same material as the first word line WL1*a* of FIGS. 8A and 8B, and the lower gate electrode 210*a* of the first word line WL1*b* may be formed of the same material as the upper gate electrode 210 of the second word line WL2*a* of FIGS. 8A and 8B. The second word line WL2*b* may be formed of the same material as the lower gate electrode 205 of the second word line WL2*a* of FIGS. 8A and 8B. In other words, the upper gate electrode 280 may have the first work function, the lower gate electrode 210*a* may have the second work function, and the second word line WL2*b* may have the third work function.

A vertical active portion 235 may be disposed in a vertical hole 225 successively penetrating the third insulating layer 220, the first word line WL1*b*, the second insulating layer 215, the second word line WL2*b*, and the first insulating layer 203. Other elements of the semiconductor memory device according to the present example may be the same as corresponding elements of FIGS. 8A and 8B.

Figure 13:
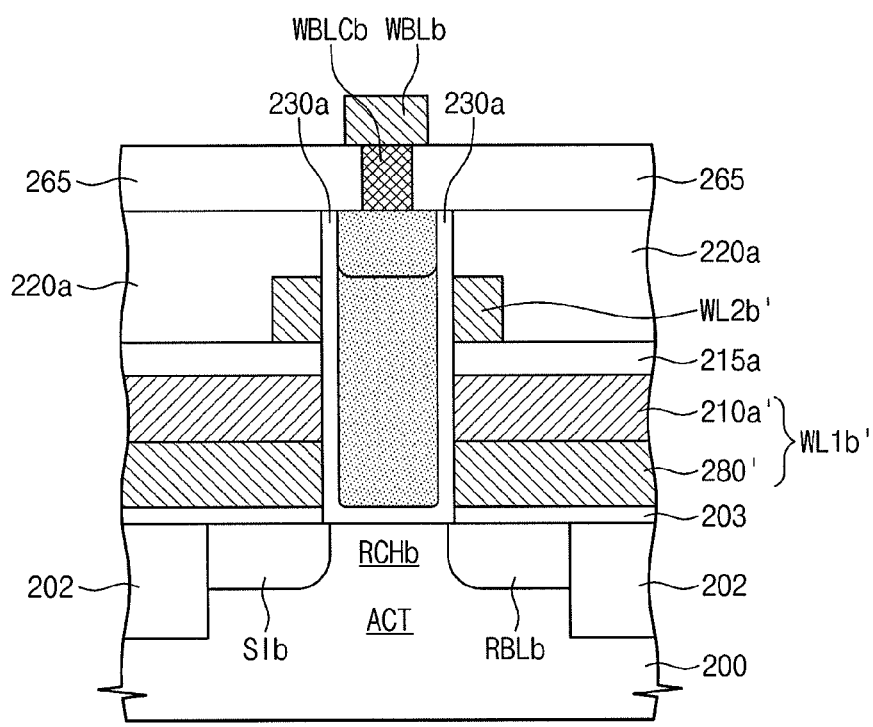
FIG. 13 illustrates a cross-sectional view of still another example of a semiconductor memory device of FIG. 10.

FIG. 13 illustrates a cross-sectional view of still another example of a semiconductor memory device of FIG. 10. Referring to FIG. 13, a first word line WL1*b*' may include a lower gate electrode 280' and an upper gate electrode 210*a*'. The upper gate electrode 210*a*' may be in contact with the lower gate electrode 280'. A second word line WL2*b*' may crossover the first word line WL1*b*'. A second insulating layer 215*a* may be disposed between the first and second word lines WL1*b*' and WL2*b*'.

The lower gate electrode 280' of the first word line WL1*b*' may be formed of the same material as the first word line WL1*a*' of FIGS. 9A and 9B. The upper gate electrode 210*a*' of the first word line WL1*b*' may be formed of the same material as the lower gate electrode 210' of the second word line WL2*a*' of FIGS. 9A and 9B. The second word line WL2*b*' may be formed of the same material as the upper gate electrode 205 of the second word line WL2*a*' of FIGS. 9A and 9B. In other words, the lower gate electrode 280' may have the first work function, the upper gate electrode 210*a*' may have the second work function, and the second word line WL2*b*' may have the third work function.

A vertical active portion 235 may be disposed in a vertical hole 225 successively penetrating the third insulating layer 220*a*, the second word line WL2*b*', the second insulating layer 215*a*, the first word line WL1*b*', and the first insulating layer 203. Other elements of the semiconductor memory device according to the present example may be the same as corresponding elements of FIGS. 9A and 9B.

Figure 14:
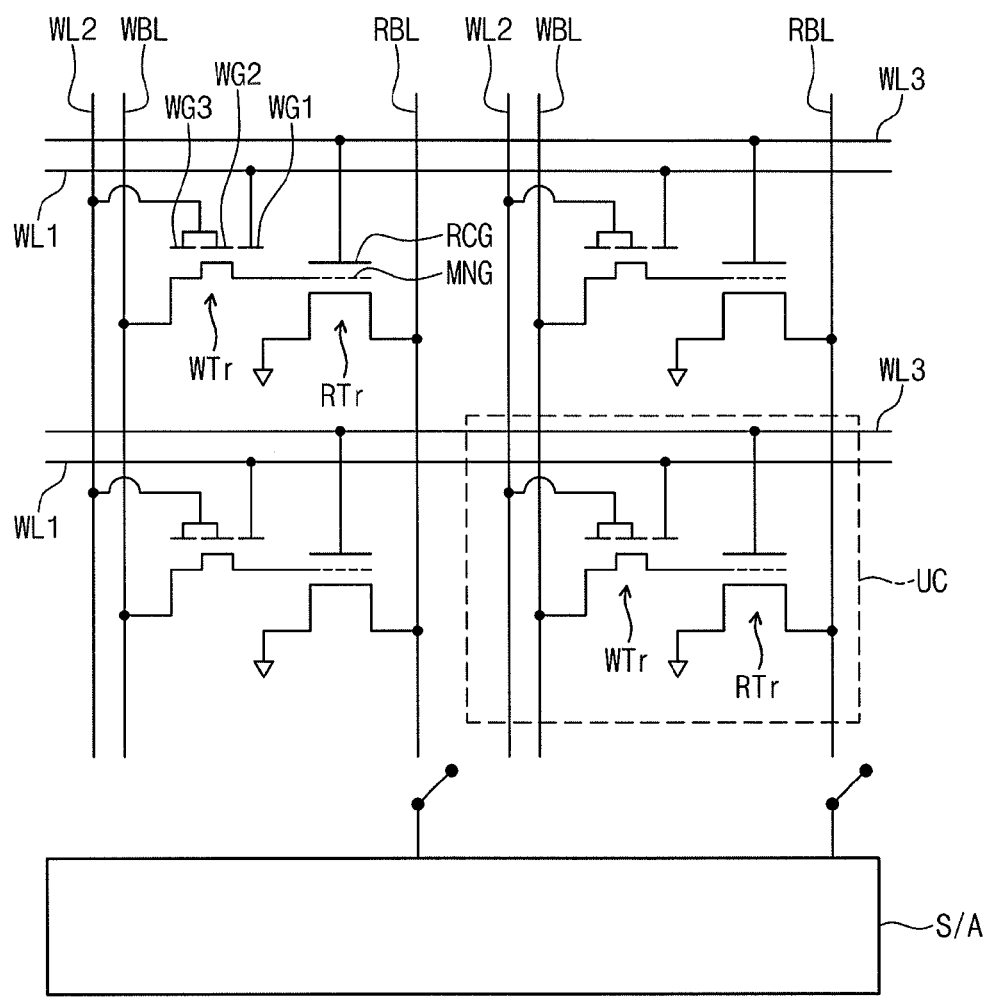
FIG. 14 illustrates an equivalent circuit diagram of another modified example of a semiconductor memory device according to other embodiments of the inventive concept.

FIG. 14 illustrates an equivalent circuit diagram of another modified example of a semiconductor memory device according to other embodiments of the inventive concept.

Referring to FIG. 14, the control gate RCG of the read transistor RTr may be connected to a third word line WL3. The third word line WL3 may be controlled independently from the first and second word lines WL1 and WL2. The third word line WL3 may be parallel to the first word line WL1. The third word line WL3 may cross the second word line WL2. In this case, a selected unit cell may be read using the third word line WL3 and the read bit line RBL connected thereto in a read operation. In some embodiments, technical characteristics of the semiconductor memory device of FIG. 10 may be applied to the semiconductor memory device of FIG. 14.

Figure 15:
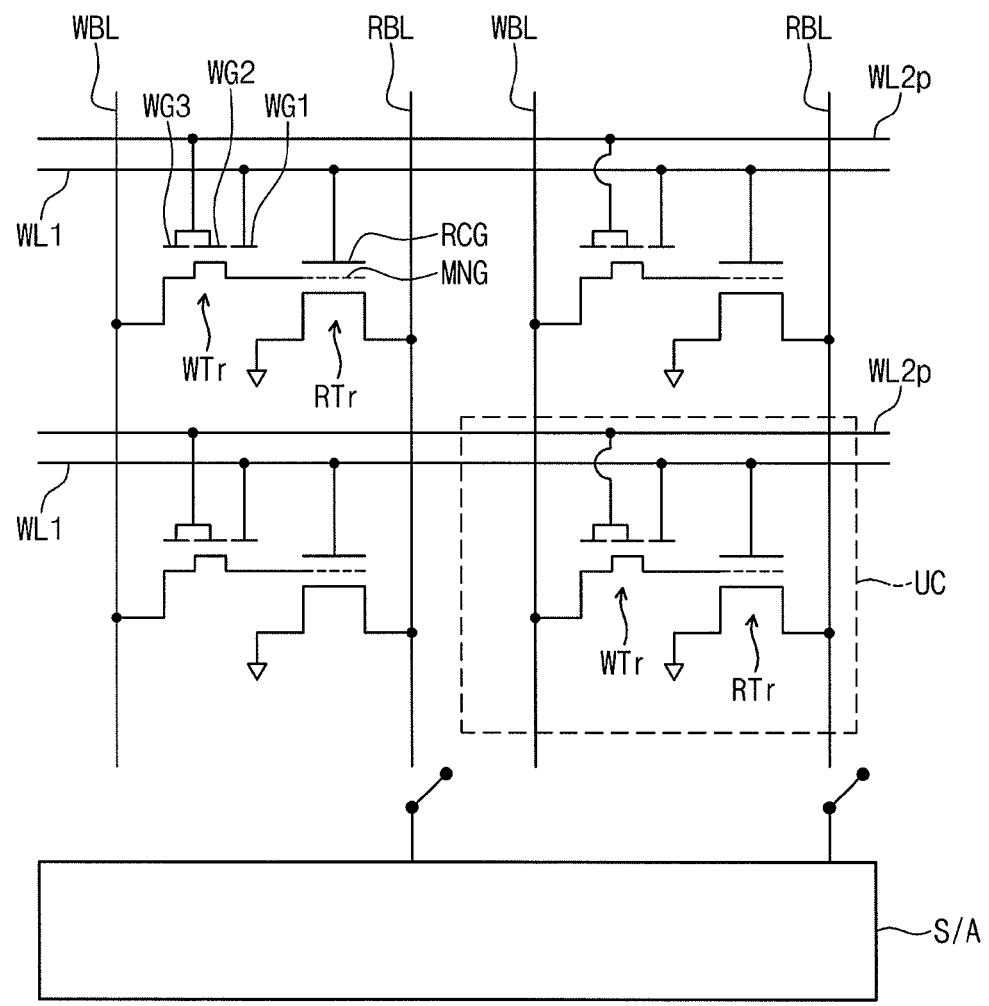
FIG. 15 illustrates an equivalent circuit diagram of still another modified example of a semiconductor memory device according to other embodiments of the inventive concept.

FIG. 15 illustrates an equivalent circuit diagram of still another modified example of a semiconductor memory device according to other embodiments of the inventive concept.

Referring to FIG. 15, as described above, the write transistor WTr includes the first to third write gates WG1, WG2, and WG3 and the first source/drain terminal (i.e., the memory node) not having a PN junction. In the present modified example, the first word line WL1 connected to the first write gate WG1 may be parallel to a second word line WL2*p* connected to the second and third write gates WG2 and WG3. The second word line WL2*p* may be controlled independently from the first word line WL1.

In a program operation, the write transistor WTr of one unit cell UC may be selected using the first and second word lines WL1 and WL2*p* and the write bit line WBL crossing the word lines WL1 and WL2*p*. In a read operation, one unit cell UC may be selected using the first word line WL1 and the read bit line RBL. In the read operation, the second word line WL2*p* is not selected, so that the write transistor WTr of the selected unit cell UC is turned-off. Thus, the data retention property of the unit cell may be improved.

In the present embodiments, the technical characteristics described above may be combined in various forms under a non-contradictable condition.

Figure 16A:
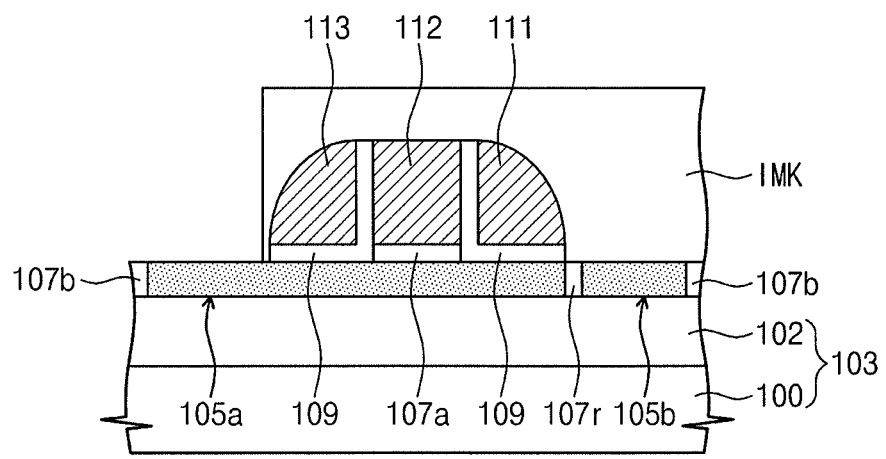
FIGS. 16A and 17A illustrate cross-sectional views taken along a line I-I' of FIG. 6A to explain stages in a method of manufacturing a semiconductor memory device illustrated in FIGS. 6A to 6E.
Figure 16B:
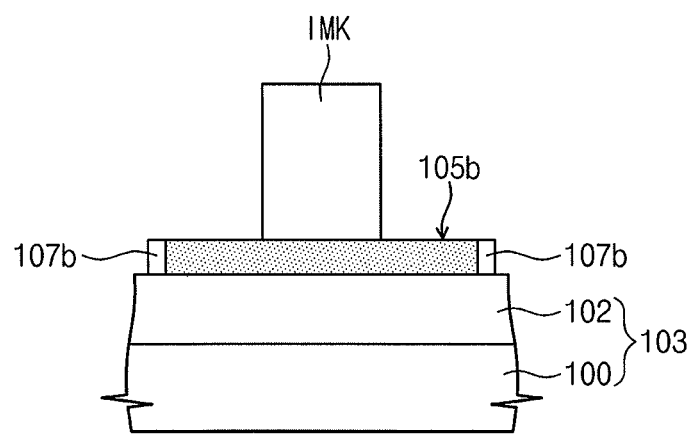
FIGS. 16B and 17B illustrate cross-sectional views taken along a line II-II' of FIG. 6A to explain stages in a method of manufacturing a semiconductor memory device illustrated in FIGS. 6A to 6E.
Figure 17A:
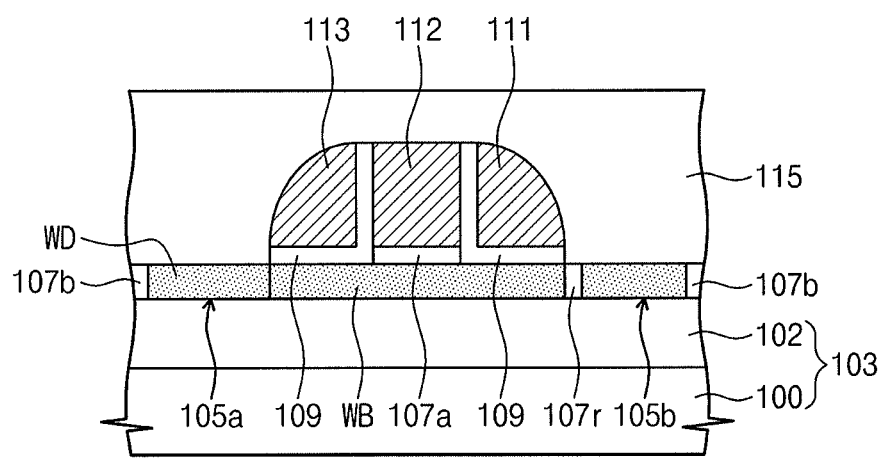
Figure 17B:
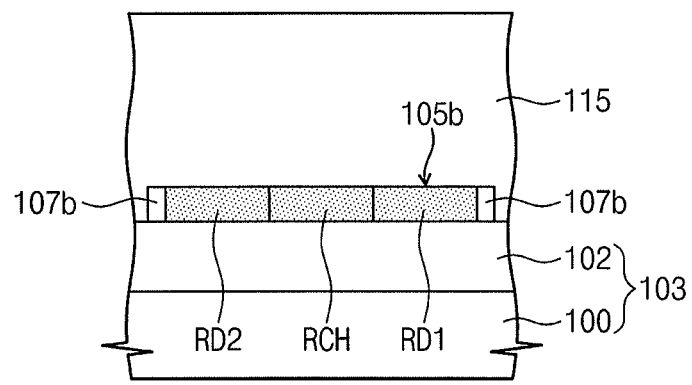

FIGS. 16A and 17A are cross-sectional views taken along a line I-I' of FIG. 6A to explain stages a method of manufacturing a semiconductor memory device illustrated in FIGS. 6A to 6E. FIGS. 16B and 17B are cross-sectional views taken along a line II-II' of FIG. 6A to explain stages in a method of manufacturing a semiconductor memory device illustrated in FIGS. 6A to 6E.

Referring to FIGS. 16A and 16B, a first active portion 105*a* and a second active portion 105*b* may be formed on a substrate 103. The substrate 103 may be a SOI substrate including a semiconductor substrate 100 and a buried oxide layer 102 disposed thereon. The first and second active portions 105*a* and 105*b* may be formed by patterning a semiconductor layer on the buried oxide layer 102 of the SOI substrate. Alternatively, a device isolation pattern may be formed on a bulk semiconductor substrate to define the first and second active portions 105*a* and 105*b*.

The first active portion 105*a* may be in an intrinsic state. Alternatively, the first active portion 105*a* may be lightly doped with dopants of a first conductivity type. The second active portion 105*b* may be doped with dopants of the first conductivity type.

First to third gate electrodes 111, 112, and 113 may be formed to cross over the first active portion 105*a*. In detail, a first dielectric layer may be formed on the substrate 103 having the first and second active portions 105*a* and 105*b*. The first dielectric layer may fill a space between the first and second active portions 105*a* and 105*b*. A first gate conductive layer may be formed on the first dielectric layer. The first gate conductive layer and the first dielectric layer may be successively patterned to form a first gate dielectric layer 107*a* and the second gate electrode 112 sequentially stacked. The first gate conductive layer may be formed of a conductive material having the second work function described with reference to FIGS. 6A to 6E. Thus, the second gate electrode 112 may have the second work function. The first dielectric layer between the first and second active portions 105*a* and 105*b* may correspond to a read-gate dielectric layer 107*r*. After the first gate conductive layer is patterned, a residual dielectric layer 107b may remain on sidewalls of the first and second active portions 105a and 105b. The residual dielectric layer 107b may be a portion of the first dielectric layer.

Subsequently, a second dielectric layer may be conformally formed on the substrate 103, and then a second gate conductive layer may be formed on the second dielectric layer. An etch-back process may be performed on the second gate conductive layer to form the first gate electrode 111 and the third gate electrode 113 on both sidewalls of the second gate electrode 112, respectively. Subsequently, the second dielectric layer may be etched to expose a top surface of the second gate electrode 112. At this time, a second gate dielectric layer 109 may be formed between the first active portion 105a and each of the first and third gate electrodes 111 and 113. The second gate dielectric layer 109 may also be formed between the second gate electrode 112 and each of the first and third gate electrodes 111 and 113. The second gate conductive layer may be formed of a conductive material having the first work function described with reference to FIGS. 6A to 6E. Thus, the first gate electrode 111 may have the first work function. Additionally, the work function of the third gate electrode 113 may be the same as the first work function.

Alternatively, after the first to third gate electrodes 111, 112, and 113 are formed, P-type and/or N-type dopants may be selectively injected into the first to third gate electrodes 111, 112, and 113 to control the work functions of the first to third gate electrodes 111, 112, and 113. In this case, it is possible to realize the third gate electrode 113 having the third work function described with reference to FIG. 7D.

After the etch-back process is performed on the second gate conductive layer, a patterning process for planar shapes of the gate electrodes 111, 112, and 113 may further be performed.

Next, an ion implantation mask pattern IMK may be formed on the substrate 103. The ion implantation mask pattern IMK may cross over the second active portion 105b. Additionally, the ion implantation mask pattern IMK may cover the first to third gate electrodes 111, 112, and 113 disposed over the first active portion 105a.

Referring to FIGS. 17A and 17B, dopants ions of a second conductivity type may be injected into the first and second active portions 105a and 105b by using the ion implantation mask pattern IMK. Thus, as illustrated in FIG. 17A, a write-doped region WD may be formed in the first active portion 105a at a side of the third gate electrode 113. Additionally, as illustrated in FIG. 17B, the first read-doped region RD1 and the second read-doped region RD2 may be formed in the second active portion 105b at both sides of the ion implantation mask pattern IMK, respectively. The read-channel region RCH may be defined in the second active portion 105a under the ion implantation mask pattern IMK.

After the doped regions WD, RD1, and RD2 are formed, the ion implantation mask pattern IMK may be removed. Subsequently, a first interlayer insulating layer 115 may be formed on an entire surface of the substrate 103. A top surface of the first interlayer insulating layer 115 may be planarized. Next, the lines WBL, WL1, WL2, and RBL, the source interconnection SI, the contact plugs WBLC, WC1, WC2, SC, and RBLC, and the interlayer insulating layers 120 and 125 of FIGS. 6A to 6E may be formed to realize the semiconductor memory device illustrated in FIGS. 6A to 6E.

FIGS. 18A to 18E are cross-sectional views taken along a line IV-IV' of FIG. 8A to explain stages in a method of manufacturing a semiconductor memory device illustrated in FIGS. 8A and 8B.

Figure 18A:
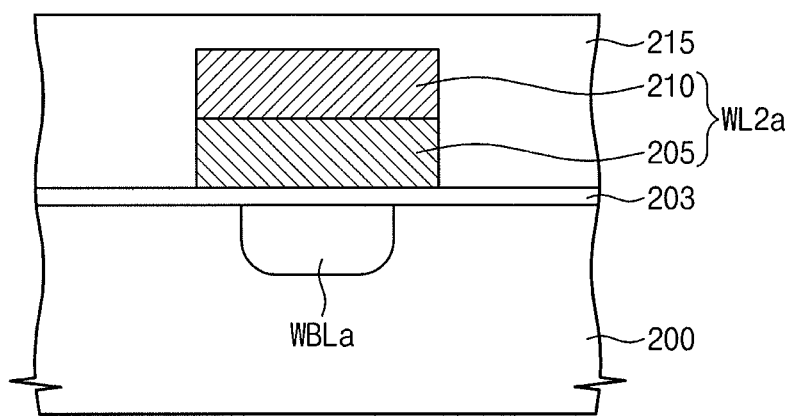
FIGS. 18A to 18E illustrate cross-sectional views taken along a line IV-IV' of FIG. 8A to explain stages in a method of manufacturing a semiconductor memory device illustrated in FIGS. 8A and 8B.

Referring to FIG. 18A, a substrate 200 may be doped with dopants of a first conductivity type. Dopants of a second conductivity type may be injected into the substrate 200 to form a write bit line WBLa. A first insulating layer 203 may be formed on the substrate 200. The second word line WL2a described with reference to FIGS. 8A and 8B may be formed on the first insulating layer 203. The second word line WL2a may be disposed over the write bit line WBLa. A second insulating layer 215 may be formed on the substrate 200 having the second word line WL2a. A top surface of the second insulating layer 215 may be planarized.

Figure 18B:
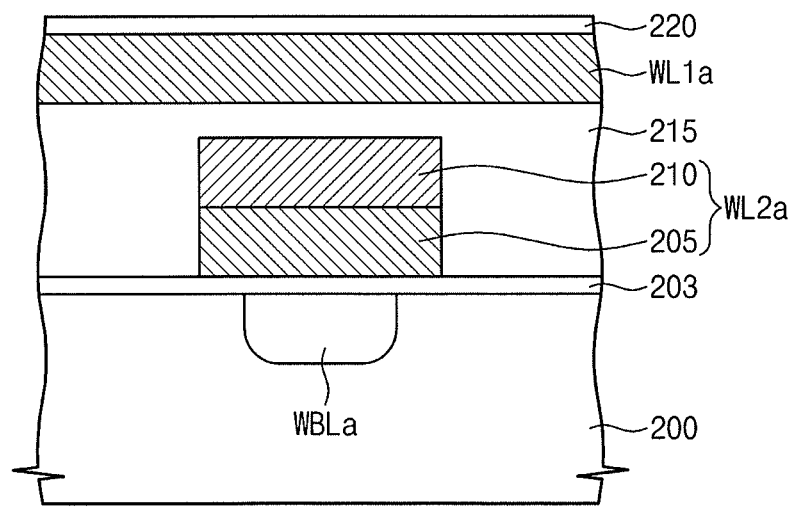

Referring to FIG. 18B, the first word line WL1a of FIGS. 8A and 8B may be formed on the second insulating layer 215. The first word line WL1a may cross over the second word line WL2a. A third insulating layer 220 may be formed on the substrate 200 having the first word line WL1a.

Figure 18C:
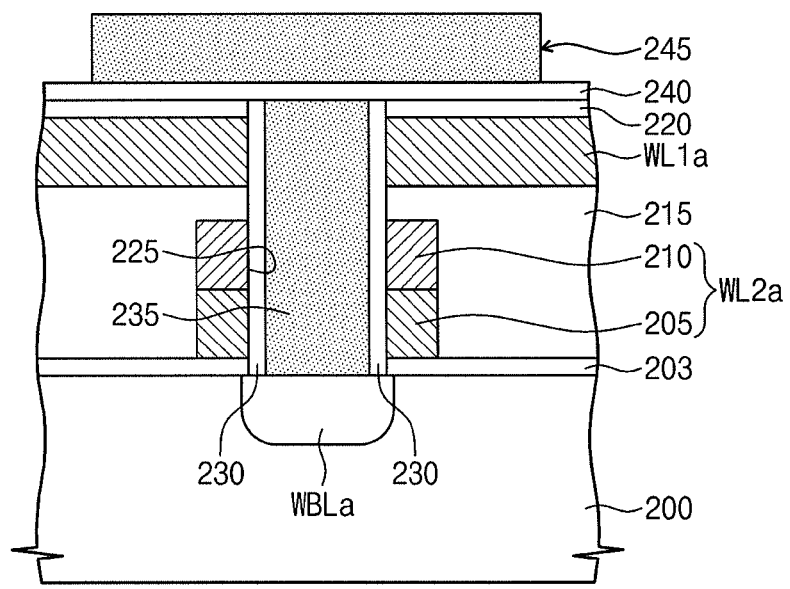

Referring to FIG. 18C, the third insulating layer 220, the first word line WL1a, the second insulating layer 215, the second word line WL2a, and the first insulating layer 203 may be successively patterned to form a vertical hole 225 exposing the write bit line WBLa. A first gate dielectric layer 230 may be conformally formed on the substrate 200 having the vertical hole 225, and then an etch-back process may be performed on the first gate dielectric layer 230. Thus, the first gate dielectric layer 230 on a bottom surface of the vertical hole 225 may be removed to expose the write bit line WBL1a under the vertical hole 225. At this time, the first gate dielectric layer 230 on an inner sidewall of the vertical hole 225 remains.

Next, a vertical active portion 235 may be formed in the vertical hole 225. The vertical active portion 235 may be formed by an epitaxial growth process using the exposed write bit line WBLa as a seed. Alternatively, a semiconductor layer may be deposited to fill the vertical hole 225, and then the deposited semiconductor layer may be planarized to form the vertical active portion 235. The vertical active portion 235 may be in an intrinsic state or may be lightly doped with dopants of the first conductivity type.

Subsequently, a second gate dielectric layer 240 may be formed on the substrate 200. The second gate dielectric layer 240 may cover a top surface of the vertical active portion 235. A horizontal active portion 245 may be formed on the second gate dielectric layer 240. The horizontal active portion 245 may be doped with dopants of the first conductivity type.

Figure 18D:
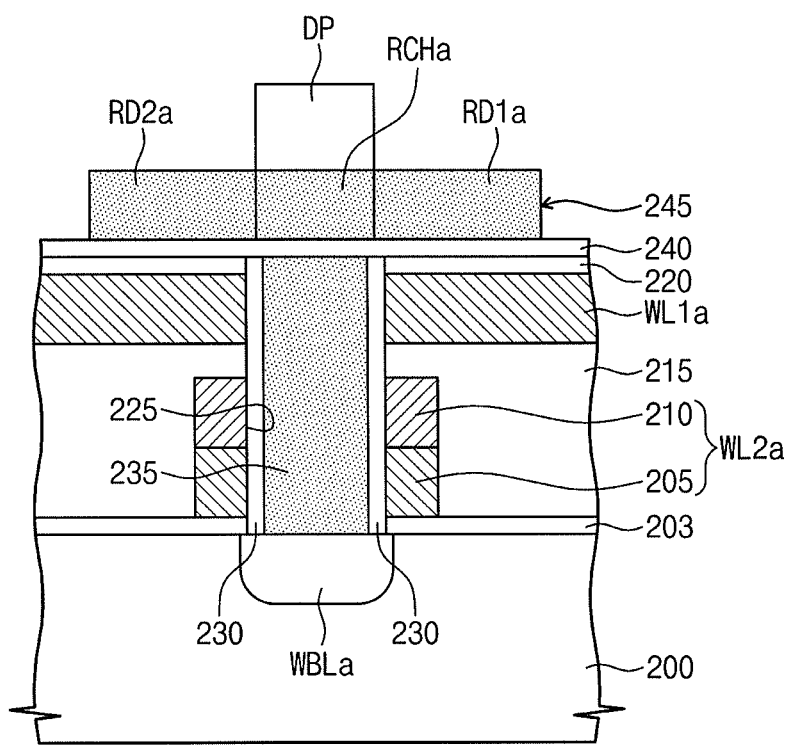

Referring to FIG. 18D, a dummy pattern DP may be formed to cross over the horizontal active portion 245. The dummy pattern DP may be disposed over the vertical active portion 235. Dopants ions of the second conductivity type may be implanted into the horizontal active portion 245 using the dummy pattern DP as an ion implantation mask. Thus, a first read-doped region RD1a and a second read-doped region RD2 may be formed in the horizontal active portion 245 at both sides of the dummy pattern DP, respectively. Additionally, a read-channel region RCHa may be defined in the horizontal active portion 245 under the dummy pattern DP.

Figure 18E:
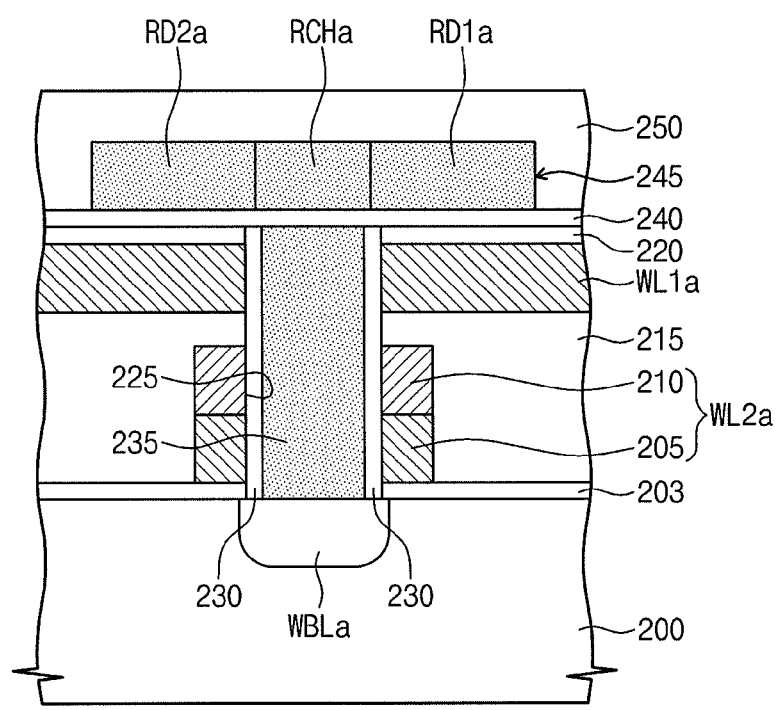

Referring to FIG. 18E, the dummy pattern DP may be removed. Subsequently, a fourth insulating layer 250 may be formed on an entire surface of the substrate 200. Next, the contact plugs SCa and RBLa, the source interconnection SIa, and the read bit line RBLa of FIGS. 8A and 8B may be formed to realize the semiconductor memory device illustrated in FIGS. 8A and 8B.

Figure 19A:
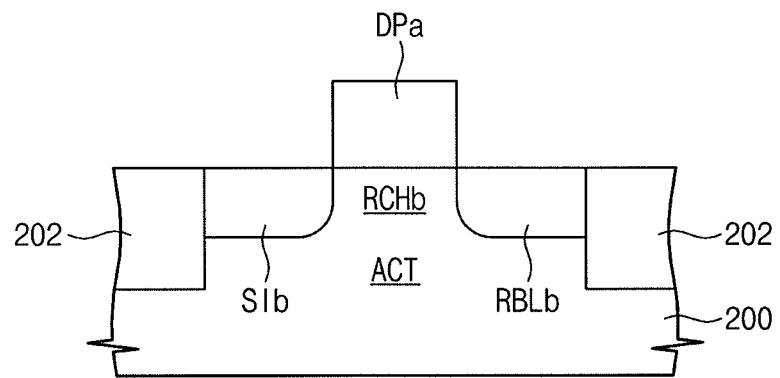
FIGS. 19A to 19C illustrate cross-sectional views taken along a line V-V' of FIG. 9A to explain stages in a method of manufacturing a semiconductor memory device illustrated in FIGS. 9A and 9B.
Figure 19B:
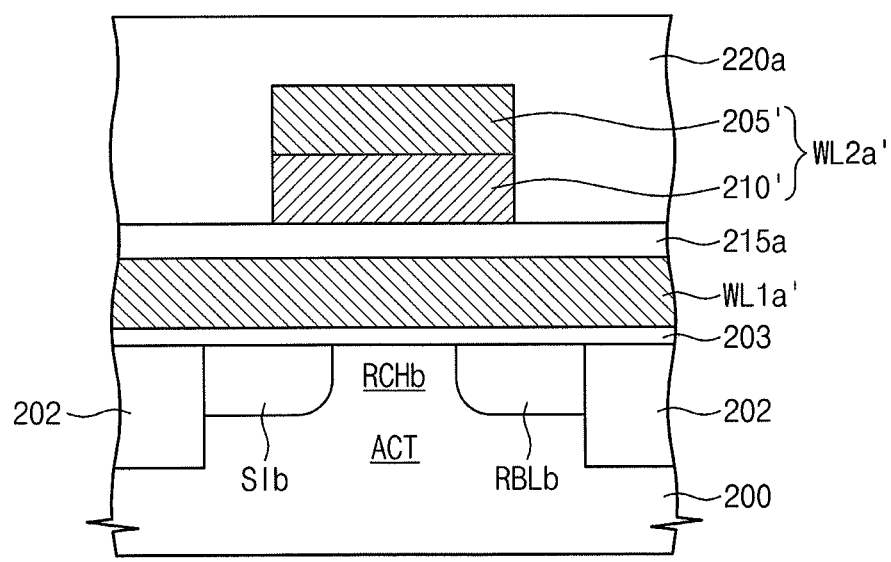
Figure 19C:
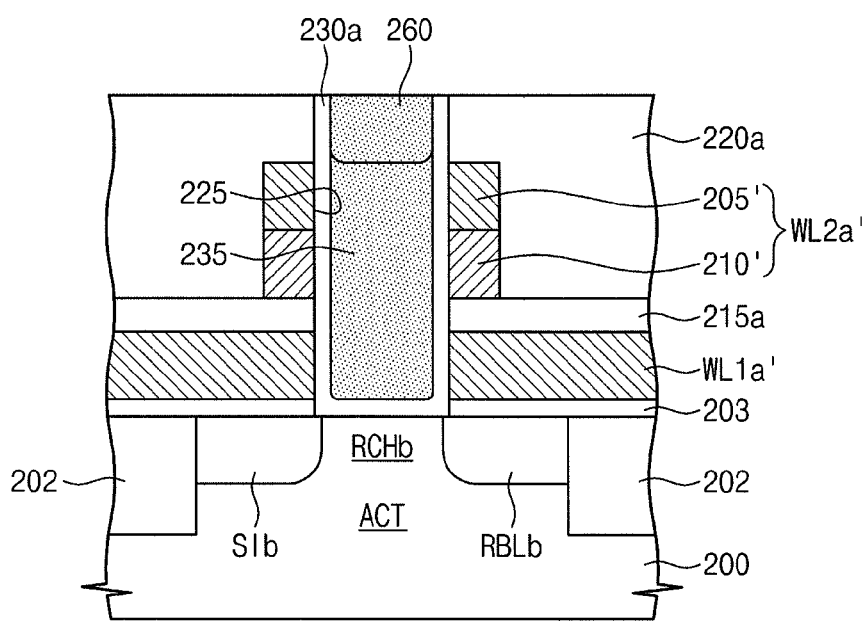

FIGS. 19A to 19C are cross-sectional views taken along a line V-V' of FIG. 9A to explain stages in a method of manufacturing a semiconductor memory device illustrated in FIGS. 9A and 9B.

Referring to FIG. 19A, a device isolation pattern 202 may be formed on a substrate 200 to define the horizontal active portion ACT illustrated in FIGS. 9A and 9B. The horizontal active portion ACT may be doped with dopants of a first conductivity type. A dummy pattern DPa may be formed to cross over the connecting portion of the horizontal active portion ACT. Dopant ions of a second conductivity type may be implanted into the horizontal active portion ACT using the dummy pattern DPa as an ion implantation mask to form the source interconnections SIb and the read bit line RBLb of FIGS. 9A and 9B. At this time, a read-channel region RCHb may be defined in the horizontal active portion ACT under the dummy pattern DPa.

Referring to FIG. 19B, the dummy pattern DPa may be removed. Subsequently, a first insulating layer 203 may be formed on an entire surface of the substrate 200. The first word line WL1a' of FIGS. 9A and 9B may be formed on the first insulating layer 203. The first word line WL1a' may cross over the source interconnection SIb and the read bit line RBLb and be disposed over the read-channel region RCHB.

A second insulating layer 215a may be formed on the substrate 200, and then the second word line WL2a' of FIGS. 9A and 9B may be formed on the second insulating layer 215a. The second word line WL2a' may cross over the first word line WL1a'. The crossing region of the first and second word lines WL1a' and WL2a' may be disposed over the read-channel region RCHb. Subsequently, a third insulating layer 220a may be formed on the substrate 200.

Referring to FIG. 19C, the third insulating layer 220a, the second word line WL2a', the second insulating layer 215a, the first word line WL1a', and the first insulating layer 203 may be successively patterned to form a vertical hole exposing the read-channel region RCHb. A gate dielectric layer 230a may be conformally formed on the substrate 200 having the vertical hole 225. The gate dielectric layer 230a may have a substantially uniform thickness on a bottom surface and an inner sidewall of the vertical hole 225. A semiconductor layer filling the vertical hole 225 may be formed on the gate dielectric layer 230a. The semiconductor layer and the gate dielectric layer 230a may be planarized to form a vertical active portion 235 in the vertical hole 225. Dopants of the second conductivity type may be provided into an upper portion of the vertical active portion 235, thereby forming a write-doped region 260.

Subsequently, the fourth insulating layer 26, the contact plug WBLb, and the write bit line WBLb of FIGS. 9A and 9B may be formed to realize the semiconductor memory device illustrated in FIGS. 9A and 9B.

Meanwhile, the semiconductor memory devices illustrated in FIGS. 11A, 12, and 13 may be manufactured by modifying the manufacture method described with reference to FIGS. 16A, 16B, 17A, and 17B, the manufacture method described with reference to FIGS. 18A to 18E, and the manufacture method described with reference to FIGS. 19A to 19C.

Third Embodiment

According to the present embodiment, a plurality of unit cells may be sequentially stacked. Thus, it is possible to realize a more highly integrated semiconductor memory device. This will be described with reference to the flowing drawings.

Figure 20:
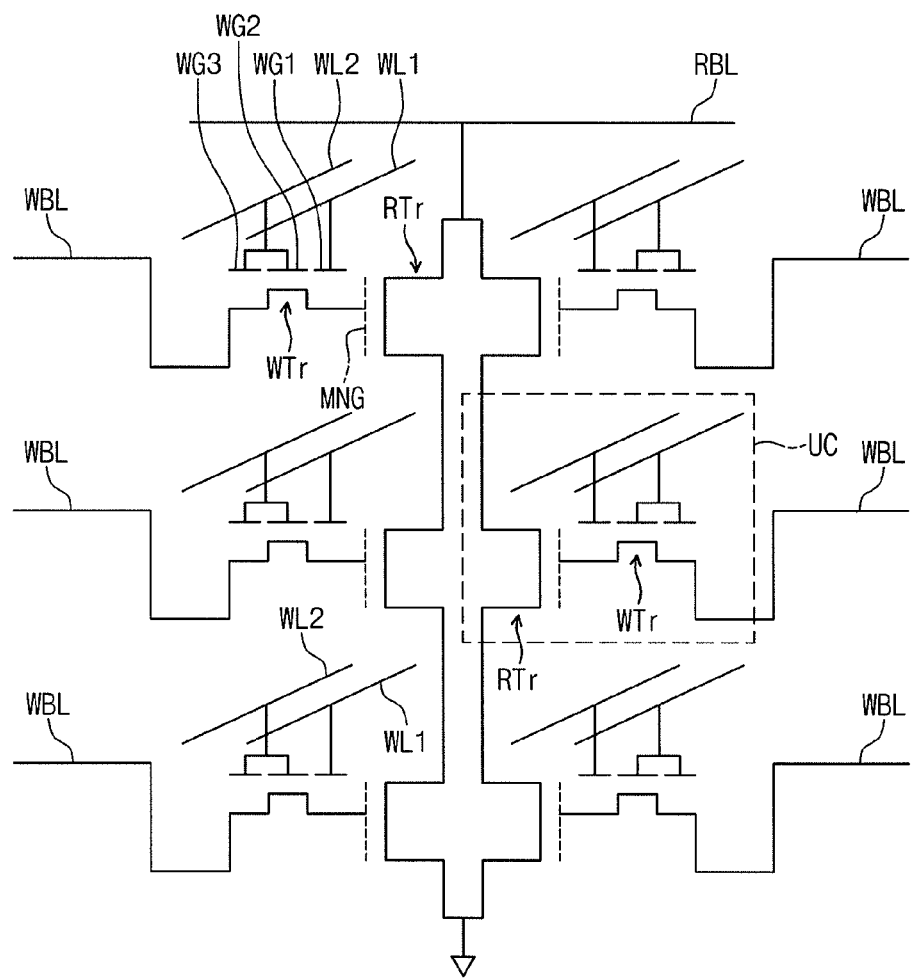
FIG. 20 illustrates an equivalent circuit diagram of a semiconductor memory device according to still other embodiments of the inventive concept.

FIG. 20 is an equivalent circuit diagram illustrating a semiconductor memory device according to still other embodiments of the inventive concept.

Referring to FIG. 20, a semiconductor memory device according to the present embodiment may include a plurality of unit cells UC sequentially stacked. Each of the unit cells UC may include a write transistor WTr and a read transistor RTr. The write transistor WTr may be a planar type transistor. The write transistor WTr may include first, second, and third write gates WG1, WG2, and WG3. The first to third write gates WG1, WG2, and WG3 of the write transistor WTr may control a first source/drain terminal, a channel region, and a second source/drain region of the write transistor WTr, respectively. The first to third write gates WG1, WG2, and WG3 may have the first work function, the second work function, and the third work function described in the second embodiment, respectively. As described in the second embodiment above, the first source/drain terminal, the channel region, and the second source/drain region of the write transistor WTr may have the same doped state (e.g., an intrinsic state or a state lightly doped with dopants of a first conductivity type). Thus, the first source/drain terminal controlled by the first write gate WG1 does not have a PN junction. A memory node corresponding to a potential well may be generated in the first source/drain terminal controlled by the first write gate WG1.

The read transistor RTr may be a vertical type transistor including a vertical channel region. A memory node gate MNG of the read transistor RTr may be connected to the first source/drain terminal of the write transistor WTr. The first write gate WG1 may further perform a function of a control gate of the read transistor RTr.

The first write gate WG1 may be connected to a first word line WL1 extending in one horizontal direction. The second and third write gates WG2 and WG3 may be connected to a second word line WL2 parallel to the first word line WL1. The first and second word lines WL1 and WL2 may be controlled independently from each other. The second source/drain terminal of the write transistor WTr may be connected to a write bit line WBL. In some embodiments, the write bit line WBL may extend in a direction crossing longitudinal directions of the first and second word lines WL1 and WL2.

The read transistors RTr of the stacked unit cells UC may be connected in series to each other. Here, one terminal of the read transistor RTr of a lowermost unit cell of the stacked unit cells UC may be connected to a common source region supplied with a reference voltage (e.g., a ground voltage). One terminal of the read transistor RTr of an uppermost unit cell of the stacked unit cells UC may be connected to a read bit line RBL. The read bit line RBL may cross the first and second word lines WL1 and WL2.

The write bit lines WBL respectively connected to the stacked unit cells UC may be controlled independently from each other. On the other hand, the stacked unit cells UC may share the read bit line RBL.

The stacked unit cells UC are defined as a cell stack. As illustrated in FIG. 20, a pair of the cell stacks may share one read bit line RBL. The pair of the cell stacks may be laterally arranged. The pair of the cell stacks may be symmetric to each other with respect to a vertical imaginary line vertically extending between the pair of the cell stacks.

During a program operation of the semiconductor memory device illustrated in FIG. 20, turn-on voltages may be respectively applied to the first and second word lines WL1 and WL2 connected to a selected unit cell, and a program voltage (or, a program current) may be applied to the write bit line WBL connected to the selected unit cell. Thus, charges may be stored in the memory node gate MNG of the selected unit cell.

During a read operation, a sensing voltage may be applied to the first word line WL1 connected to a selected unit cell. The read transistor RTr of the unit cell UC storing charges has a first threshold voltage, and the read transistor RTr of the unit cell UC not storing charges has a second threshold voltage. The sensing voltage may have a value between the first threshold voltage and the second threshold voltage. During the read operation, pass voltages may be respectively applied to the first word lines WL1 of non-selected unit cells in the cell stack including the selected unit cell. The pass voltage may turn on all of the read transistor RTr storing charges and the read transistor RTr not storing charges. Thus, all of the read transistors RTr of the non-selected unit cells in the cell stack may be turned-on, so that the read transistor RTr of the selected unit cell may be connected to the read bit line RBL. As a result, a logic data of the selected unit cell may be output through the read bit line RBL.

Meanwhile, in other embodiments, the first and second write gates WG1 and WG2 may be connected to the first word line WL1, and the third write gate WG3 may be connected to the second word line WL2.

Figure 21A:
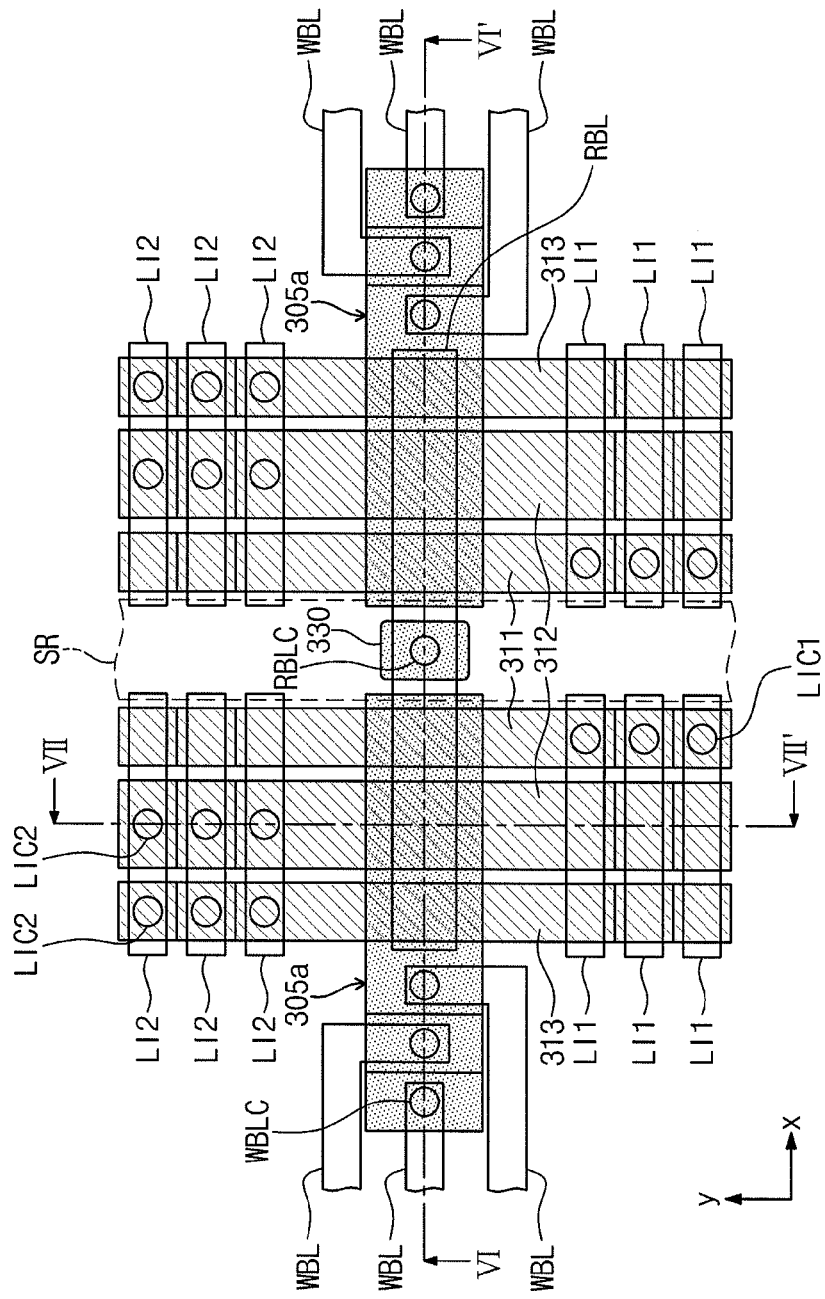
FIG. 21A illustrates a plan view of a semiconductor memory device according to still other embodiments of the inventive concept.
Figure 21B:
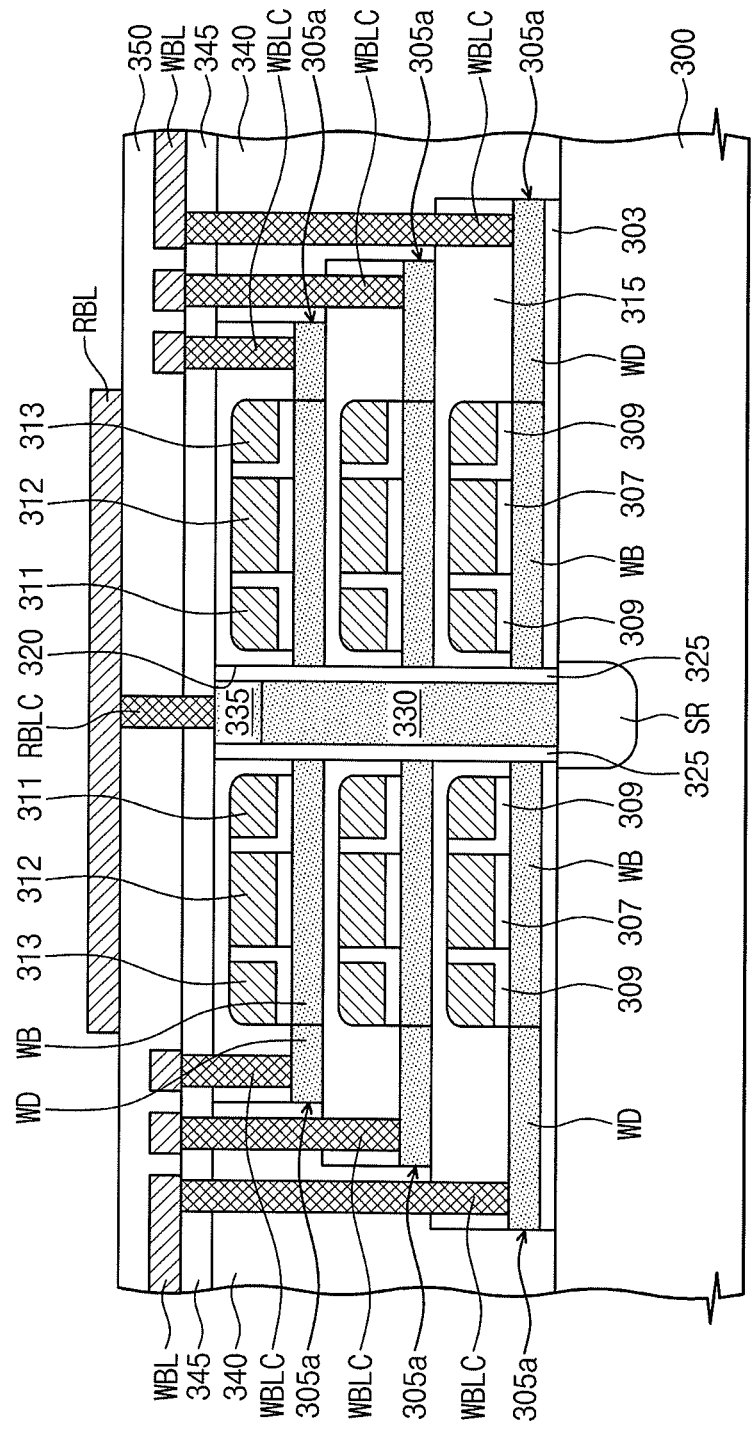
FIG. 21B illustrates a cross-sectional view taken along a line VI-VI' of FIG. 21A.
Figure 21C:
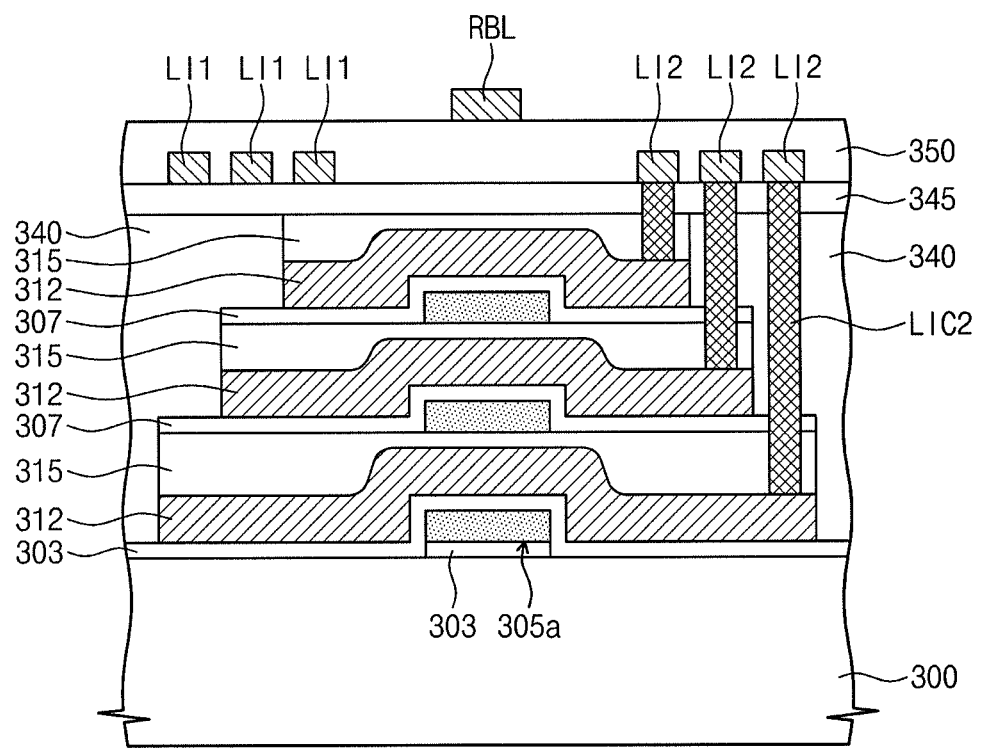
FIG. 21C illustrates a cross-sectional view taken along a line VII-VII' of FIG. 21A.

FIG. 21A is a plan view illustrating a semiconductor memory device according to still other embodiments of the inventive concept. FIG. 21B is a cross-sectional view taken along a line VI-VI' of FIG. 21A. FIG. 21C is a cross-sectional view taken along a line VII-VII' of FIG. 21A.

Referring to FIGS. 21A to 21C, a common source region SR may be disposed in a substrate 300. The substrate 300 may be a semiconductor substrate (e.g., a silicon substrate). The substrate 300 may be doped with dopants of a first conductivity type, and the common source region SR may be doped with dopants of a second conductivity type.

A plurality of write transistors may be sequentially stacked on the substrate 300.

Each of the write transistors may include a horizontal active portion 305a, and first, second, and third gate electrodes 311, 312, and 313 crossing the horizontal active portion 305a in parallel to each other. The first to third gate electrodes 311, 312, and 313 may be insulated from the horizontal active portion 305a by gate dielectric layers 307 and 309. A first gate dielectric layer 307 may be disposed between the second gate electrode 312 and the horizontal active portion 305a, and a second gate dielectric layer 309 may be disposed between the horizontal active portion 305a and each of the first and third gate electrodes 311 and 313. The second gate dielectric layer 309 may extend to be disposed between the second gate electrode 312 and each of the first and third gate electrodes 311 and 313.

The horizontal active portion 305a is formed of a semiconductor material. The horizontal active portion 305a under the first to third gate electrodes 311, 312, and 313 is defined as a body part WB. As described in the second embodiment above, the body part WB includes first, second, and third portions which are controlled by the first, second, and third gate electrodes 311, 312, and 313, respectively. The first to third portions of the body part WB have the same doped state (e.g., an intrinsic state or a state lightly doped with dopants of the first conductivity type). The first to third gate electrodes 311, 312, and 313 may be formed the same materials as the first to third gate electrodes 111, 112, and 113 described with reference to FIGS. 6A to 6E, respectively. In other words, the first, second, and third gate electrodes 311, 312, and 313 have the first work function, the second work function, and the third work function described in the second embodiment, respectively. Thus, the memory node is generated in the first portion of the body part WB under the first gate electrode 311.

A write-doped region WD may be disposed in the horizontal active portion 305a at a side of the third gate electrode 313. The write-doped region WD may be doped with dopants of the second conductivity type.

The horizontal active portions 305a of the stacked write transistors may have first sidewalls adjacent to the first gate electrodes 311, respectively. The first sidewalls of the stacked write transistors may be aligned with each other. The first sidewall of each of the horizontal active portions 305a may be a sidewall of the first portion of the body part WB. Each of the vertical active portions 305a may have a second sidewall opposite to the first sidewall. The second sidewall of the vertical active portion 305a may be a sidewall of the write-doped region WD.

A vertical active portion 330 may be disposed beside the first sidewalls of the horizontal active portions 305a of the stacked write transistors. A read-gate dielectric layer 325 may be disposed between the vertical active portion 330 and the first sidewalls of the stacked horizontal active portions 305a. The vertical active portion 330 may be connected to the common source region SR. The vertical active portion 330 is formed of a semiconductor material. The vertical active portion 330 may be in an intrinsic state or be doped with dopants of the first conductivity type.

A common drain region 335 may be disposed in an upper portion of the vertical active portion 330. The common drain region 335 may be doped with dopants of the second conductivity type. A bottom surface of the common drain region 335 may be located at the same height as or a height higher than a top surface of an uppermost active portion of the stacked horizontal active portions 305a, i.e., further from the substrate 300.

The stacked write transistors are defined as a write transistor-stack. As illustrated in FIGS. 21A and 21B, a pair of the write transistor-stacks may be disposed at both sides of the vertical active portion 330, respectively. The pair of write transistor-stacks may be substantially symmetric to each other with respect to the vertical active portion 330.

As illustrated in FIG. 21B, the write-doped regions WD of the stacked write transistors may constitute a stepped structure. Likewise, first ends of the second gate electrodes 312 of the stacked write transistors may also constitute a stepped structure as illustrated in FIGS. 21A and 21C. Additionally, second ends of the second gate electrodes 312 of the stacked write transistors may also constitute a stepped structure. Likewise, one ends of the first gate electrodes 311 of the stacked write transistors may also constitute a stepped structure, and one ends of the third gate electrodes 313 of the stacked write transistors may also constitute a stepped structure.

A buffer insulating layer 303 may be disposed between the substrate 300 and the horizontal active portion 305a of the lowermost write transistor of the stacked write transistors. The stacked write transistors may be insulated from each other by insulating layers 315 therebetween. The buffer insulating layer 303 and the insulating layers 315 may include an oxide, a nitride, and/or an oxynitride. A planarized insulating layer 340 may cover one ends of the horizontal active portions 305a and both ends of the gate electrodes 311, 312, and 313. A first interlayer insulating layer 345 may covers the write transistors, the vertical active portion 330 and the planarized insulating layer 340.

As illustrated in FIGS. 21A and 21B, write bit lines WBL may be disposed on the first interlayer insulating layer 345. The write bit lines WBL may be electrically connected to the stacked write-doped regions WD constituting the stepped structure through write bit line-contact plugs WBLC, respectively.

As illustrated in FIGS. 21A and 21C, first local interconnections LI1 and second local interconnections LI2 may be disposed on the first interlayer insulating layer 345. The first local interconnections LI1 may be electrically connected to a first end of the first gate electrodes 311 of the stacked write transistors through first local contact plugs LIC1, respectively. The second local interconnections LI2 may be electrically connected to a second end, opposite the first end, of the second gate electrodes 312 of the stacked write transistors, respectively. Additionally, the second local interconnections LI2 may be electrically connected to the second end of the third gate electrodes 313 of the stacked write transistors, respectively. Each of the second local interconnections LI2 may be electrically connected to the second and third gate electrodes 312 and 313 of each of the write transistors through second local contact plugs LIC2.

A second interlayer insulating layer 350 may be disposed on the write bit lines WBL, the local interconnections LI1 and LI2, and the first interlayer insulating layer 345. A read bit line RBL may be disposed on the second inter layer insulating layer 350. The read bit line RBL may be electrically connected to a top end of the vertical active portion 330 through a read bit line-contact plug RBLC. The read bit line-contact plug RBLC may be connected to the common drain region 335.

A portion of the vertical active portion 330 adjacent to each of the write transistors may correspond to the channel region and source/drain terminals of the read transistor RTr of FIG. 20. Thus, each of the write transistors and the vertical active portion 330 adjacent thereto may constitute a unit cell. The memory node generated in the first portion of the body part WB of the write transistor may correspond to the first source/drain terminal of the write transistor and the memory node gate MNG of the read transistor which are included in the unit cell.

The lines WBL and RBL and the local interconnections LI1 and LI2 described above may be modified in various forms. Non-described elements of the above elements may be formed the same materials as corresponding elements in the aforementioned second embodiment, respectively.

According to the semiconductor memory device described above, each of the unit cells may include the write transistor and the read transistor, and a plurality of the unit cells may be vertically stacked on the substrate 300. Thus, a more highly integrated semiconductor memory device may be realized.

Figure 22A:
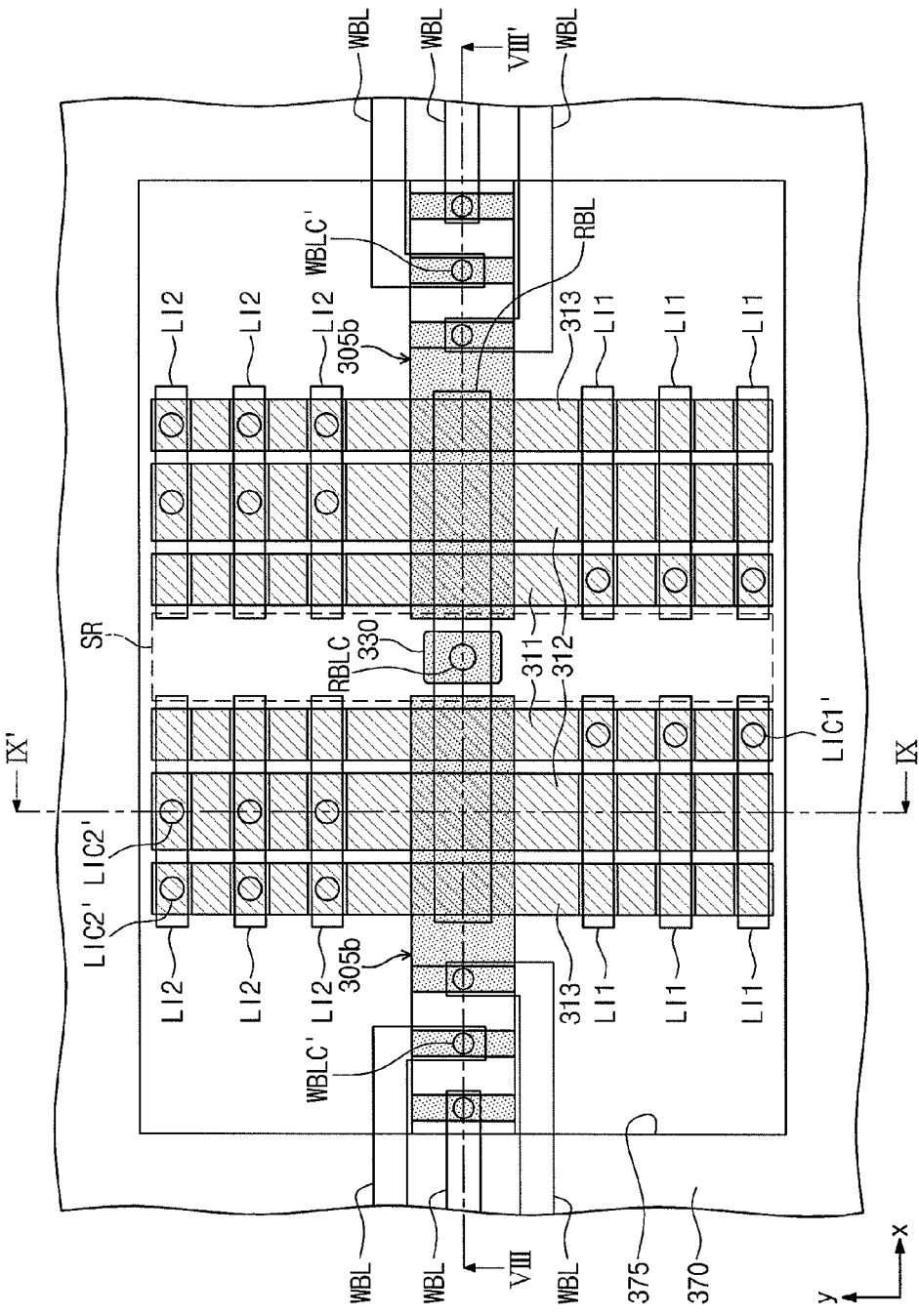
FIG. 22A illustrates a plan view of a modified example of a semiconductor memory device according to still other embodiments of the inventive concept.
Figure 22B:
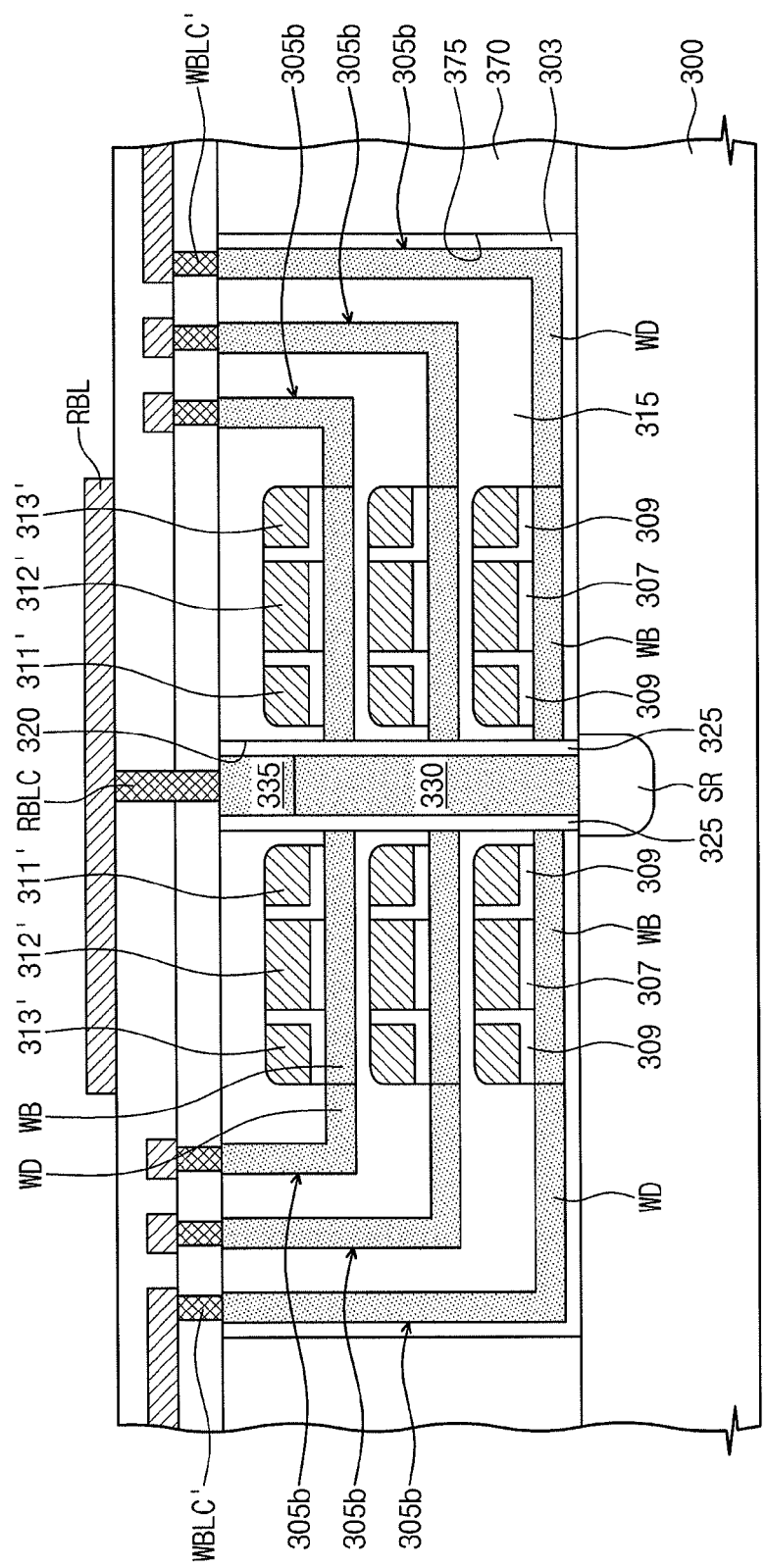
FIG. 22B illustrates a cross-sectional view taken along a line VIII-VIII' of FIG. 22A.
Figure 22C:
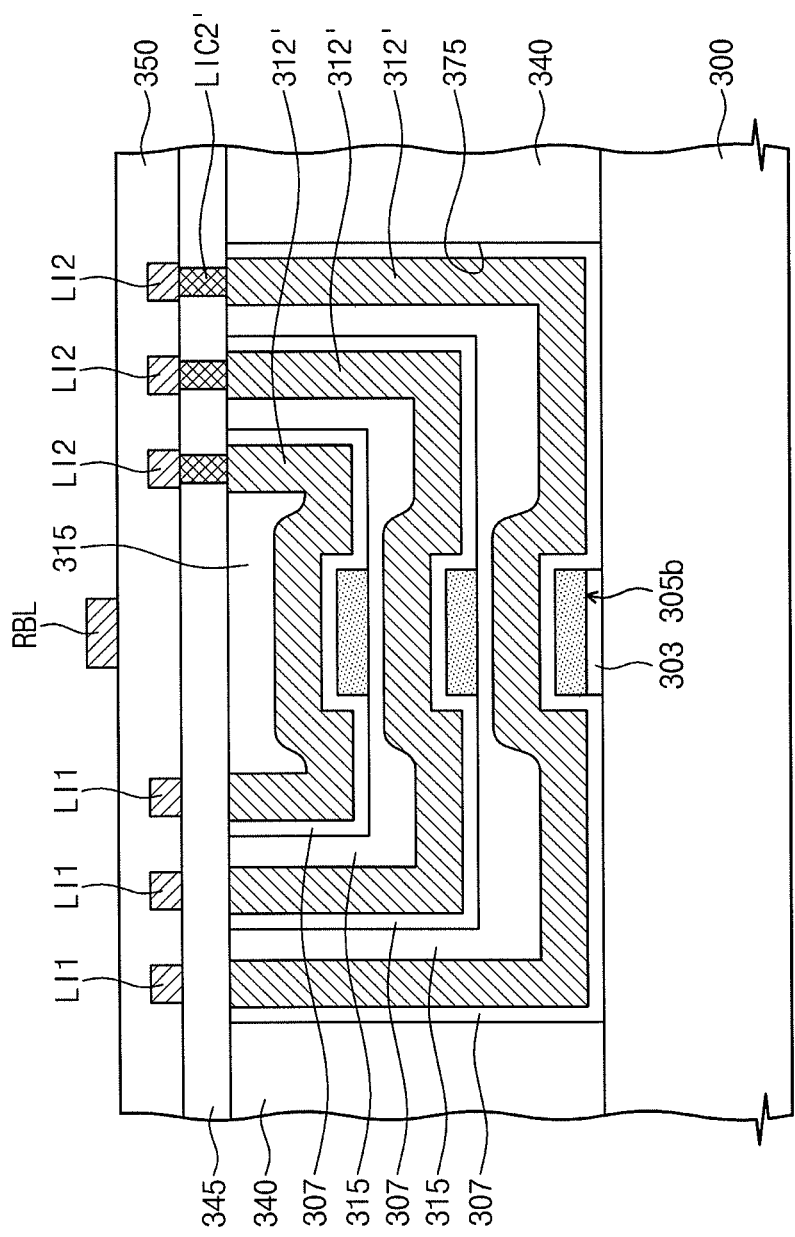
FIG. 22C illustrates a cross-sectional view taken along a line IX-IX' of FIG. 22A.

FIG. 22A is a plan view illustrating a modified example of a semiconductor memory device according to still other embodiments of the inventive concept. FIG. 22B is a cross-sectional view taken along a line VIII-VIII' of FIG. 22A. FIG. 22C is a cross-sectional view taken along a line IX-IX' of FIG. 22A.

Referring to FIGS. 22A, 22B, and 22C, a semiconductor substrate 300 may include a trench 375. For example, a structure 370 having the trench 375 may be disposed on the semiconductor substrate 300. The structure 370 may be formed of an insulating material (e.g., an oxide). Alternatively, the structure 370 may be a portion of the semiconductor substrate 300. In other words, the trench 375 may be formed by patterning the semiconductor substrate 300.

A common source region SR may be disposed under a bottom surface of the trench 375. Stacked write transistors and a vertical active portion 330 may be disposed in the trench 375. Each of the write transistors may include a horizontal active portion 305b, and first, second, and third gate electrodes 311', 312', and 313' crossing over the horizontal active portion 305b in parallel to each other. The horizontal active portion 305b may include a body part WB under the first to third gate electrodes 311', 312', and 313'. A write-doped region WD may be disposed in the horizontal active portion 305b at a side of the third gate electrode 313'.

A portion of the horizontal active portion 305b in which the write-doped region WD is formed may extend along the bottom surface a first inner sidewall of the trench 375. Thus, the horizontal active portion 305b may have a landing surface substantially coplanar with a top surface of the structure 370. The landing surface may be formed of the write-doped region WD.

The extensions of the horizontal active portions 305b of the stacked write transistors may be sequentially stacked on the first inner sidewall of the trench 375. Insulating layers 315 may be disposed between the extensions of the horizontal active portion 305b.

The trench 375 may have a second inner sidewall opposite to the first inner sidewall. As illustrated in FIGS. 22A and 22B, a pair of write transistor-stacks may be disposed in the trench 375. The extensions of the horizontal active portions 305b of a first write transistor-stack may be sequentially stacked on the first inner sidewall of the trench 375, and the extensions of the horizontal active portions 305b of a second write transistor-stack may be sequentially stacked on the second inner sidewall of the trench 375.

The trench 375 may further have a third inner sidewall and a fourth inner sidewall which may be perpendicular to the first and second inner sidewalls. As illustrated in FIGS. 22A and 22C, first ends of the second gate electrodes 312' of the stacked write transistors may extend along the bottom surface and the third inner sidewall of the trench 375 so as to be sequentially stacked on the third inner sidewall. Thus, the stacked second gate electrodes 312' may have first landing surfaces substantially coplanar with each other. In other words, the first landing surfaces may be sequentially stacked on the third inner sidewall of the trench 375. The insulating layers 315 may be disposed between the first landing surfaces of the stacked second gate electrodes 312'. Second ends of the stacked second gate electrodes 312' may extend along the bottom surface and the fourth inner sidewall of the trench 375 so as to be sequentially stacked on the fourth inner sidewall. Thus, the stacked second gate electrodes 312' may have second landing surfaces substantially coplanar with each other.

In other words, the second landing surfaces may be sequentially stacked on the fourth inner sidewall of the trench 375. The insulating layers 315 may also be disposed between the second landing surfaces of the stacked second gate electrodes 312'. Likewise, the first gate electrodes 311' of the stacked write transistors may have first landing surfaces sequentially stacked on the third inner sidewall and coplanar with each other, and second landing surfaces sequentially stacked on the fourth inner sidewall and coplanar with each other. And the third gate electrodes 313' of the stacked write transistors may have first landing surfaces sequentially stacked on the third inner sidewall and coplanar with each other, and second landing surfaces sequentially stacked on the fourth inner sidewall and coplanar with each other.

A first interlayer insulating layer 345 may be disposed on the substrate 300, and write bit lines WBL and local interconnections LI1 and LI2 may be disposed on the first interlayer insulating layer 345. The write bit lines WBL may be connected to the landing surfaces of the stacked horizontal active portions 305b through write bit line-contact plugs WBLC', respectively. Here, the landing surfaces of the stacked horizontal active portions 305b may be substantially coplanar with each other, so that the write bit line-contact plugs WBLC' may have heights substantially equal to each other. Likewise, the first local interconnections LI1 may be connected to the first landing surfaces of the stacked first gate electrodes 311' through first local contact plugs LIC1', respectively. The second local interconnections LI2 may be connected to the second landing surfaces of the stacked second gate electrodes 312' and the second landing surfaces of the stacked third gate electrodes 313' through second local contact plugs LIC2', respectively. Here, the landing surfaces of the gate electrodes 311', 312', and 313' may be substantially coplanar with each other, so that the first and second local contact plugs LIC1' and LIC2' may have heights substantially equal to each other.

FIGS. 23A to 26A are cross-sectional views taken along a line VI-VI' of FIG. 21A to explain stages in a method of manufacturing a semiconductor memory device illustrated in FIGS. 21A to 21C. FIGS. 23B to 26B are cross-sectional views taken along a line VII-VII' of FIG. 21A to explain stages in a method of manufacturing a semiconductor memory device illustrated in FIGS. 21A to 21C.

Figure 23A:
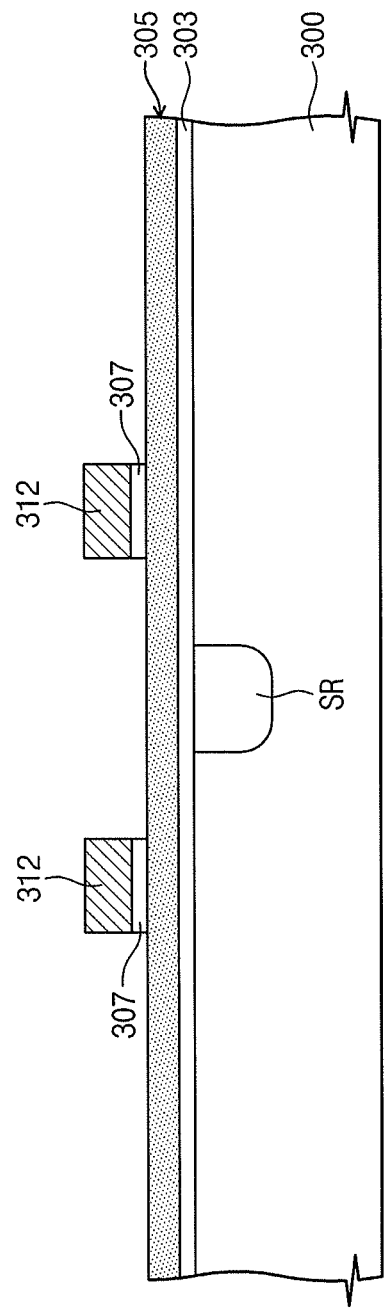
Figure 23B:
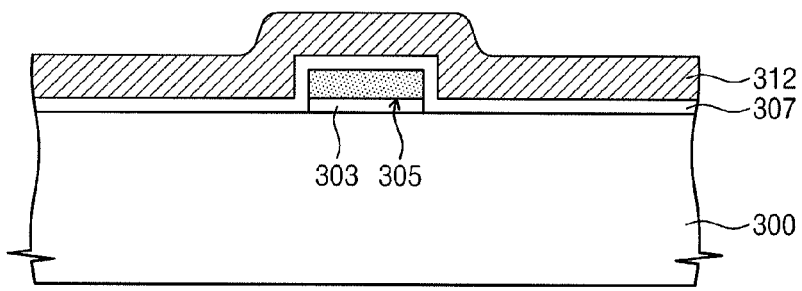

Referring to FIGS. 23A and 23B, the common source region SR may be formed in the substrate 300, and the buffer insulating layer 303 may be formed on the substrate 300. A preliminary horizontal active portion 305 extending in one direction may be formed on the buffer insulating layer 303. The first gate dielectric layer 307 and the second gate electrode 312 may be sequentially formed on the preliminary horizontal active portion 305. The second gate electrode 312 may cross over the preliminary horizontal active portion 305. A pair of the second gate electrodes 312 may be formed on the preliminary horizontal active portion 305.

Figure 24A:
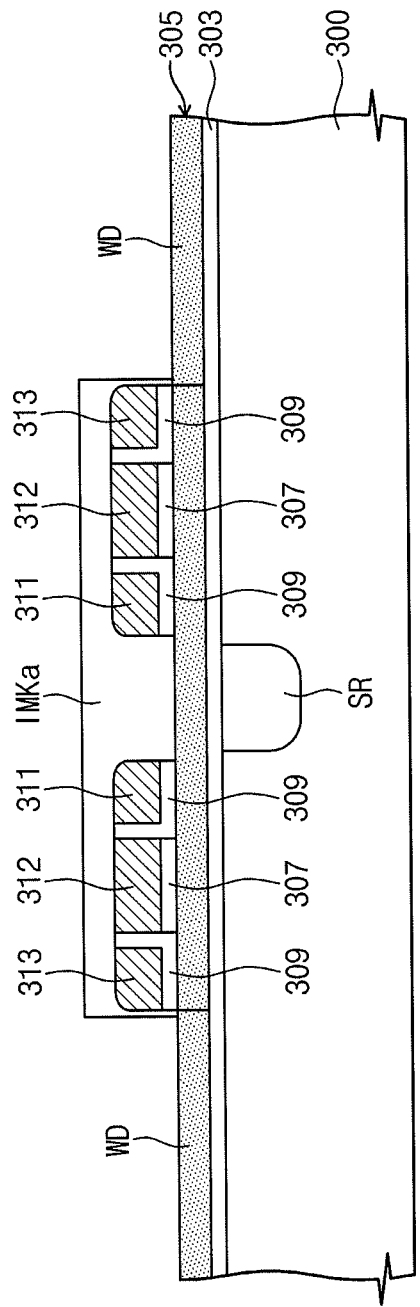
Figure 24B:
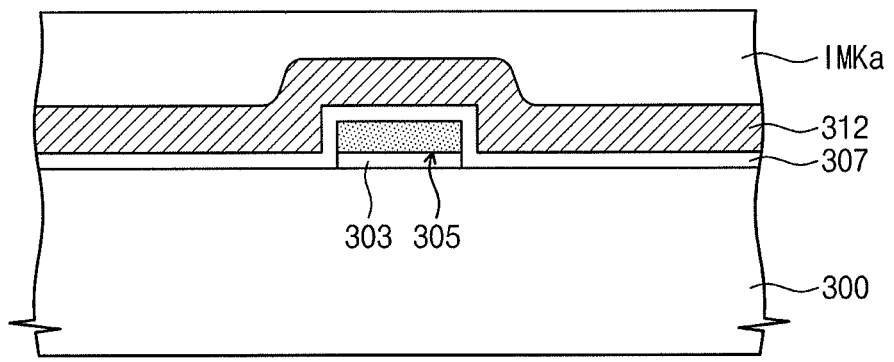

Referring to FIGS. 24A and 24B, the second gate dielectric layer 309 may be conformally formed on the substrate 300 and then a gate conductive layer may be formed on the second gate dielectric layer 309. The gate conductive layer and the second gate dielectric layer 309 may be etched-back to form the first gate electrode 311 and the third gate electrode 313 on both sidewalls of each of the second gate electrodes 312, respectively. The first and third gate electrodes 311 and 313 may also cross over the preliminary horizontal active portion 305. The first to third gate electrodes 311, 312, and 313 adjacent to each other are defined as a gate group. In other words, a pair of the gate groups may be formed on the preliminary horizontal active portion 305. The pair of the gate groups may be symmetric to each other with respect to the common source region SR.

Subsequently, an ion implantation mask pattern IMKa may be formed. The ion implantation mask pattern IMKa may cover the pair of the gate groups and the preliminary horizontal active portion 305 between the pair of the gate groups. Dopants of the second conductivity type may be injected using the ion implantation mask pattern IMKa as a mask, thereby forming the write-doped regions WD in the preliminary horizontal active portion 305.

Figure 25A:
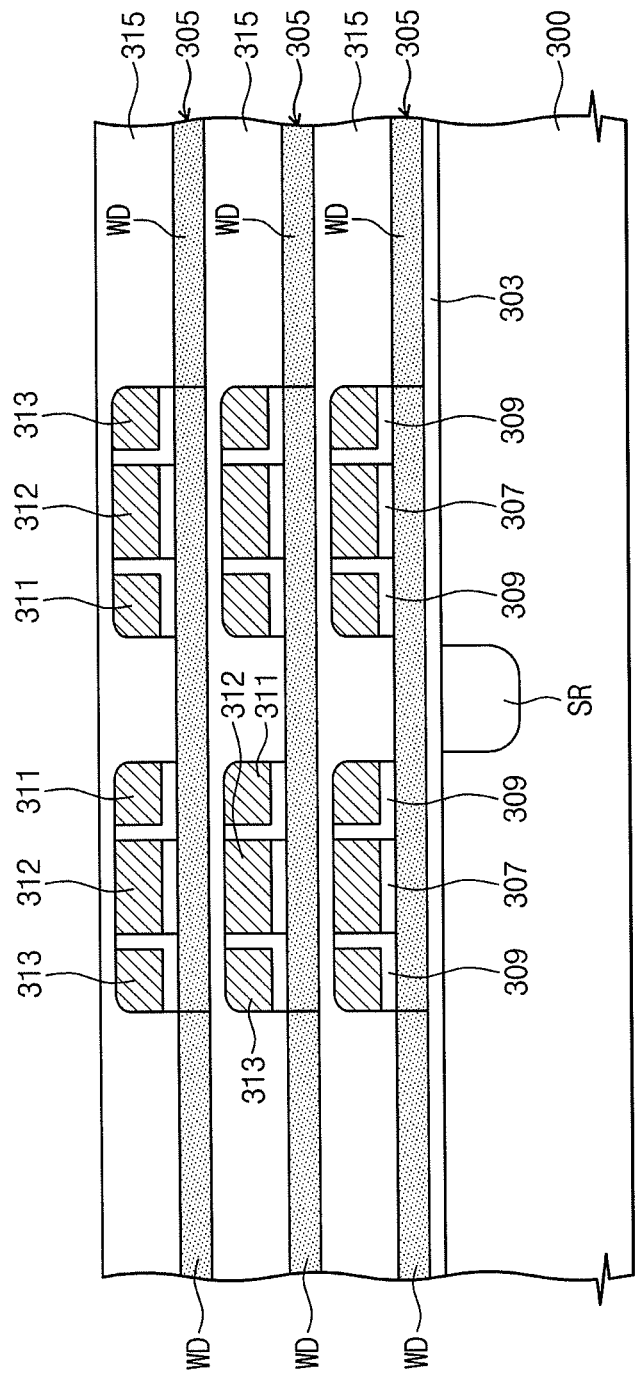
Figure 25B:
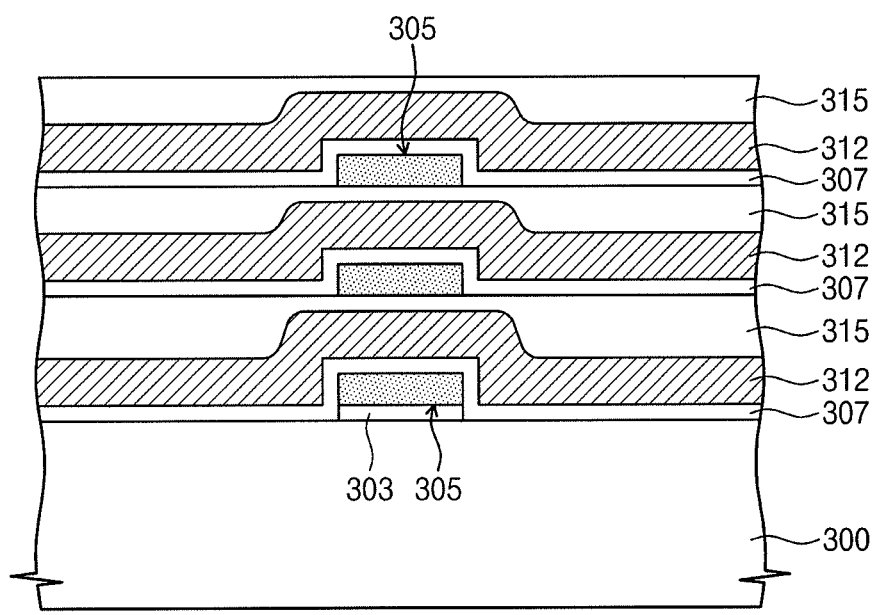

Referring to FIGS. 25A and 25B, the ion implantation mask pattern IMKa may be removed. Subsequently, the insulating layer 315 may be formed on the substrate 300. The preliminary horizontal active portion 305, the pair of the gate groups, the gate dielectric layers 307 and 309, and the insulating layer 315 are defined as a floor-structure. The process described with reference to FIGS. 23A, 23B, 24A, and 24B and the process forming the insulating layer 315 may be repeatedly performed to form a plurality of the floor-structures sequentially stacked.

Figure 26A:
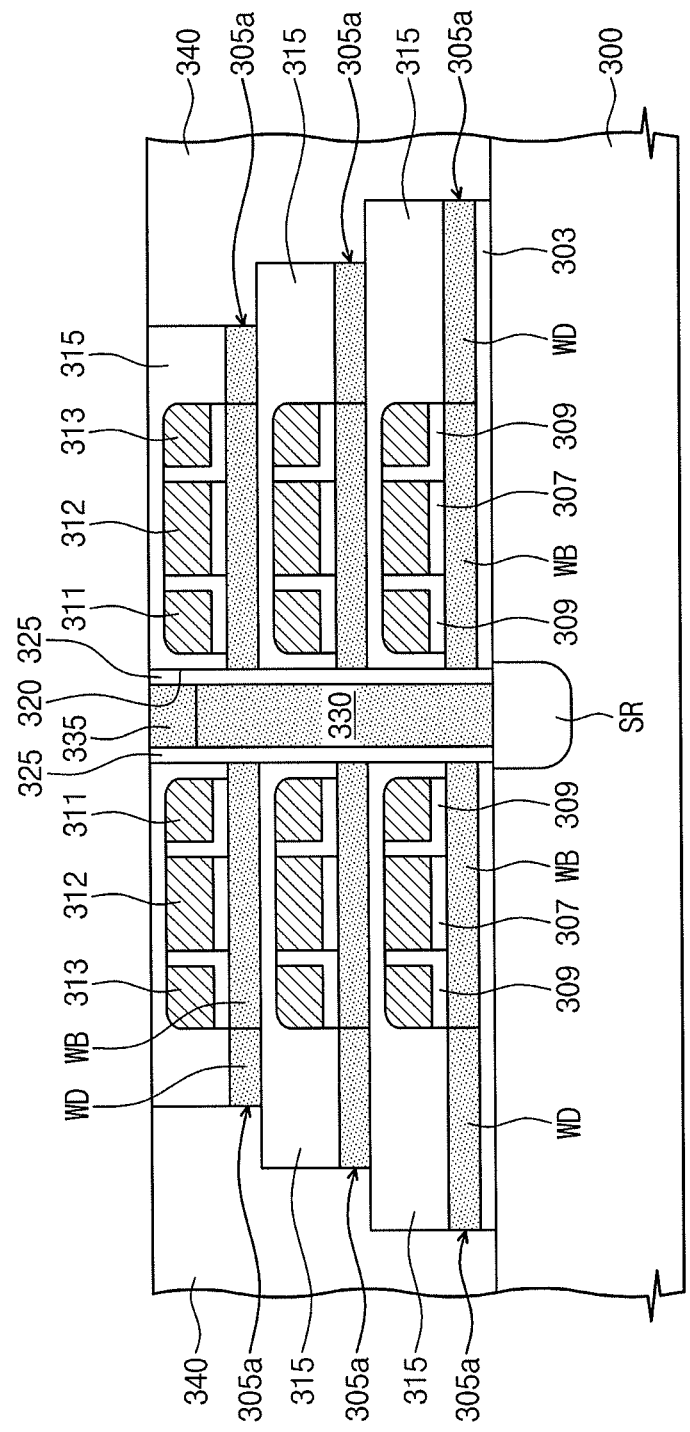
Figure 26B:
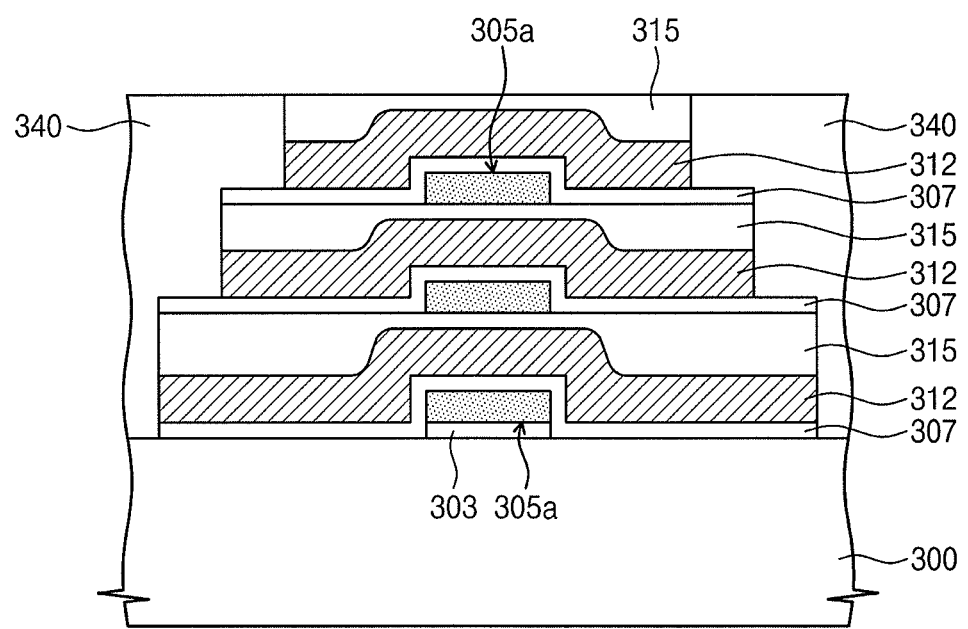

Referring to FIGS. 26A and 26B, the insulating layers 315 and the preliminary horizontal active portions 305 of the stacked floor-structures may be successively patterned to form a vertical hole 320 exposing the common source region SR. The preliminary horizontal active portions 305 may be formed into the horizontal active portions 305a including the body parts WB by the formation of the vertical hole 320.

The read-gate dielectric layer 325 may be conformally formed on the substrate 300 having the vertical hole 320 and then the read-gate dielectric layer 325 may be etched-back to expose the common source region SR. Subsequently, the vertical active portion 330 may be formed in the vertical hole 320. The vertical active portion 330 may be in contact with the common source region SR. Dopants of the second conductivity type may be injected into an upper portion of the vertical active portion 330 to form the common drain region 335.

As illustrated in FIG. 26A, one end portions of the stacked horizontal active portions 305a in which the write-doped regions WD are formed may be patterned to form a stepped structure. As illustrated in FIG. 26B, both end portions of the stacked first gate electrodes 311, the stacked second gate electrodes 312, and the stacked third gate electrodes 313 may be patterned to form stepped structures. Subsequently, an insulating layer may be formed on the substrate 300 and then the insulating layer may be planarized until the top surface of the vertical active portion 330 is exposed. Thus, the planarized insulating layer 340 may be formed.

Subsequently, the interlayer insulating layers 345 and 350, the lines WBL and RBL, the local interconnections LI1 and LI2, and the contact plugs WBLC, LIC1, LIC2, and RBLC of FIGS. 21A to 21C may be formed to realize the semiconductor memory device illustrated in FIGS. 21A to 21C.

FIGS. 27A to 29A are cross-sectional views taken along a line VIII-VIII' of FIG. 22A to explain stages in a method of manufacturing a semiconductor memory device illustrated in FIGS. 22A to 22C. FIGS. 27B to 29B are cross-sectional views taken along a line IX-IX' of FIG. 22A to explain stages in a method of manufacturing a semiconductor memory device illustrated in FIGS. 22A to 22C.

Figure 27A:
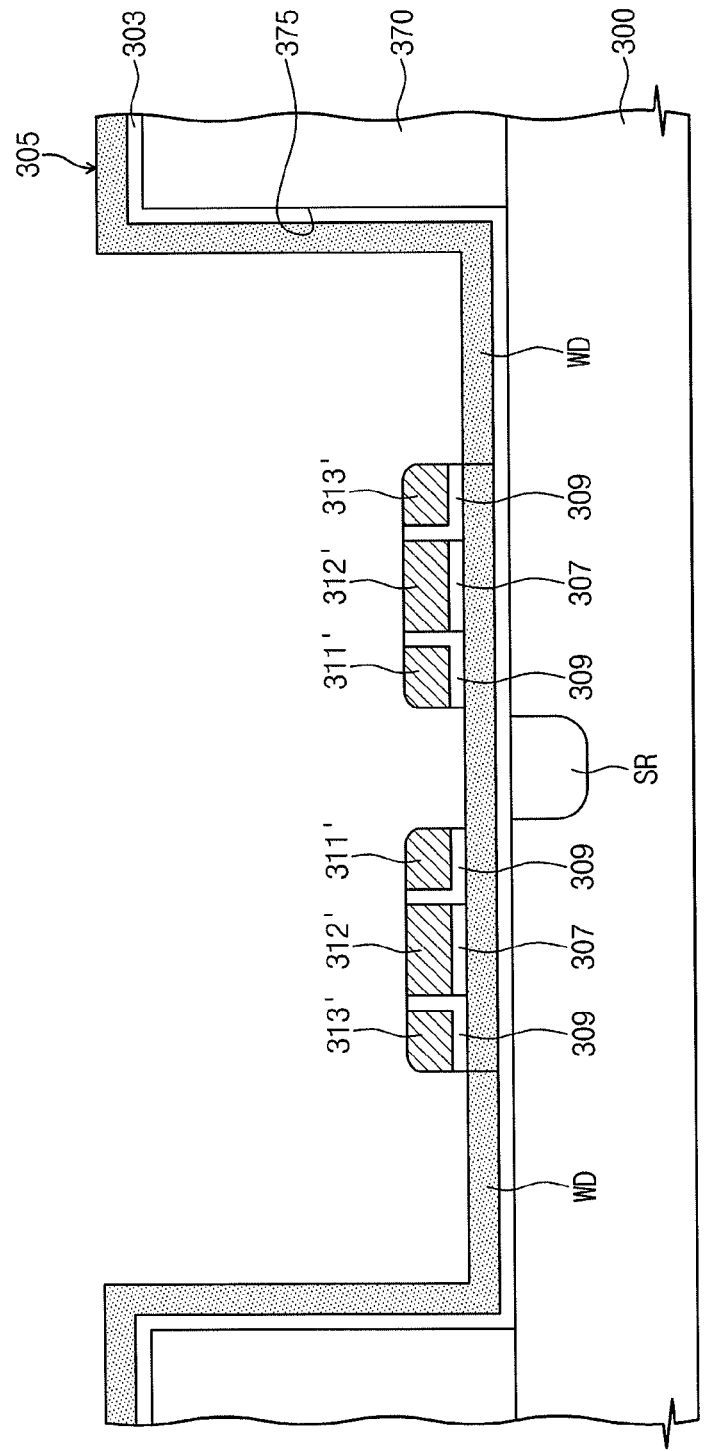
Figure 27B:
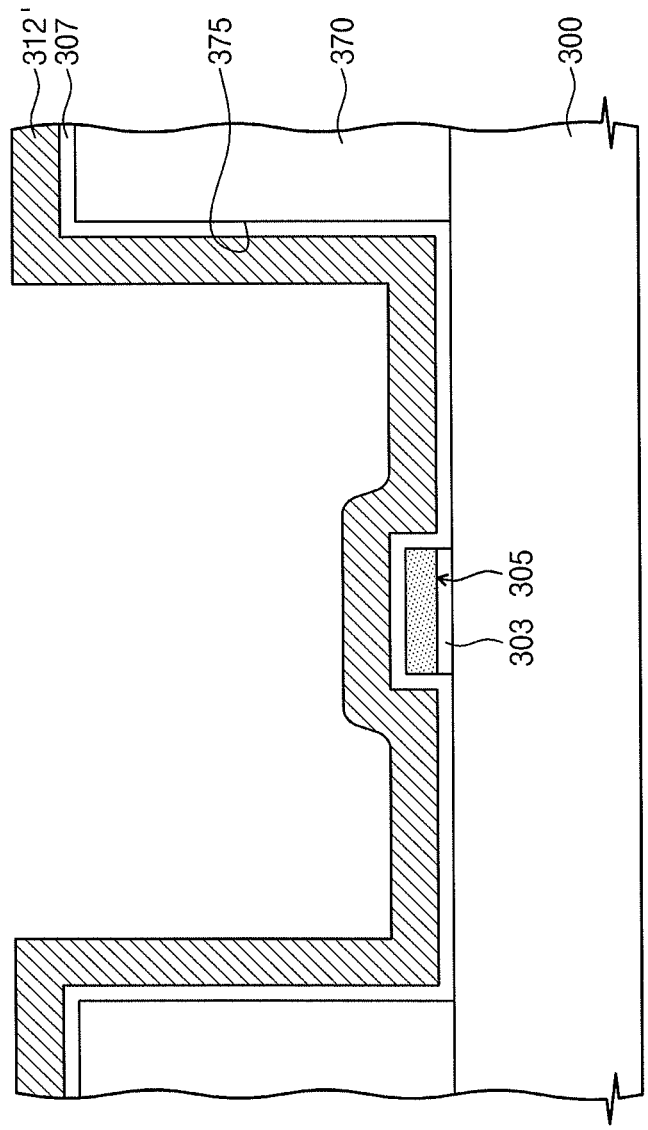

Referring to FIGS. 27A and 27B, the substrate having the trench 375 may be prepared. After a structure 370 formed of an insulating material is formed on the substrate 300, the structure 370 may be patterned to form the trench 375. Alternatively, the substrate 300 may be patterned to form the trench 375. In this case, the structure 370 may be formed of a portion of the substrate 300.

The common source region SR may be formed in the substrate 300 under the bottom surface of the trench 375, and the buffer insulating layer 303 may be formed on the substrate 300 having the trench 375. Next, a preliminary horizontal active portion 305, gate dielectric layers 307 and 309, gate electrodes 311', 312', and 313', and write-doped regions WD may be formed as described with reference to FIGS. 23A, 23B, 24A, and 24B. At this time, as illustrated in FIG. 27A, the preliminary horizontal active portion 305 may extend along the first and second inner sidewalls of the trench 375 and a top surface of the structure 370 adjacent thereto. Thus, portions of the preliminary horizontal active portion 305 may be disposed outside the trench 375.

Additionally, as illustrated in FIG. 27B, the gate electrodes 311', 312', and 313' may extend along the third and fourth inner sidewalls of the trench 375 and a top surface of the structure 370 adjacent thereto. Thus, portions of the gate electrodes 311', 312', and 313' may be disposed outside the trench 375.

Figure 28A:
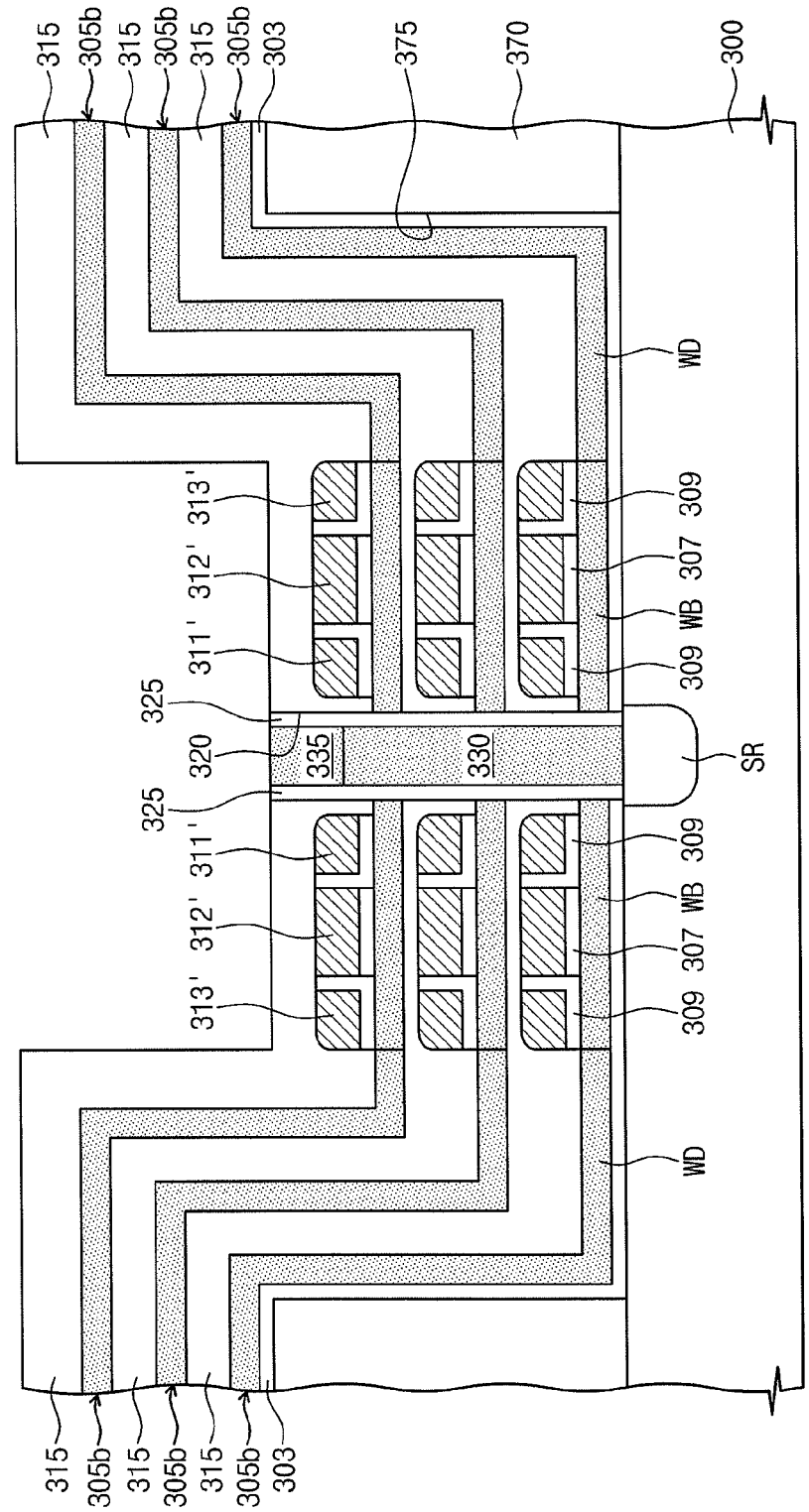
Figure 28B:
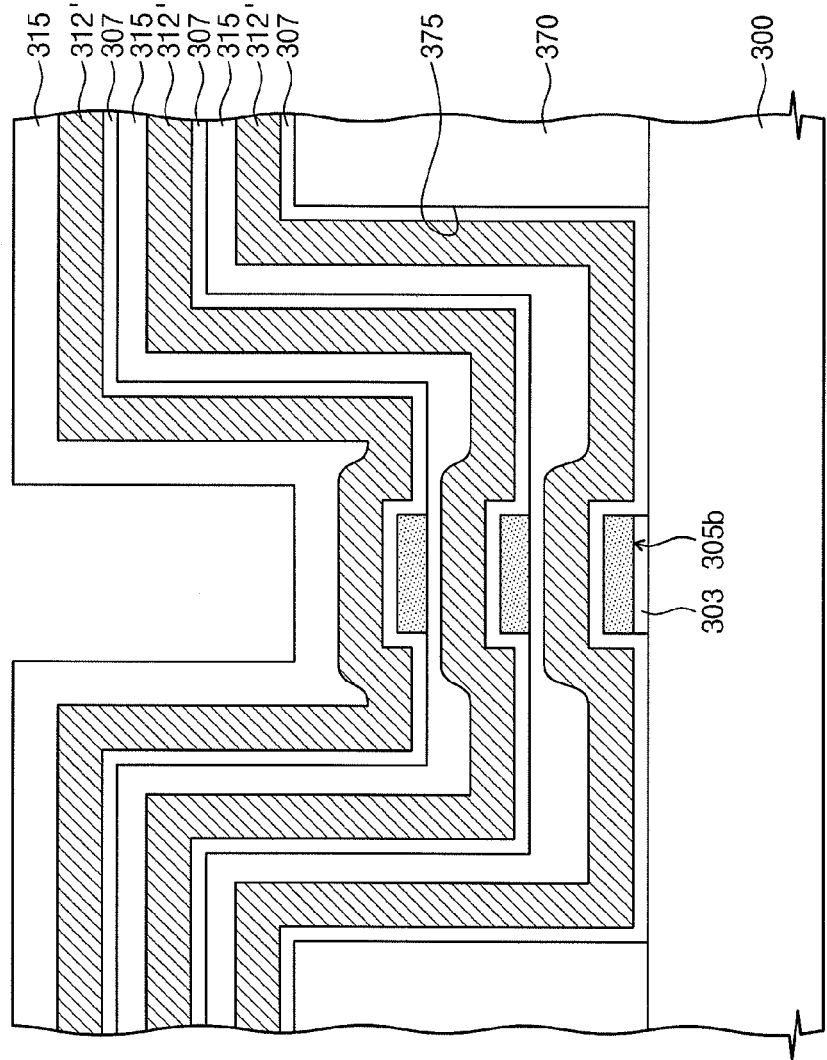

Referring to FIGS. 28A and 28B, subsequently, an insulating layer 315 may be formed. The preliminary horizontal active portion 305, the gate electrodes 311', 312', and 313', the gate dielectric layers 307 and 309, and the insulating layer 315 are defined as a floor-structure. The method of forming the floor-structure may be repeatedly performed to form a plurality of the floor-structures on the substrate 300 having the trench 375.

The insulating layers 315 and the preliminary horizontal active portions 305 of the plurality of the floor-structures may be patterned to form a vertical hole 320 and horizontal active portions 305b including the body parts WB. The read-gate dielectric layer 325 may be formed on the inner sidewall of the vertical hole 320 and then the vertical active portion 330 may be formed in the vertical hole 320. The common drain region 335 may be formed in the upper portion of the vertical active portion 330.

Figure 29A:
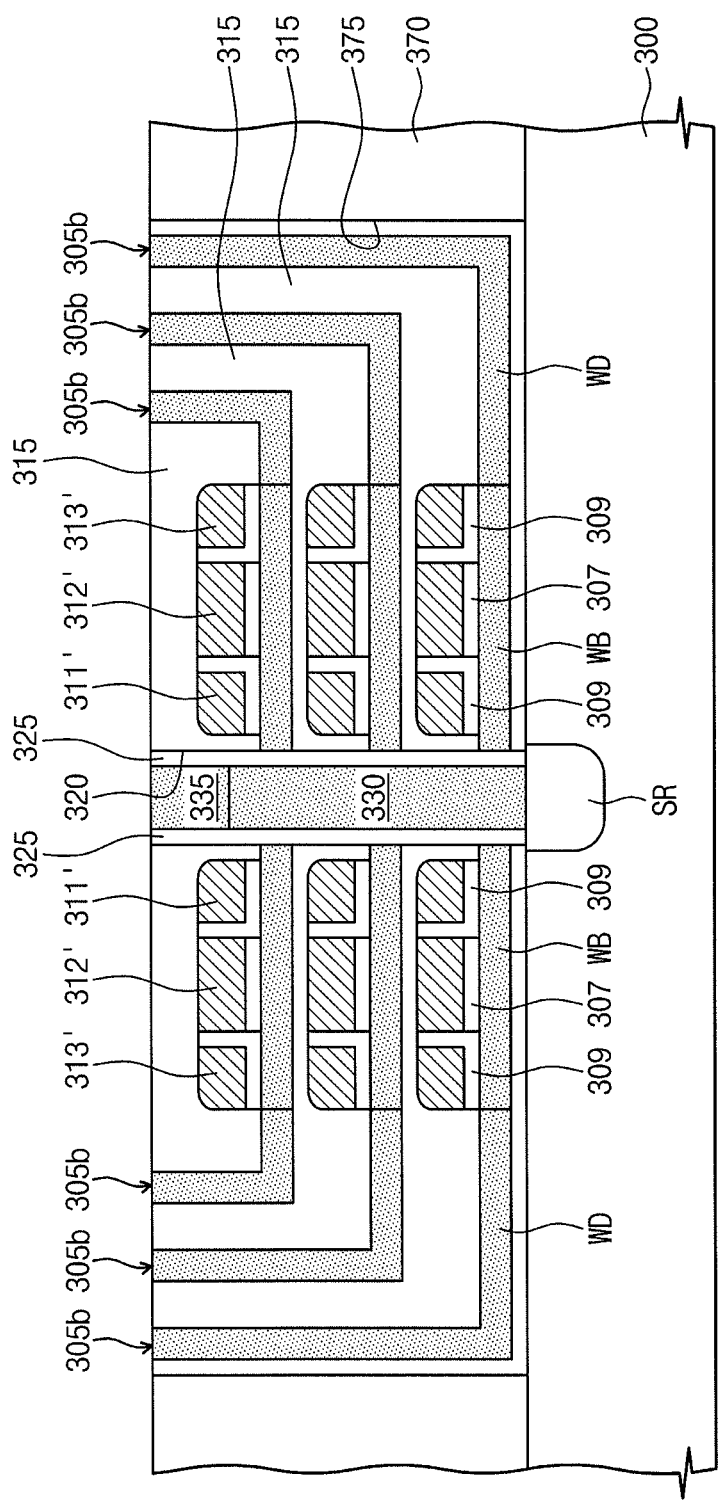
Figure 29B:
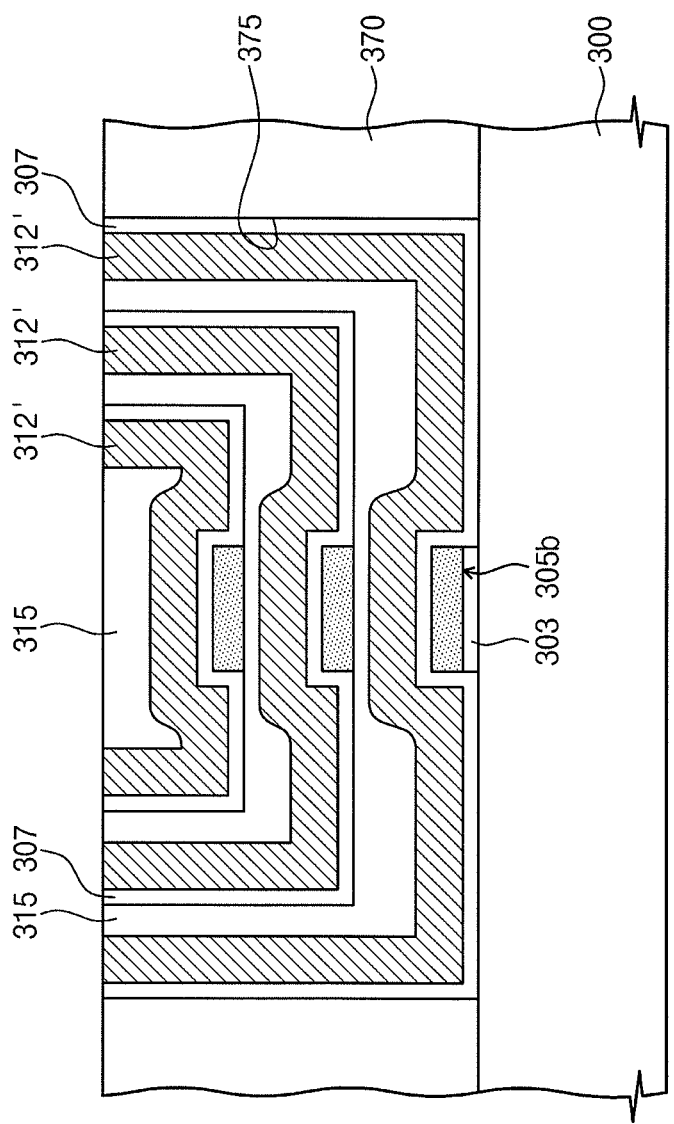

Referring to FIGS. 29A and 29B, the portions of the horizontal active portions 305b and the portions of the gate electrodes 311', 312', and 313' outside the trench 375 may be planarized until the structure 370 is exposed. Thus, the horizontal active portions 305b and the gate electrodes 311', 312', and 313' may have landing surfaces coplanar with each other.

Subsequently, the interlayer insulating layers 345 and 350, the lines WBL and RBL, the local interconnections LI1 and LI2, and the contact plugs WBLC', RBLC, LIC1', and LIC2' of FIGS. 22A to 22C may be formed to realize the semiconductor memory device illustrated in FIGS. 22A to 22C.

The semiconductor memory devices described above may be encapsulated using various packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

Figure 30:
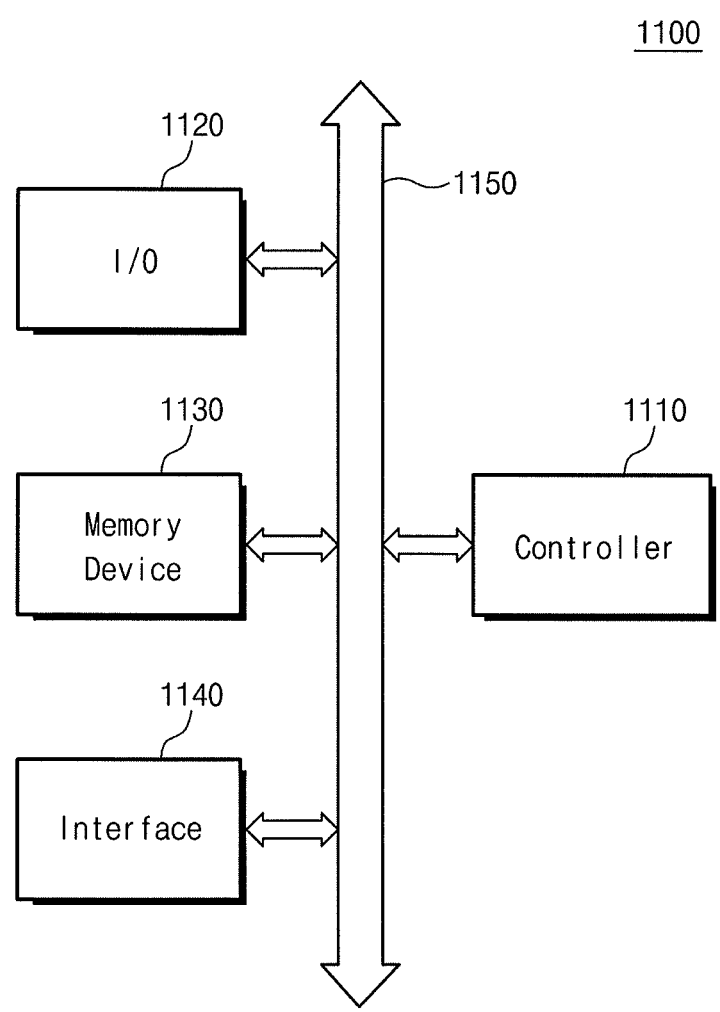
FIG. 30 illustrates a schematic block diagram of an example of electronic systems including the semiconductor memory devices according to embodiments of the inventive concept.

FIG. 30 is a schematic block diagram illustrating an example of electronic systems including the semiconductor memory devices according to embodiments of the inventive concept.

Referring to FIG. 30, an electronic system 1100 according to an embodiment of the inventive concept may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, and other logic devices. The other logic devices may perform a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of non-volatile memory devices (e.g., a flash memory device, a magnetic memory device, and/or a phase change memory device, etc.). The memory device 1130 may also include at least one of the semiconductor memory devices according to the embodiments described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as an operation memory device (e.g., a cache memory) for improving an operation of the controller 1110. In some embodiments, the operation memory device may include at least one of the semiconductor memory devices according to embodiments of the inventive concept.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 31:
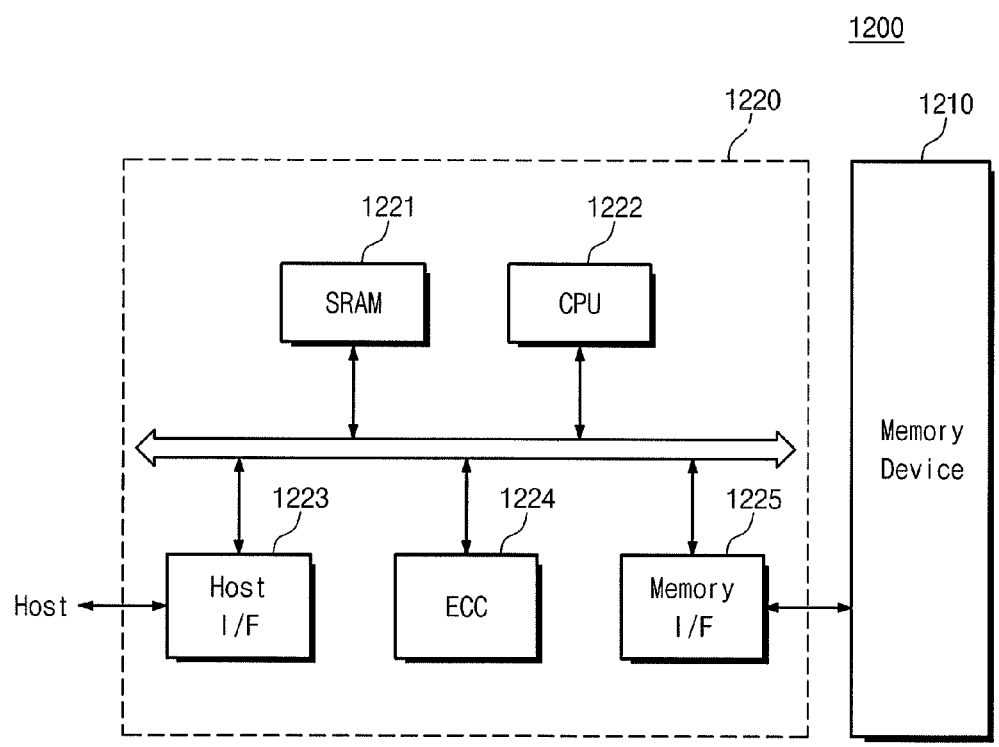
FIG. 31 illustrates a schematic block diagram of an example of memory cards including the semiconductor memory devices according to embodiments of the inventive concept.

FIG. 31 is a schematic block diagram illustrating an example of memory cards including the semiconductor memory devices according to embodiments of the inventive concept.

Referring to FIG. 31, a memory card 1200 according to an embodiment of the inventive concept may include a memory device 1210. The memory device 1210 may include at least one of non-volatile memory devices (e.g., a flash memory device, a magnetic memory device, and/or a phase change memory device, etc.). Additionally, the memory device 1210 may also include at least one of the semiconductor memory devices according to the embodiments mentioned above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

Figure 32:
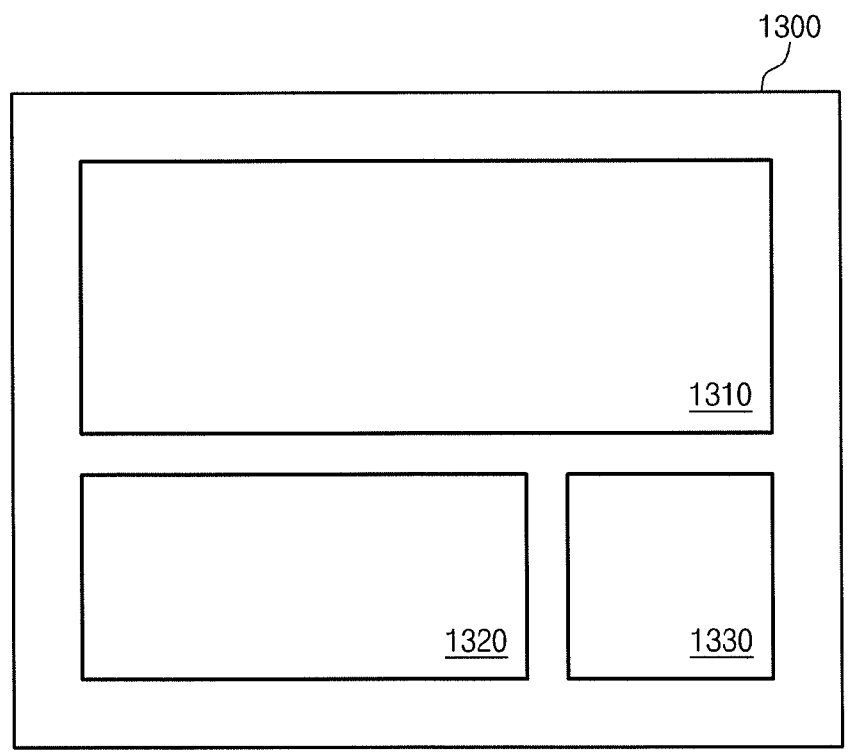
FIG. 32 illustrates a schematic block diagram of an example of system-on-chips (SoC) including the semiconductor memory devices according to embodiments of the inventive concept.

FIG. 32 is a schematic block diagram illustrating an example of system-on-chips (SOC) including the semiconductor memory devices according to embodiments of the inventive concept.

Referring to FIG. 32, a device including the semiconductor memory cells according to the aforementioned embodiments may be applied to a system-on chip (SOC) 1300. The SOC 1300 may include a logic region 1310 and a first embedded memory region 1320. At least some of the semiconductor memory cells described in the above first to third embodiments may be disposed in the first embedded memory region 1320. In some embodiments, the SOC 1300 may further include a second embedded memory region 1330. Fast static random access memory (SRAM) cells may be disposed in the second embedded memory region 1330.

According to one or more embodiments of the inventive concept, the first source/drain terminal and the channel region of the write transistor may have the same doped state, and the first and second write gates may have work functions different from each other, respectively. Thus, the first source/drain terminal of the write transistor may not have the PN junction. As a result, it is possible to prevent the junction leakage and/or recombination caused by the PN junction. According to one or more embodiments, two word lines connected to a write transistor may cross one another. Thus, the semiconductor memory device according to one or more embodiments may have improved data retention property may be realized. In other words, the semiconductor memory device with excellent reliability may be realized according to one or more embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a write transistor including a first write gate controlling a first source/drain terminal and a second write gate controlling a channel region; and
a read transistor including a memory node gate connected to the first source/drain terminal of the write transistor,
wherein the first write gate has a first work function and the second write gate has a second work function different from the first work function; and
wherein the first source/drain terminal of the write transistor does not have a PN junction.

2. The semiconductor memory device as claimed in claim 1, wherein:
a doped state of the first source/drain terminal of the write transistor is the same as a doped state of the channel region of the write transistor; and
a potential barrier is generated in the channel region of the write transistor and a potential well is generated in the first source/drain terminal of the write transistor by engineering of the first and second work functions of the first and second write gates.

3. The semiconductor memory device as claimed in claim 1, wherein the first write gate is connected to a first word line and the second write gate is connected to a second word line.

4. The semiconductor memory device as claimed in claim 3, wherein the first word line crosses the second word line.

5. The semiconductor memory device as claimed in claim 1, wherein the first write gate further performs a function of a control gate of the read transistor.

6. The semiconductor memory device as claimed in claim 1, wherein:
the write transistor further includes a third write gate controlling a second source/drain terminal;
the third write gate has a third work function; and
wherein the second write gate is disposed between the first write gate and the third write gate.

7. The semiconductor memory device as claimed in claim 6, wherein the first write gate is connected to a first word line;
wherein the third write gate is connected to a second word line; and
wherein the second write gate is connected to one of the first and second word lines.

8. The semiconductor memory device as claimed in claim 6, wherein the first source/drain terminal, the channel region, and the second source/drain terminal of the write transistor have a same doped state.

9. The semiconductor memory device as claimed in claim 6, wherein the third work function is the same as the first work function or the second work function.

10. A semiconductor memory device, comprising:
a first active portion including a body part;
a first gate electrode controlling a first portion of the body part and having a first work function;
a second gate electrode controlling a second portion of the body part and having a second work function different from the first work function; and
a second active portion spaced apart from the first active portion and including a read-channel region adjacent to the first portion of the body part,
wherein the first and second portions of the body part have a same doped state; and
wherein the first and second gate electrodes engineer energy bands of the first and second portions of the body part to generate a potential well and a potential barrier in the first portion and the second portion of the body part, respectively.

11. The semiconductor memory device as claimed in claim 10, wherein:
the first gate electrode corresponds to a first write gate of a write transistor and a control gate of a read transistor;
the second gate electrode corresponds to a second write gate of the write transistor;
the potential well of the first portion of the body part corresponds to a memory node; and
the memory node corresponds to a first source/drain terminal of the write transistor and a memory node gate of the read transistor.

12. The semiconductor memory device as claimed in claim 10, wherein the first and second portions of the body part are in an intrinsic state.

13. The semiconductor memory device as claimed in claim 10, wherein the first and second portions of the body part are lightly doped with dopants of a first conductivity type.

14. The semiconductor memory device as claimed in claim 10, further comprising:
a third gate electrode disposed at a side of the second gate electrode, the third gate electrode having a third work function,
wherein the third gate electrode controls a third portion of the body part;
wherein the third portion of the body part has the same doped state as the first and second portions of the body part; and
wherein the second gate electrode is disposed between the first and third gate electrodes.

15. The semiconductor memory device as claimed in claim 14, wherein:
the first gate electrode is connected to a first word line;
the third gate electrode is connected to a second word line crossing the first word line; and
the second gate electrode is connected to one of the first and second word lines.

16. The semiconductor memory device as claimed in claim 15, further comprising:
a write bit line electrically connected to the third portion of the body part; and
a read bit line electrically connected to one end of the read-channel region,
wherein the write bit line and the read bit line cross the first word line.

17. The semiconductor memory device as claimed in claim 15, wherein the third work function is the same as the first work function or the second work function.

18. A semiconductor memory device, comprising:
a substrate; and
a plurality of unit cells sequentially stacked on the substrate,
wherein each of the unit cells includes:
a write transistor having a first write gate controlling a first source/drain terminal and a second write gate controlling a channel region; and
a read transistor having a memory node gate connected to the first source/drain terminal of the write transistor,
wherein the first write gate has a first work function and the second write gate has a second work function different from the first work function;
wherein the first source/drain terminal of the write transistor does not have a PN junction; and
wherein the read transistors of the stacked unit cells are connected in series to each other.

19. The semiconductor memory device as claimed in claim 18, wherein:
each of the unit cells further includes a third write gate controlling a second source/drain terminal of the write transistor, and
a work function of the third write gate is the same as the first work function or the second work function.

20. The semiconductor memory device as claimed in claim 18, further comprising:
a read bit line connected to one terminal of an uppermost read transistor of the read transistors connected in series to each other,
wherein the read transistors connected in series to each other share the read bit line.

21. A semiconductor memory device, comprising:
a write transistor including a first gate and a second gate;
a first word line electrically connected to the first gate of the write transistor;
a second word line electrically connected to the second gate of the write transistor, the second word line crossing the first word line; and
a read transistor including a memory node gate connected to a first source/drain terminal of the write transistor.

22. A semiconductor memory device, comprising:
a first active portion including a body part having first and second portions;
a first gate electrode controlling the first portion of the body part, the first gate electrode having a first work function;
a second gate electrode controlling the second portion of the body part, the second gate having a second work function different from the first work function; and
a second active portion spaced apart from the first active portion and including a read-channel region,
wherein the first and second portions of the body part have a same doped state;
wherein the first and second gate electrodes engineer energy bands of the first and second portions of the body part to generate a potential well and a potential barrier in the first portion and the second portion of the body part, respectively;
the potential well corresponds to a memory node; and
the memory node and the read-channel region overlap in at least one direction.

* * * * *